(12) United States Patent
Okajima

(10) Patent No.: US 7,713,819 B2
(45) Date of Patent: May 11, 2010

(54) SEMICONDUCTOR DEVICE MANUFACTURING METHOD AND SEMICONDUCTOR INTEGRATED CIRCUIT DEVICE

(75) Inventor: Mutsumi Okajima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 142 days.

(21) Appl. No.: 11/790,207

(22) Filed: Apr. 24, 2007

(65) Prior Publication Data

US 2007/0262356 A1 Nov. 15, 2007

(30) Foreign Application Priority Data

Apr. 28, 2006 (JP) .............................. 2006-127037

(51) Int. Cl.
*H01L 21/336* (2006.01)

(52) U.S. Cl. ...................... 438/259; 438/587; 438/588; 257/202; 257/210; 257/E21.682

(58) Field of Classification Search ................. 438/210, 438/587, 588; 257/202, E21.682
See application file for complete search history.

(56) References Cited

U.S. PATENT DOCUMENTS

| | | | | |
|---|---|---|---|---|
| 6,194,271 | B1 * | 2/2001 | Lin et al. ..................... | 438/259 |
| 6,943,074 | B2 * | 9/2005 | Kamiya et al. .............. | 438/211 |
| 2003/0122181 | A1 * | 7/2003 | Wu .............................. | 257/315 |
| 2004/0159879 | A1 * | 8/2004 | Hakozaki et al. ............ | 257/315 |
| 2005/0082602 | A1 | 4/2005 | Okajima | |
| 2005/0106831 | A1 * | 5/2005 | Hsu et al. .................... | 438/386 |
| 2006/0124988 | A1 | 6/2006 | Hur et al. | |

OTHER PUBLICATIONS

S. Aritome et al., "A 0.67μm² Self-Aligned Shallow Trench Isolation Cell (SA-STI Cell) for 3V-only 256Mbit NAND EEPROMs," IEDM, pp. 61-64 (1994).

* cited by examiner

*Primary Examiner*—Thao X Le
*Assistant Examiner*—Eric W Jones
(74) *Attorney, Agent, or Firm*—Finnegan, Henderson, Farabow, Garrett & Dunner, L.L.P.

(57) ABSTRACT

A semiconductor device manufacturing method includes forming a first insulating film on a semiconductor substrate, forming a first conductor film on the first insulating film, forming a second insulating film on the first conductor film, forming a first line-and-space pattern by etching the second insulating film and the first conductor film, forming a etched region etched into a second line-and-space pattern perpendicular to the first line-and-space pattern by etching the second insulating film, the first conductor film, the first insulating film, and the semiconductor substrate, burying a third insulating film in the etched region, removing the second insulating film, forming a fourth insulating film on the first conductor film and the third insulating film, forming a second conductor film on the fourth insulating film, and forming a third line-and-space pattern parallel to the first line-and-space pattern by etching the second conductor film.

4 Claims, 50 Drawing Sheets

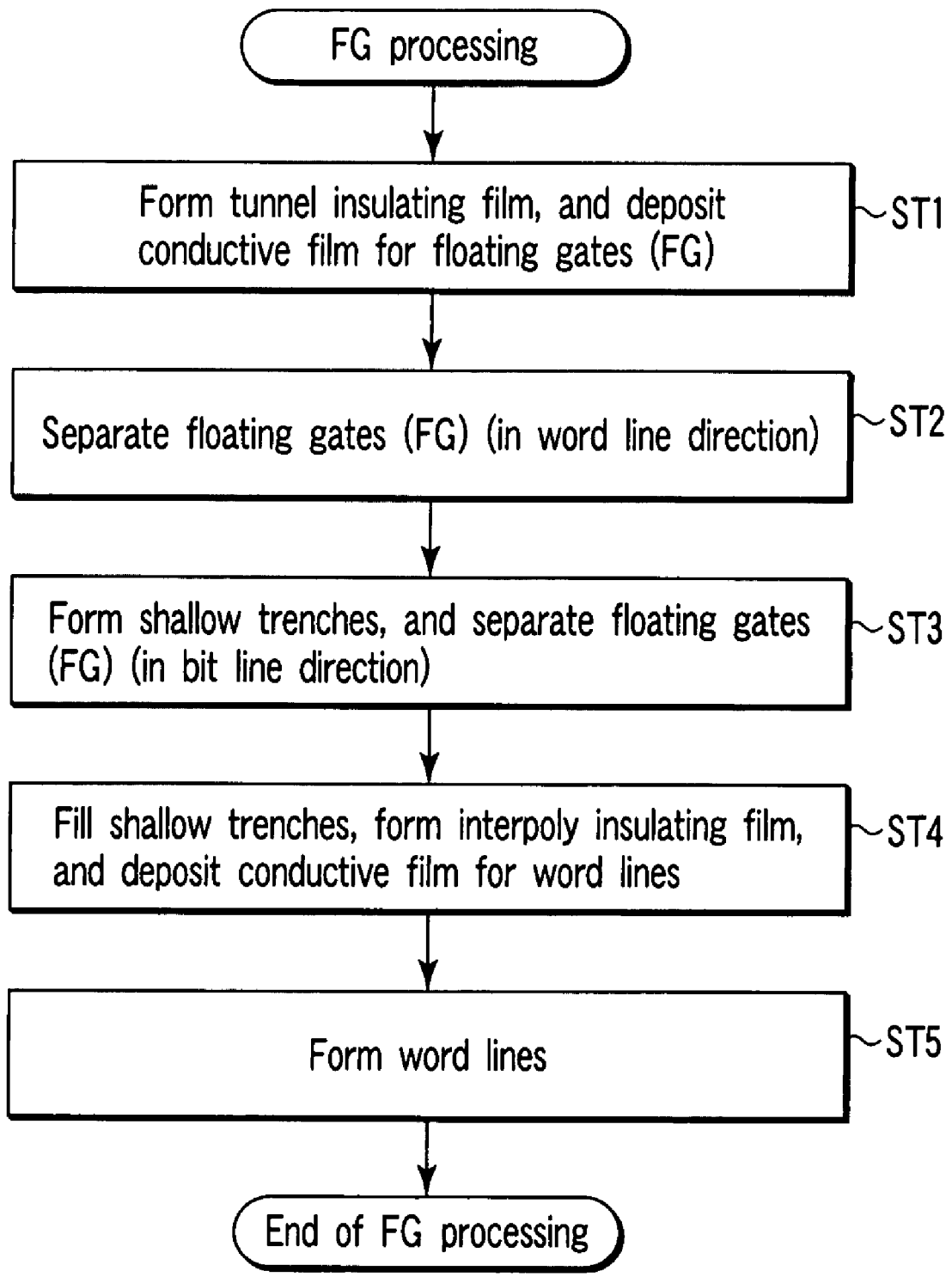
F I G. 1

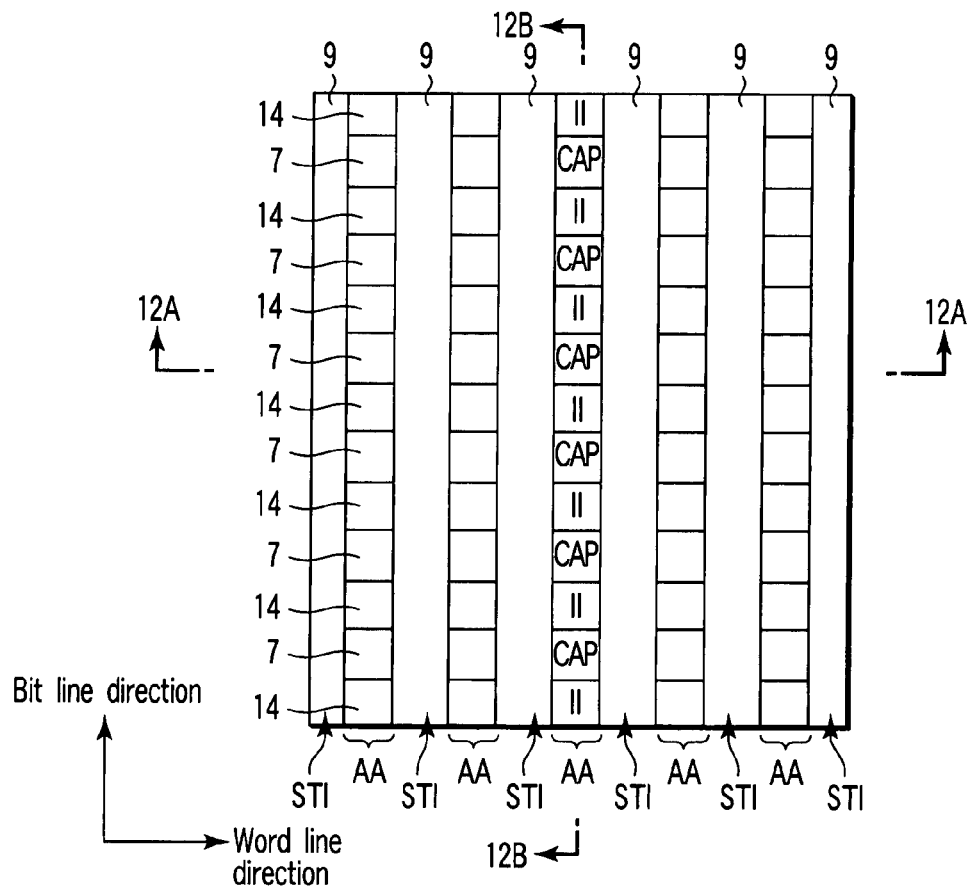
F I G. 12
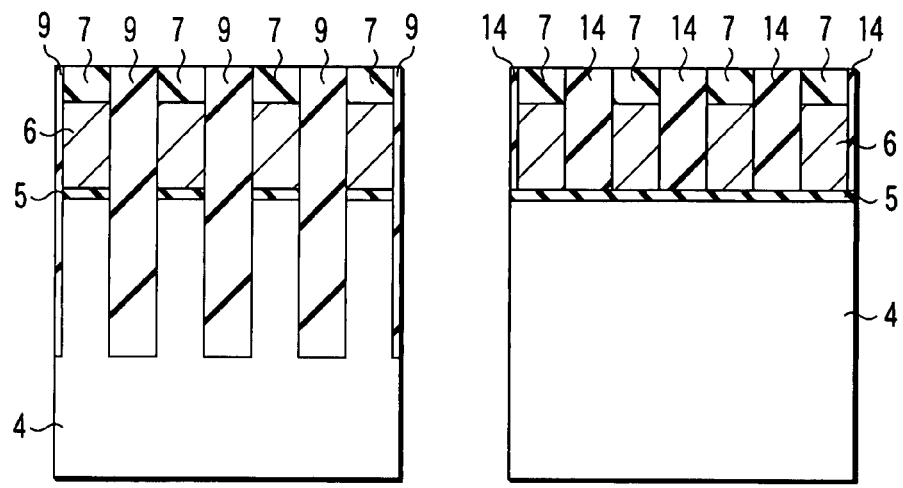
F I G. 13A    F I G. 13B

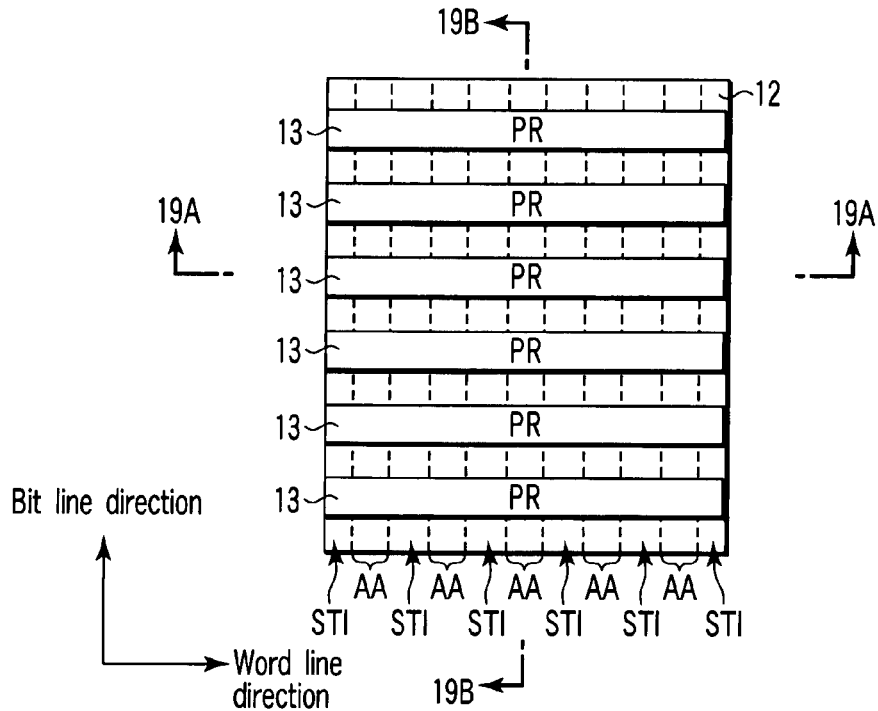
F I G. 18
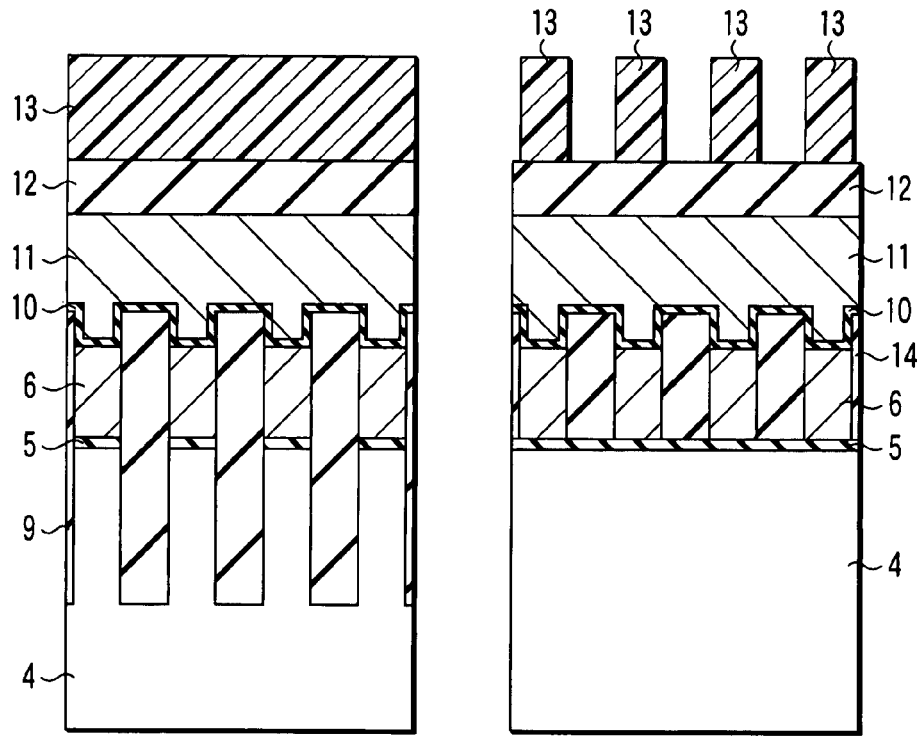
F I G. 19A    F I G. 19B

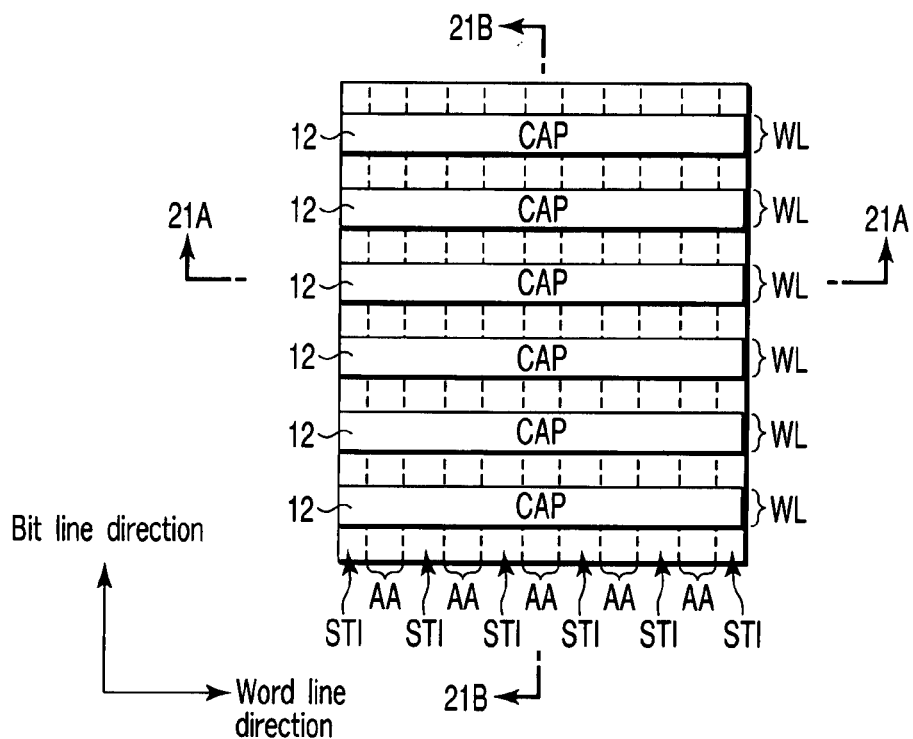
FIG. 20
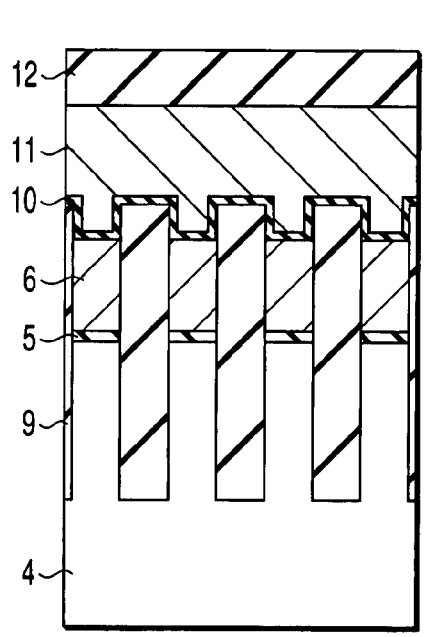
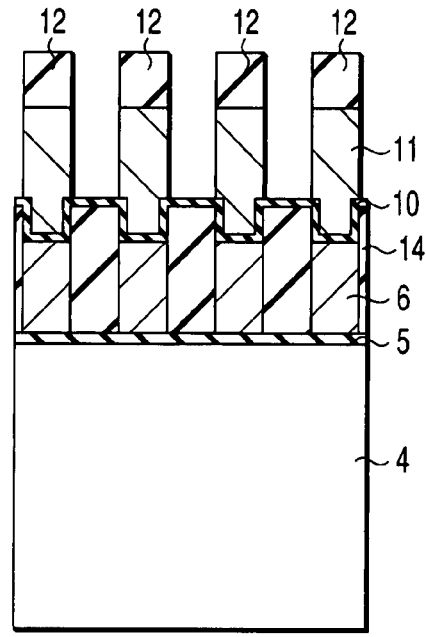
FIG. 21A    FIG. 21B

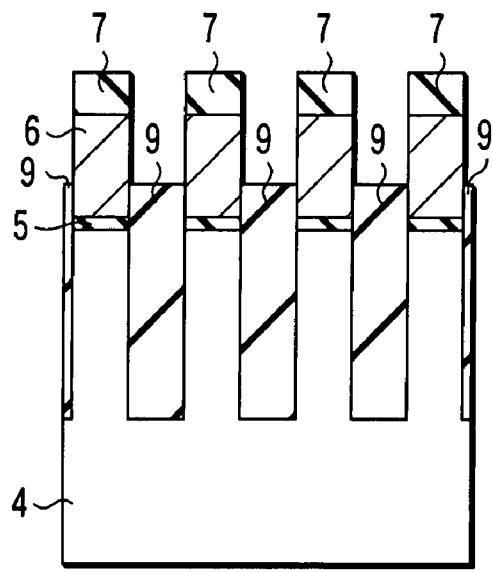 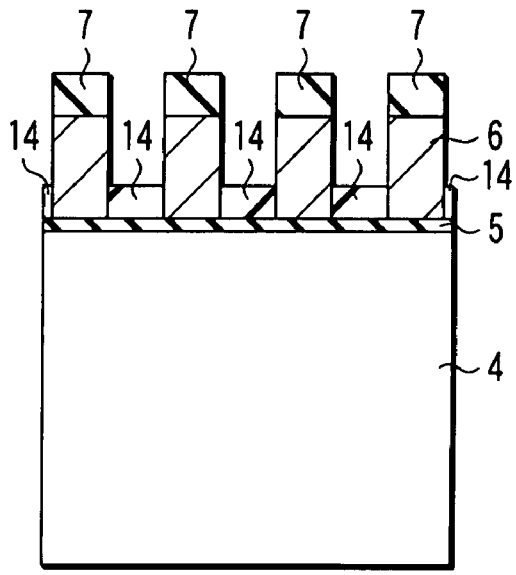
F I G. 22A  F I G. 22B
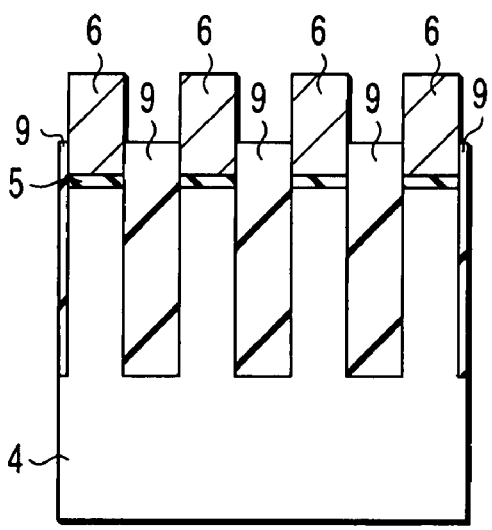 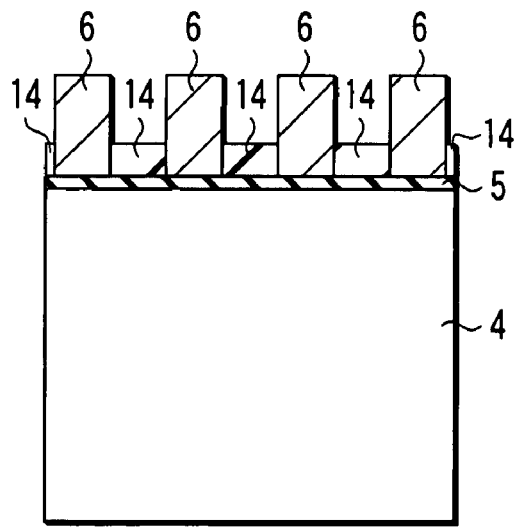
F I G. 23A  F I G. 23B

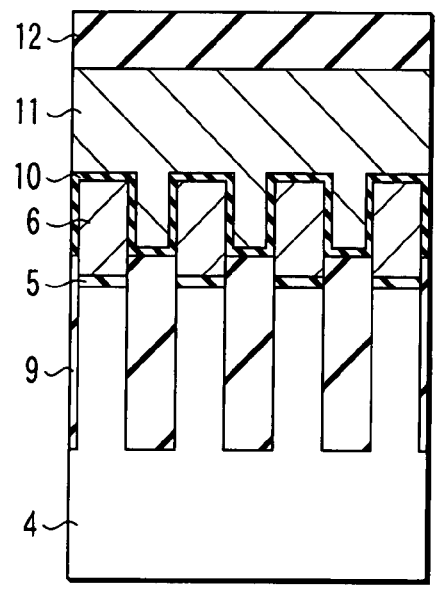 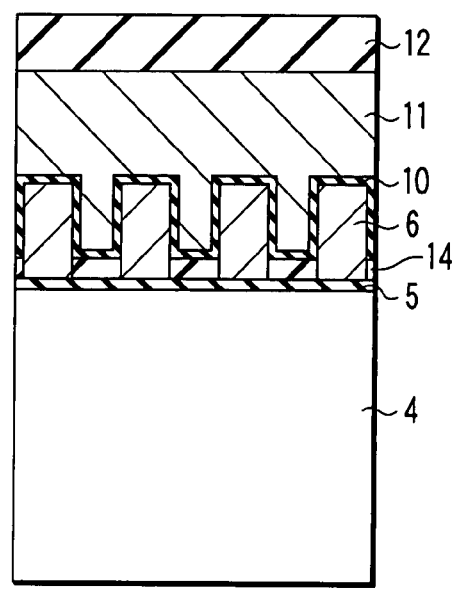
FIG. 24A　　　　FIG. 24B
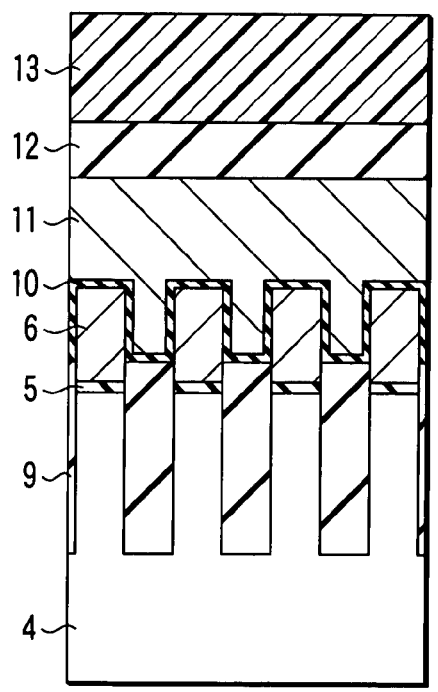 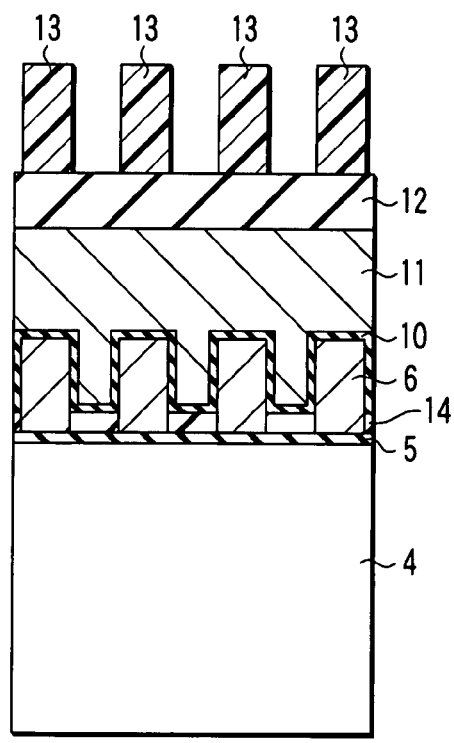
FIG. 25A　　　　FIG. 25B

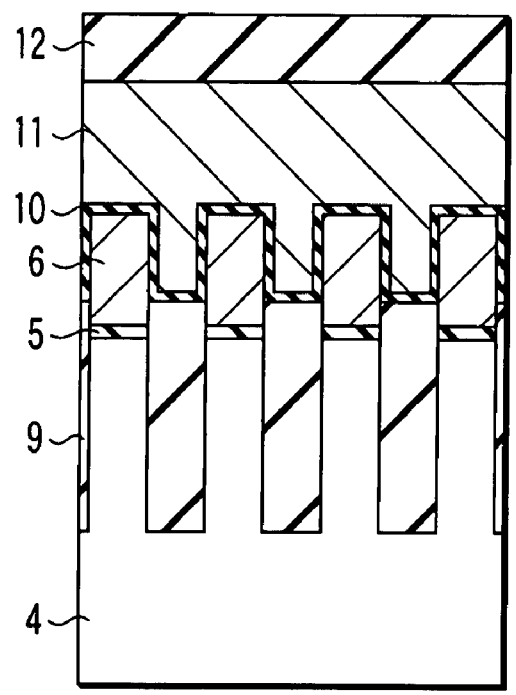
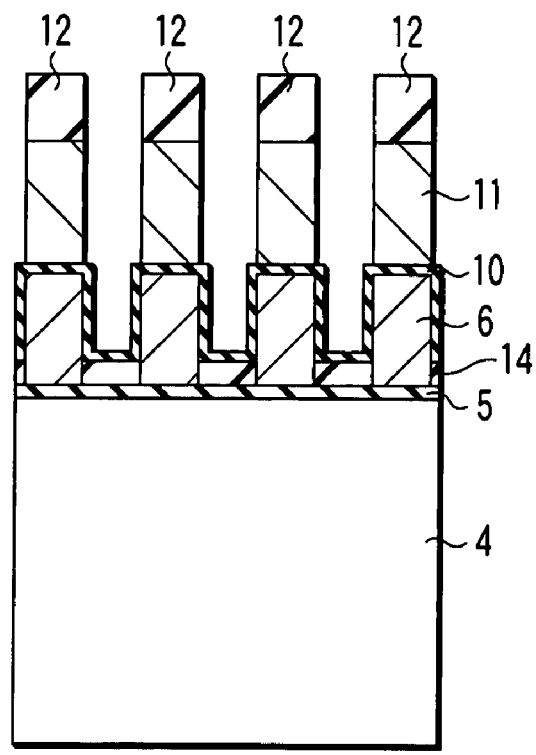
F I G. 26A
F I G. 26B

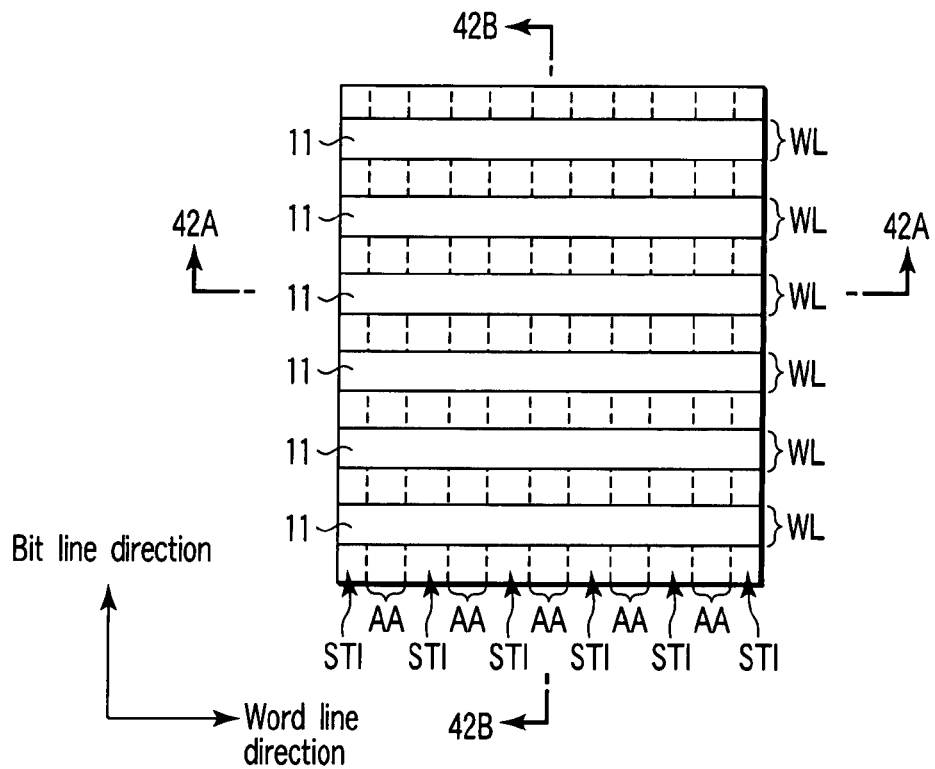
FIG. 41
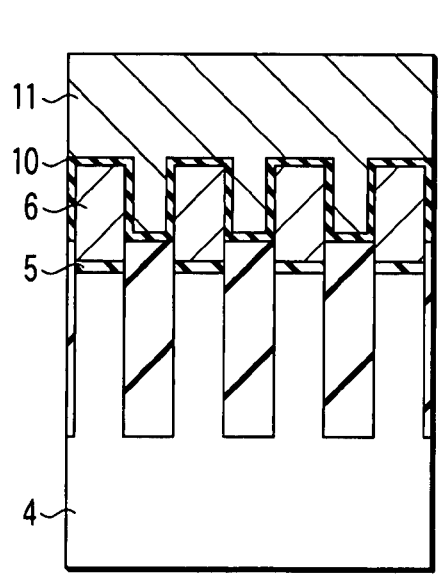
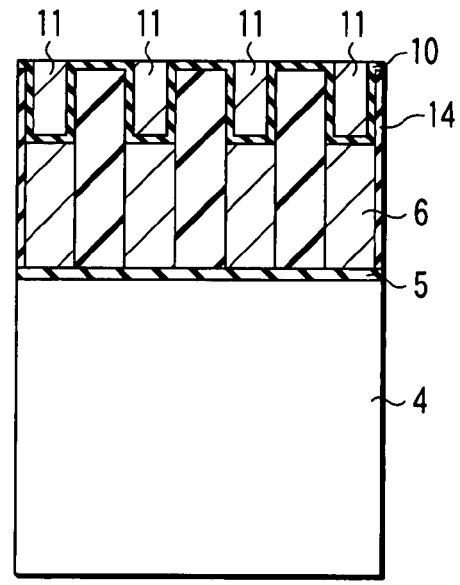
FIG. 42A                FIG. 42B

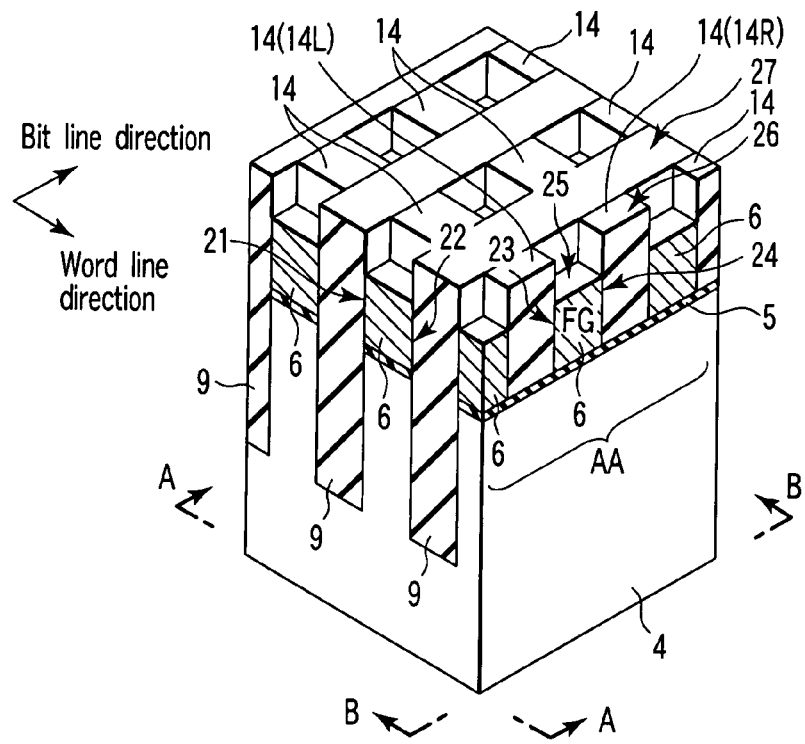
F I G. 50
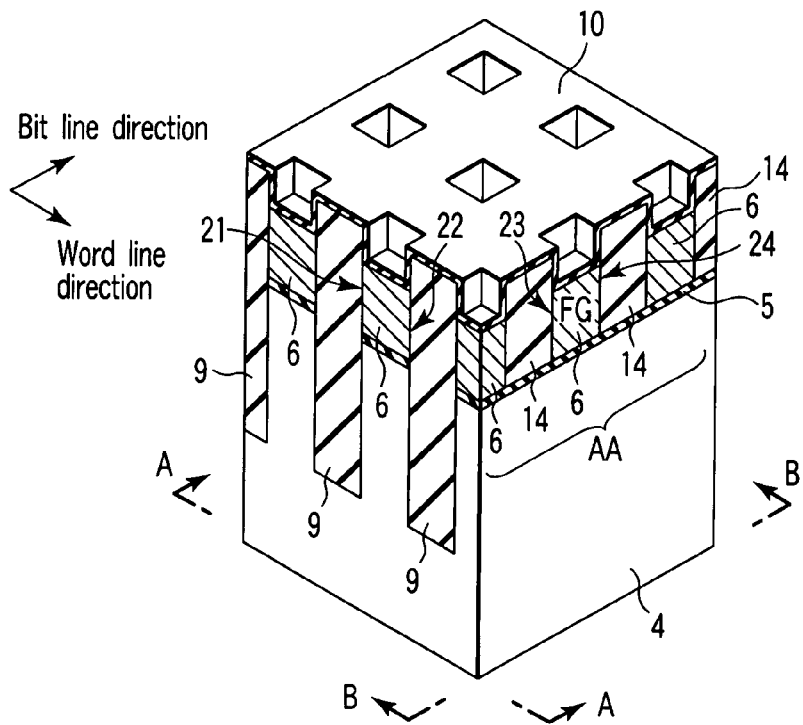
F I G. 51

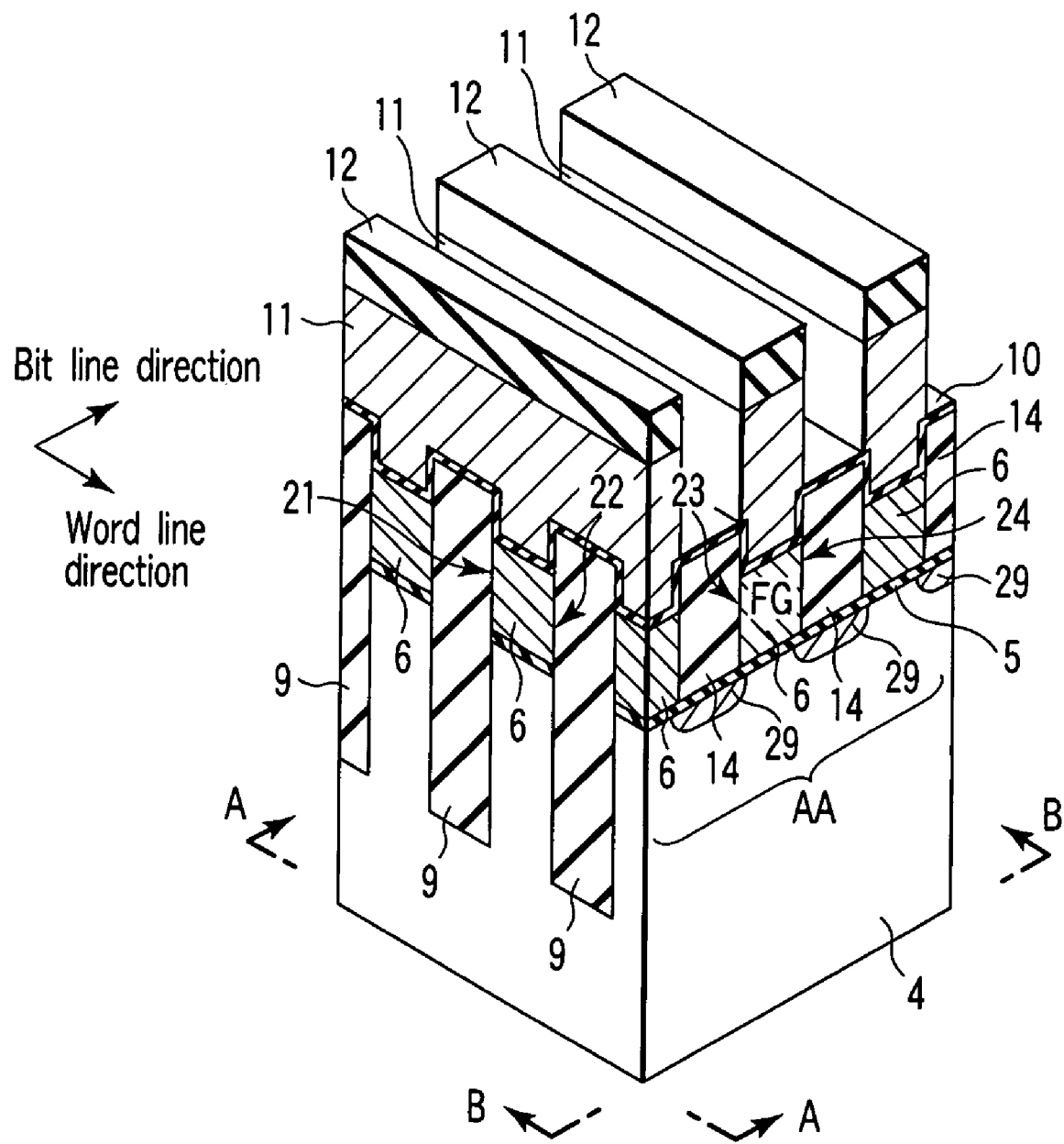
F I G. 52

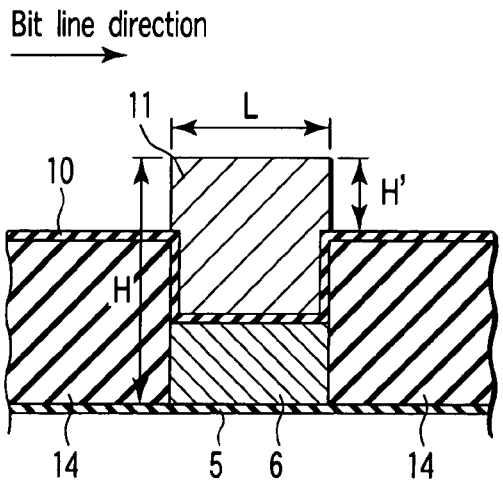
Aspect ratio=1.5
Aspect ratio of portion to be processed=0.5
F I G. 53A
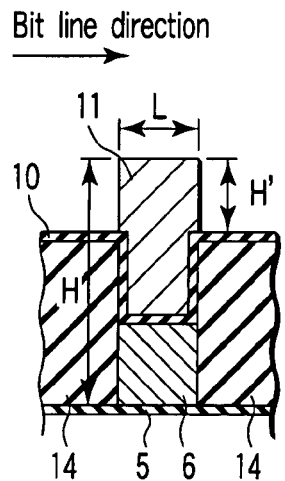
Aspect ratio=3
Aspect ratio of portion to be processed=1
F I G. 53B
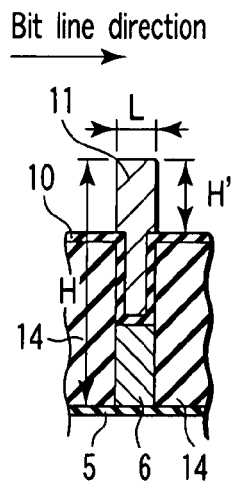
Aspect ratio=6
Aspect ratio of portion to be processed=2
F I G. 53C
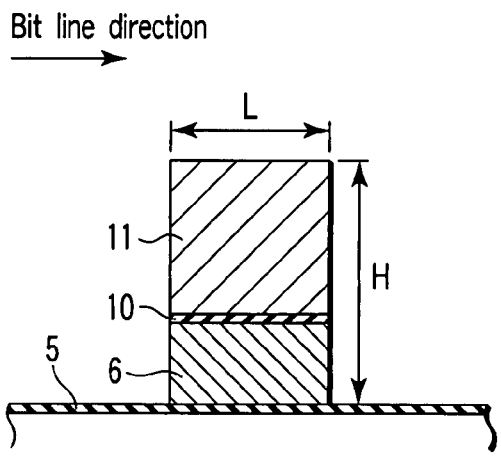
Aspect ratio=1.5
F I G. 54A
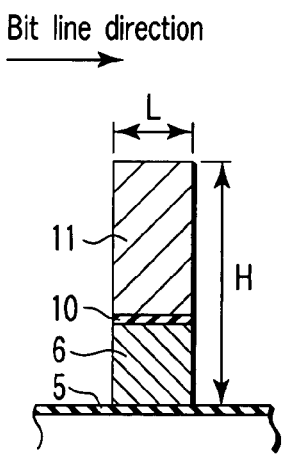
Aspect ratio=3
F I G. 54B
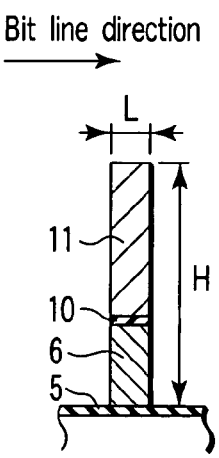
Aspect ratio=6
F I G. 54C

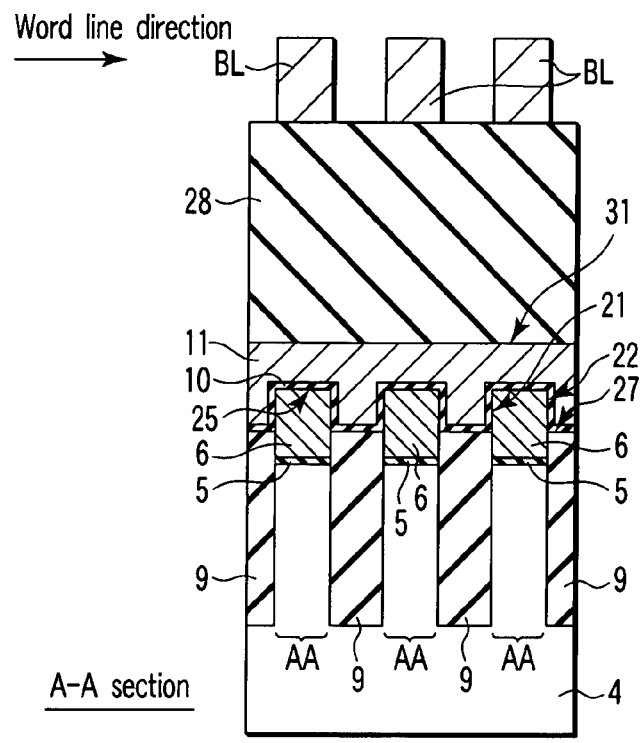
F I G. 60
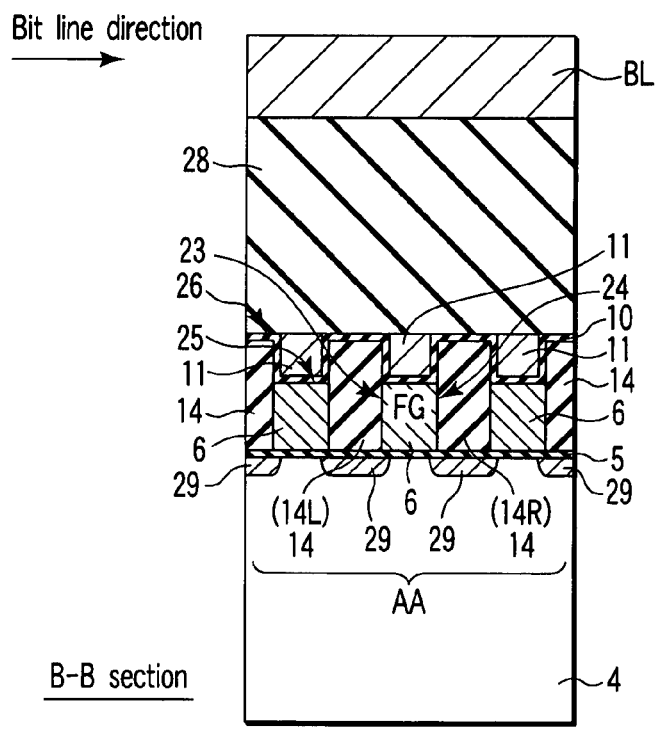
F I G. 61

Bit line direction
Word line direction

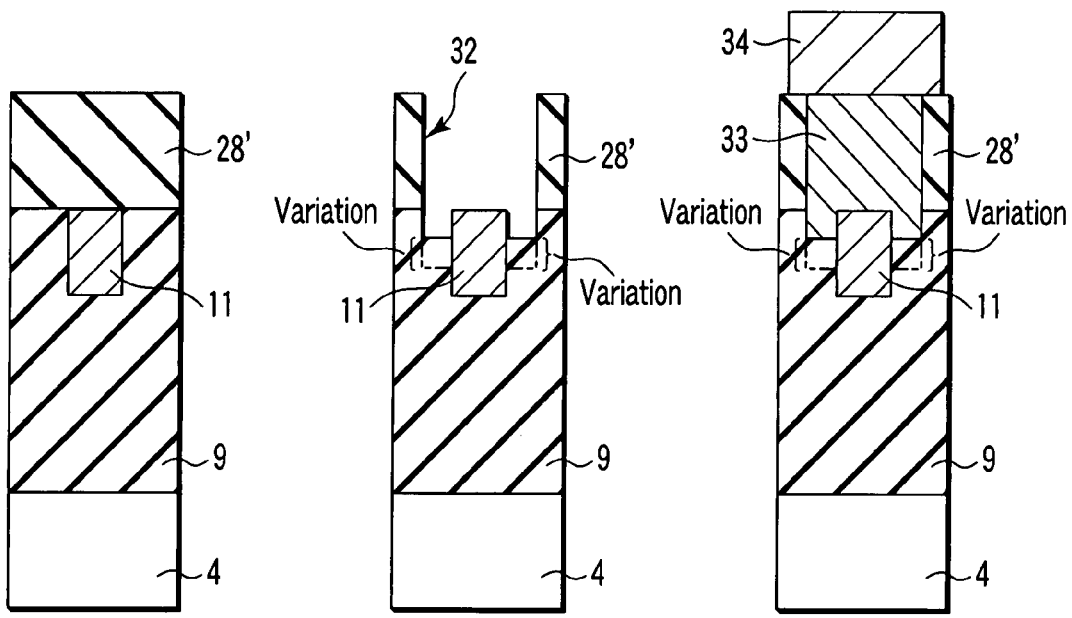
F I G. 66A  F I G. 66B  F I G. 66C
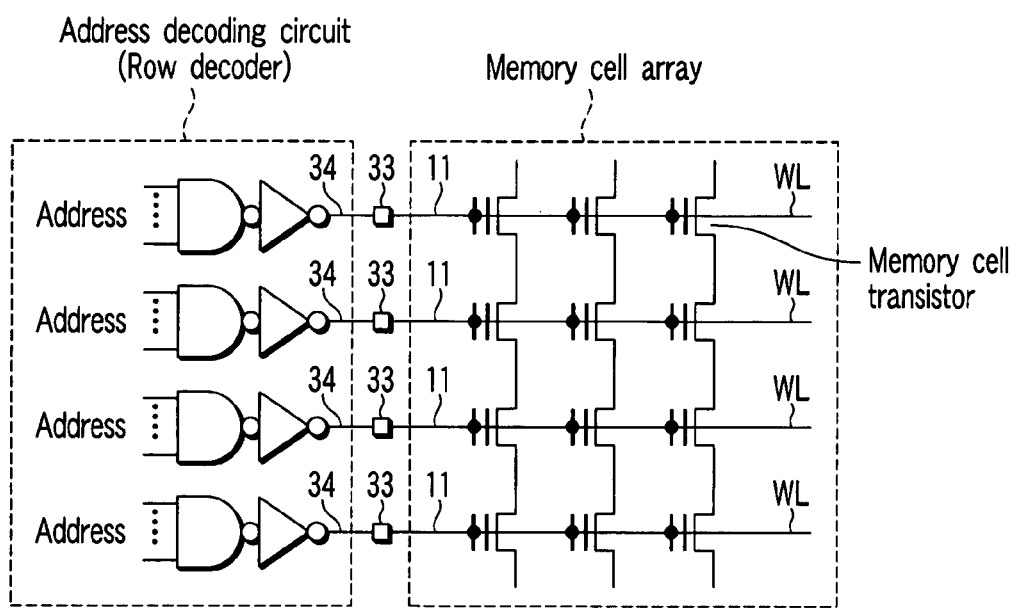
F I G. 67

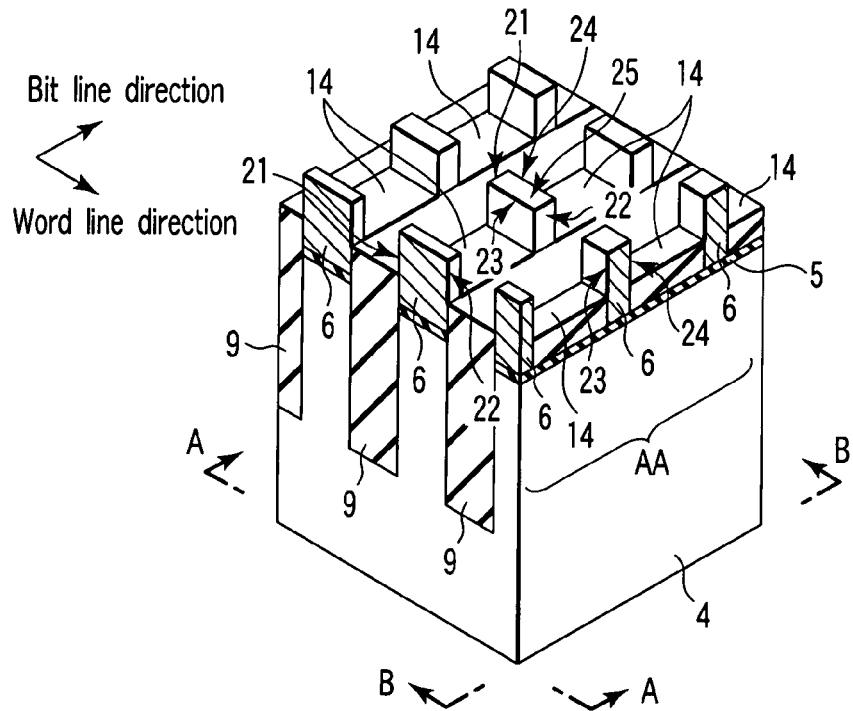
F I G. 70
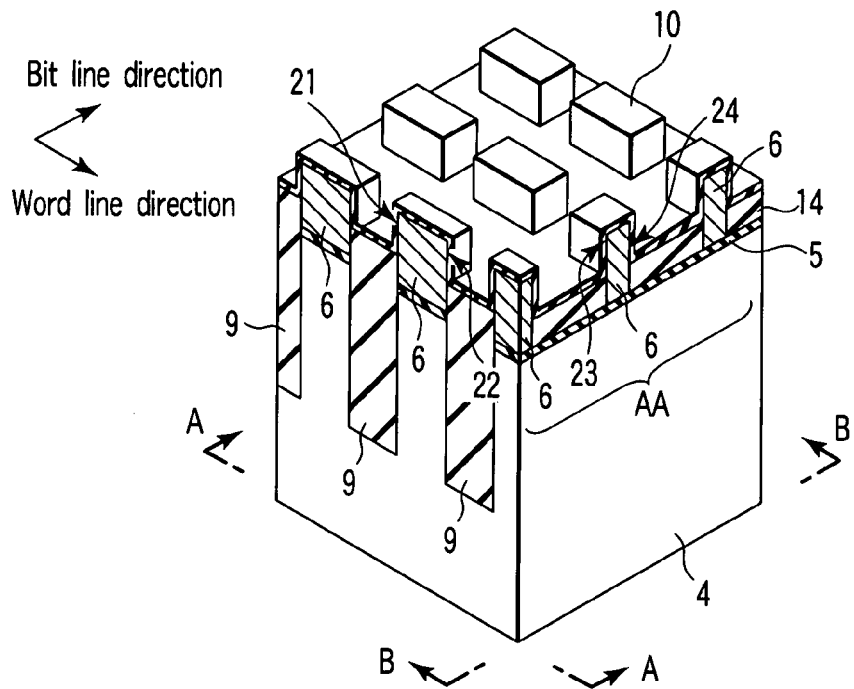
F I G. 71

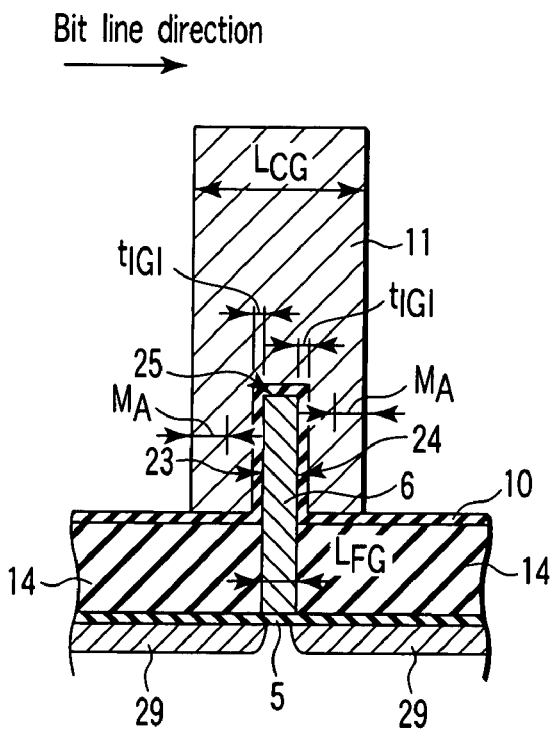
F I G. 75
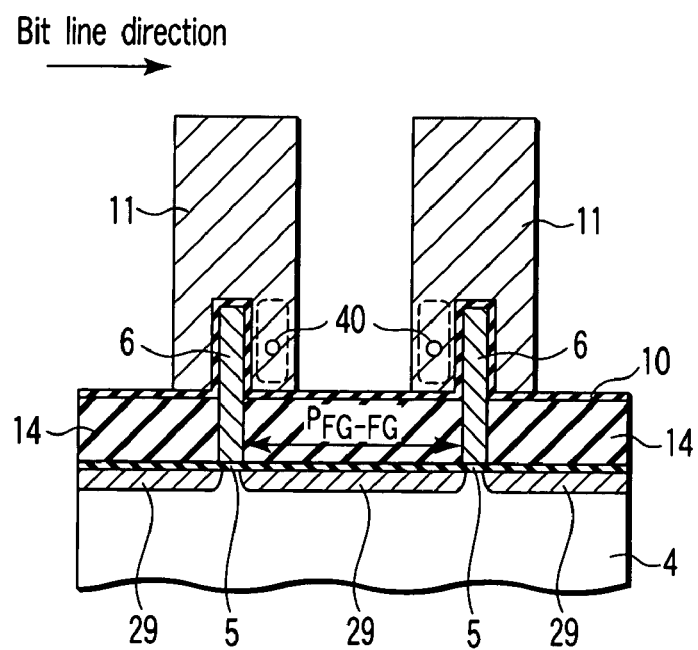
F I G. 76

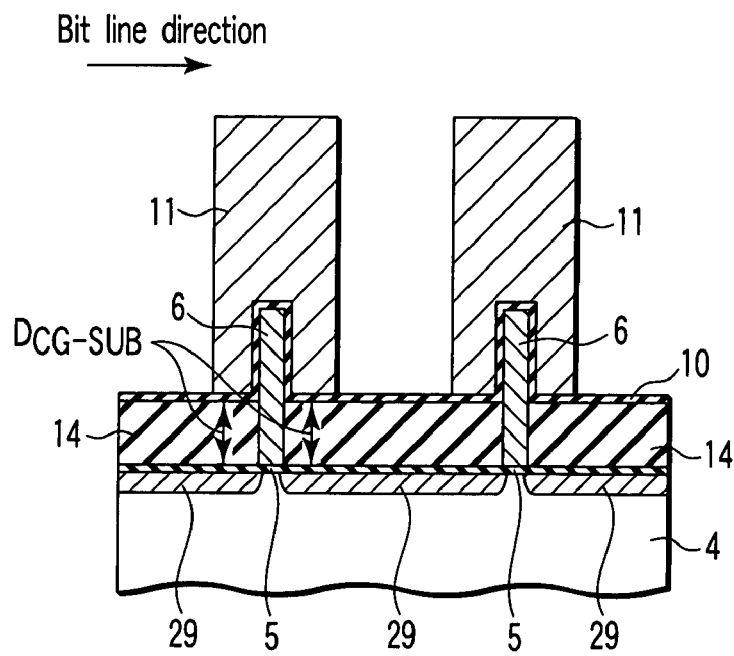
F I G. 82
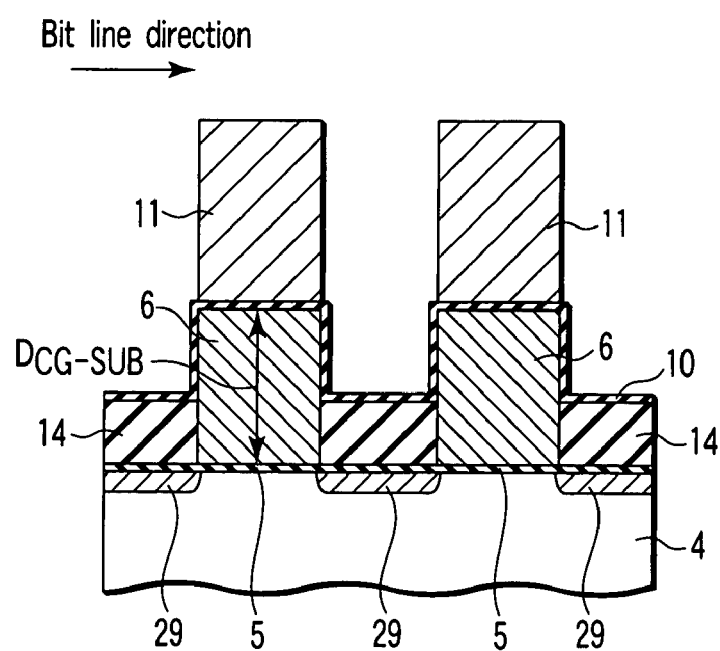
F I G. 83

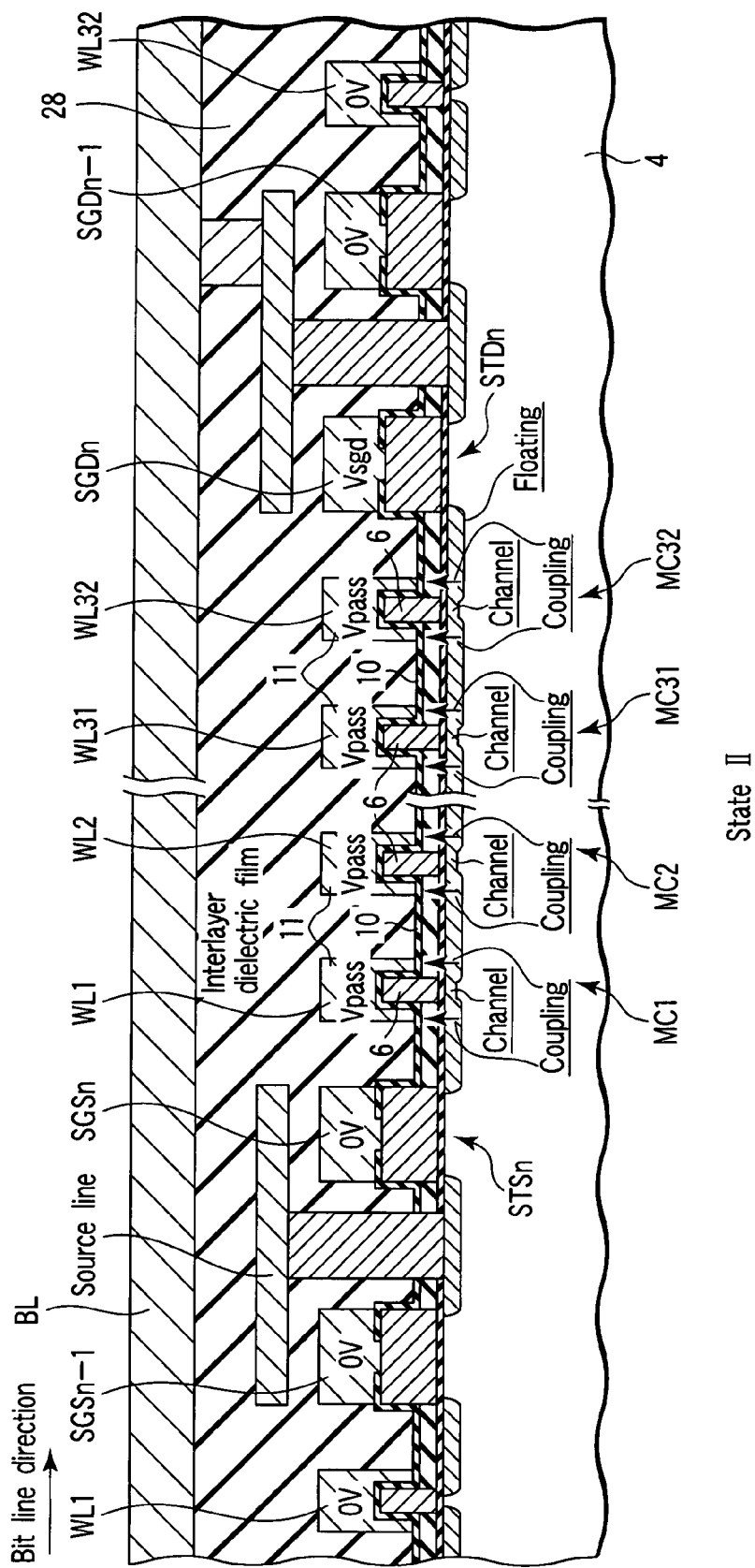
F I G. 87

SEMICONDUCTOR DEVICE MANUFACTURING METHOD AND SEMICONDUCTOR INTEGRATED CIRCUIT DEVICE

CROSS-REFERENCE TO RELATED APPLICATIONS

This application is based upon and claims the benefit of priority from prior Japanese Patent Application No. 2006-127037, filed Apr. 28, 2006, the entire contents of which are incorporated herein by reference.

BACKGROUND OF THE INVENTION

1. Field of the Invention

The present invention relates to a semiconductor device manufacturing method and semiconductor integrated circuit device and, more particularly, to a method of manufacturing a nonvolatile semiconductor memory device having stacked gate memory cells.

2. Description of the Related Art

As an example of the related art, manufacturing steps from the formation of element isolation regions (shallow trench isolations) to the formation of gate lines (word lines) of a memory cell array in a NAND nonvolatile semiconductor memory will be explained below.

FIG. 43 is a flowchart showing the well-known sequence from shallow trench isolation formation to word line formation. This sequence shown in FIG. 43 is illustrated in, e.g., FIGS. 2(a) to 2(d) of S. Aritome et al., "A 0.67-$\mu m^2$ SELF-ALIGNED SHALLOW TRENCH ISOLATION CELL (SA-STI CELL) FOR 3V-only 256-Mbit NAND EEPROMS", IEDM, pp. 61-64, 1994.

FIG. 44 is a plan view of the memory cell array formed following the procedure shown in FIG. 43. FIG. 45A is a sectional view taken along a line 45-45 in FIG. 44.

First, as indicated by ST1 in FIG. 43, a tunnel insulating film 5 is formed on a semiconductor substrate 4, and a floating gate (FG) conductor film 6 is deposited on the tunnel insulating film 5.

Then, as indicated by ST2, an element region (AA) mask pattern is formed on the floating gate conductor film 6, and used as an etching mask to dry-etch the floating gate conductor film 6 and semiconductor substrate 4, thereby forming shallow trenches in the semiconductor substrate 4 and separating the floating gate conductor film 6 in the bit line direction at the same time.

As indicated by ST3, an insulator (ST1) 9 is buried in the shallow trenches formed in the semiconductor substrate 4. Subsequently, an interpoly insulating film 10 that insulates floating gates from word lines is formed on the floating gate conductor film 6 and insulator 9. A word line conductor film 11 is deposited on the interpoly insulating film 10.

As indicated by ST4, a word line mask pattern 12 is formed on the word line conductor film 11, and used as an etching mask to dry-etch the word line conductor film 11, interpoly insulating film 10, and floating gate conductor film 6, thereby forming word lines WL and separating the floating gate conductor film 6 in the word line direction at the same time. FIGS. 45B and 45C illustrate this etching process. Note that similar to FIG. 45A, FIGS. 45B and 45C are sectional views taken along the line 45-45 in FIG. 44.

In these sectional views shown in FIGS. 45B and 45C, however, the floating gates 6 and insulating films 9 are actually tapered as shown in FIGS. 46A and 46B for the following reason. That is, due to the characteristics of dry etching for forming the shallow trenches in ST3, this etching progresses while depositing deposition films made of the etching product on the sidewalls. As shown in FIG. 46B, this taper forms, on the semiconductor substrate 4, portions hidden behind the insulating films 9 and interpoly insulating films 10. The floating gates 6 sometimes remain in these hidden portions without being etched. If these residues form, adjacent floating gates 6 shortcircuit. FIG. 47A is a plan view showing an ideal pattern (Design) of the floating gates (FG) 6 on the memory cell array. FIG. 47B is a plan view showing a pattern (Actual) of the floating gates (FG) 6 when the residues form.

If the residues form, as shown in FIG. 47B, the floating gates 6 do not form patterns independent of each other, but insufficiently separate from each other in the word line direction. Consequently, adjacent floating gates 6 connect to each other in the form of a chain along the bit line direction.

BRIEF SUMMARY OF THE INVENTION

A semiconductor device manufacturing method according to the first aspect of the present invention comprises forming a first insulating film on a semiconductor substrate, forming a first conductor film on the first insulating film, forming a second insulating film on the first conductor film, forming a first line-and-space pattern by etching the second insulating film and the first conductor film, forming a etched region etched into a second line-and-space pattern perpendicular to the first line-and-space pattern by etching the second insulating film, the first conductor film, the first insulating film, and the semiconductor substrate, burying a third insulating film in the etched region, removing the second insulating film, forming a fourth insulating film on the first conductor film and the third insulating film, forming a second conductor film on the fourth insulating film, and forming a third line-and-space pattern parallel to the first line-and-space pattern by etching the second conductor film.

A semiconductor device manufacturing method according to the second aspect of the present invention comprises forming a first insulating film on a semiconductor substrate, forming a first conductor film on the first insulating film, forming a second insulating film on the first conductor film, forming a first line-and-space pattern by etching the second insulating film and the first conductor film, forming a etched region etched into a second line-and-space pattern perpendicular to the first line-and-space pattern by etching the second insulating film, the first conductor film, the first insulating film, and the semiconductor substrate, burying a third insulating film in the etched region, etching the third insulating film to a middle of the second insulating film, forming a film on the etched region, implanting an impurity into the film parallel to the first line-and-space pattern and obliquely to the semiconductor substrate to form a first portion where the impurity is not implanted into the film and a second portion where the impurity is implanted into the film, etching the first portion, etching the third insulating film to a middle of a film thickness of the first conductor film by using the second portion and the second insulating film as masks, removing the second portion and the second insulating film, forming a fourth insulating film on the first conductor film and the third insulating film, forming a second conductor film on the fourth insulating film, and partially removing the second conductor film to form a buried interconnection formed of the second conductor film.

A semiconductor integrated circuit device according to the third aspect of the present invention comprises a semiconductor substrate having an element isolation region extending in a first direction, and an element region defined by the element isolation region, a gate insulating film formed on the element region, a charge storage layer formed on the gate insulating film, and having a first side surface and a second side surface along the first direction and a third side surface and a fourth side surface along a second direction perpendicular to the first direction, the first side surface being in contact with the element isolation region, a first insulating film formed above the element region, and in contact with the third side surface of the charge storage layer, a second insulating film formed above the element region, and in contact with the fourth side surface of the charge storage layer, an inter-gate insulating film formed on the first insulating film, the second insulating film, the charge storage layer, and the element isolation region, and a control gate formed on the inter-gate insulating film, opposing the charge storage layer via the inter-gate insulating film, and extending in the second direction.

BRIEF DESCRIPTION OF THE SEVERAL VIEWS OF THE DRAWING

FIG. 1 is a flowchart showing an example of the sequence of a semiconductor device manufacturing method according to the first embodiment of the present invention;

FIG. 12 is a plan view showing the example of the semiconductor device manufacturing method according to the second embodiment of the present invention in the order of main manufacturing steps;

FIG. 13A is a sectional view taken along a line A-A in FIG. 12;

FIG. 13B is a sectional view taken along a line B-B in FIG. 12;

FIG. 18 is a plan view showing the example of the semiconductor device manufacturing method according to the second embodiment of the present invention in the order of main manufacturing steps;

FIG. 19A is a sectional view taken along a line A-A in FIG. 18;

FIG. 19B is a sectional view taken along a line B-B in FIG. 18;

FIG. 20 is a plan view showing the example of the semiconductor device manufacturing method according to the second embodiment of the present invention in the order of main manufacturing steps;

FIG. 21A is a sectional view taken along a line A-A in FIG. 20;

FIG. 21B is a sectional view taken along a line B-B in FIG. 20;

FIGS. 22A and 22B are sectional views showing an example of a semiconductor device manufacturing method according to the third embodiment of the present invention in the order of main manufacturing steps, in which FIG. 22A is a sectional view corresponding to the line A-A in FIG. 12, and FIG. 22B is a sectional view corresponding to the line B-B in FIG. 12;

FIGS. 23A and 23B are sectional views showing the example of the semiconductor device manufacturing method according to the third embodiment of the present invention in the order of main manufacturing steps, in which FIG. 23A is a sectional view corresponding to the line A-A in FIG. 14, and FIG. 23B is a sectional view corresponding to the line B-B in FIG. 14;

FIGS. 24A and 24B are sectional views showing the example of the semiconductor device manufacturing method according to the third embodiment of the present invention in the order of main manufacturing steps, in which FIG. 24A is a sectional view corresponding to the line A-A in FIG. 16, and FIG. 24B is a sectional view corresponding to the line B-B in FIG. 16;

FIGS. 25A and 25B are sectional views showing the example of the semiconductor device manufacturing method according to the third embodiment of the present invention in the order of main manufacturing steps, in which FIG. 25A is a sectional view corresponding to the line A-A in FIG. 18, and FIG. 25B is a sectional view corresponding to the line B-B in FIG. 18;

FIGS. 26A and 26B are sectional views showing the example of the semiconductor device manufacturing method according to the third embodiment of the present invention in the order of main manufacturing steps, in which FIG. 26A is a sectional view corresponding to the line A-A in FIG. 20, and FIG. 26B is a sectional view corresponding to the line B-B in FIG. 20;

FIG. 41 is a plan view showing the example of the semiconductor device manufacturing method according to the fourth embodiment of the present invention in the order of main manufacturing steps;

FIG. 42A is a sectional view taken along a line A-A in FIG. 41;

FIG. 42B is a sectional view taken along a line B-B in FIG. 41;

FIGS. 50 to 52 are perspective views showing the example of the semiconductor integrated circuit device according to the fifth embodiment of the present invention;

FIGS. 53A to 53C are views for explaining the advantage obtained from the semiconductor integrated circuit device according to the fifth embodiment of the present invention;

FIGS. 54A to 54C are views showing a semiconductor integrated circuit device according to a reference example;

FIGS. 60 and 61 are sectional views showing an example of a semiconductor integrated circuit device according to the seventh embodiment of the present invention;

FIGS. 66A to 66C are views showing a semiconductor integrated circuit device according to a reference example;

FIG. 67 is a circuit diagram showing an application example of the semiconductor integrated circuit device according to the seventh embodiment of the present invention;

FIGS. 70 to 72 are perspective views showing the example of the semiconductor integrated circuit device according to the eighth embodiment of the present invention;

FIG. 75 is a sectional view showing an example of a semiconductor integrated circuit device from which advantage 1 is obtained better;

FIG. 76 is a view for explaining advantage 2 obtained from the semiconductor integrated circuit device according to the eighth embodiment of the present invention;

FIG. 82 is a view for explaining advantage 3 obtained from the semiconductor integrated circuit device according to the eighth embodiment of the present invention;

FIG. 83 is a view showing a semiconductor integrated circuit device according to a reference example;

FIG. 87 is a sectional view showing state II in FIG. 85.

DETAILED DESCRIPTION OF THE INVENTION

Figure 2:
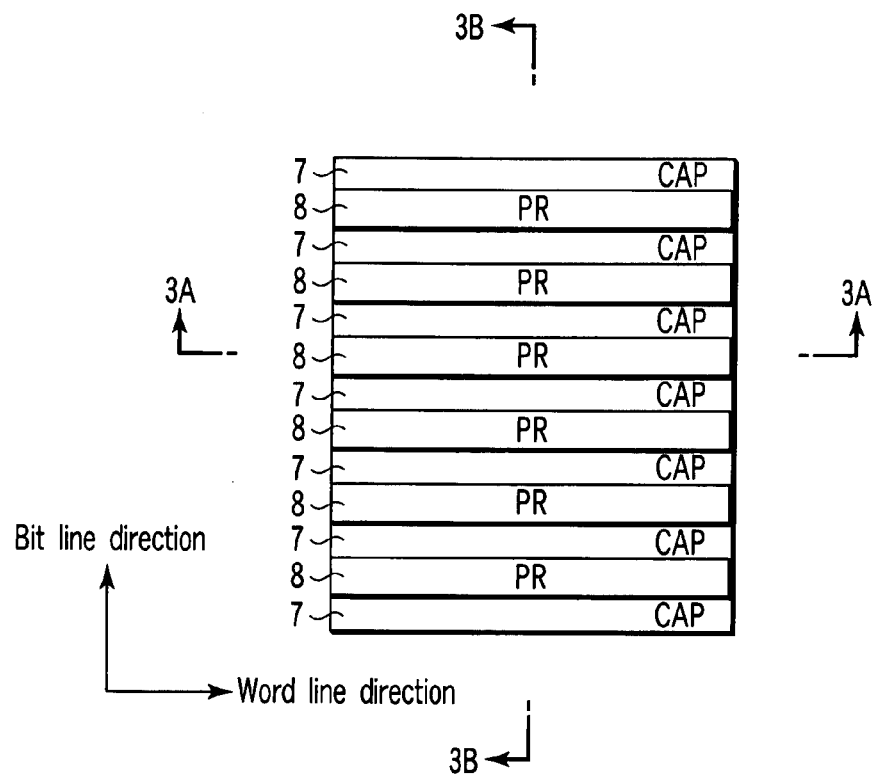
FIG. 2 is a plan view showing an example of a semiconductor device manufacturing method according to the second embodiment of the present invention in the order of main manufacturing steps.

Several embodiments of the present invention will be explained below with reference to the accompanying drawing. Note that the same reference numerals denote the same parts in the drawing.

First Embodiment

The first embodiment is the basis of the embodiments of the present invention. The first embodiment shows a procedure capable of preventing a shortcircuit of adjacent conductor patterns, e.g., a shortcircuit of adjacent floating gates, and shows an example of the sequence of the procedure.

The point of the first embodiment is that floating gates of memory cells of a stacked gate NAND flash memory are first separated along the word line direction, and then separated along the bit line direction by forming shallow trenches.

As described above, the first embodiment can prevent insufficient separation of the floating gates in the word line direction by separating the floating gates along the word line direction before forming shallow trenches that cause taper. As a consequence, a stacked gate NAND flash memory can be manufactured with high yield.

FIG. 1 is a flowchart showing an example of the sequence of a semiconductor device manufacturing method according to the first embodiment of the present invention.

First, as indicated by ST1 in FIG. 1, a tunnel insulating film is formed on a semiconductor substrate, and a floating gate (FG) conductor film is deposited on the tunnel insulating film.

Then, as indicated by ST2, a separation mask pattern for separating floating gates along the word line direction is formed on the floating gate conductor film. This separation mask pattern is used as an etching mask to etch the floating gate conductor film, thereby separating it along the word line direction.

As indicated by ST3, after the separation mask pattern is removed, an element region (AA) mask pattern is formed on the semiconductor substrate and floating gate conductor films. This element region mask pattern is used as an etching mask to etch the floating gate conductor films and semiconductor substrate, thereby forming shallow trenches in the semiconductor substrate and separating the floating gate conductor films along the bit line direction at the same time.

Subsequently, as indicated by ST4, an insulator is buried in the shallow trenches formed in the semiconductor substrate. An interpoly insulating film for insulating floating gates from word lines is formed on the semiconductor substrate, floating gate conductor films, and insulator. A word line conductor film is then deposited on the interpoly insulating film.

As indicated by ST5, a word line mask pattern is formed on the word line conductor film. This word line mask pattern is used as an etching mask to dry-etch the word line conductor film and interpoly insulating film, thereby forming word lines WL.

As described above, the first embodiment separates the floating gates along the word line direction before forming the shallow trenches that cause taper. That is, the floating gates are separated along the word line direction before the insulator buried in the shallow trenches is tapered. Therefore, no floating gates remain in hidden portions formed by the taper. This prevents insufficient separation of the floating gates in the word line direction. As a consequence, a stacked gate NAND flash memory can be manufactured with high yield.

Second Embodiment

The second embodiment is the first example when the first embodiment is applied to actual manufacturing steps.

FIGS. 2, 4, 6, 8, 10, 12, 14, 16, 18, and 20 are plan views showing an example of a semiconductor device manufacturing method according to the second embodiment of the present invention in the order of main manufacturing steps. FIGS. 3A, 3B, 5A, 5B, 7A, 7B, 9A, 9B, 11A, 11B, 13A, 13B, 15A, 15B, 17A, 17B, 19A, 19B, 21A, and 21B are sectional views showing the example of the semiconductor device manufacturing method according to the second embodiment of the present invention in the order of main manufacturing steps.

Figures 3A, 3B:
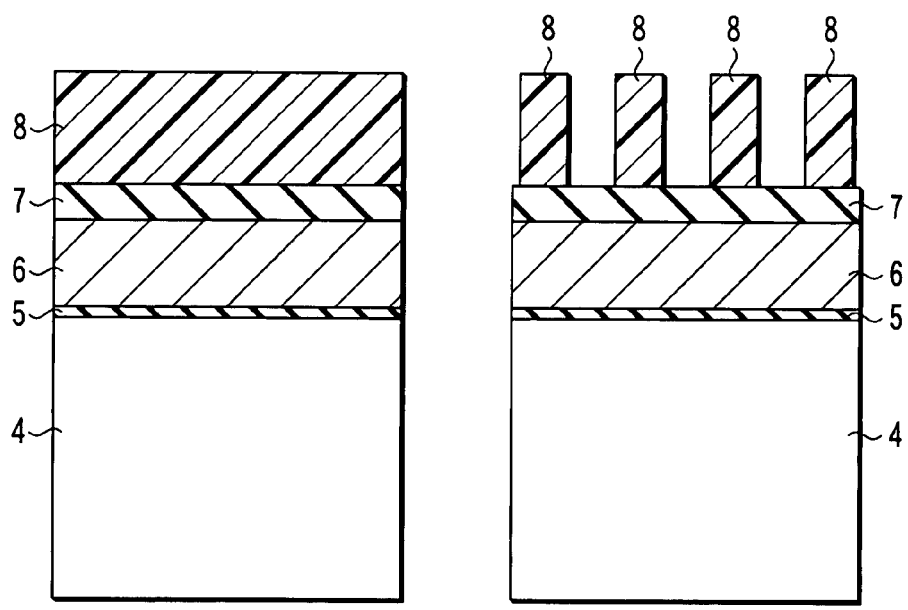
FIG. 3A is a sectional view taken along a line A-A in FIG. 2.
FIG. 3B is a sectional view taken along a line B-B in FIG. 2.

First, as shown in FIGS. 2, 3A, and 3B, a tunnel insulating film 5 is formed on a silicon substrate 4. An example of the formation method is to thermally oxidize the silicon substrate 4 by a thickness of about 8 nm. Then, a conductor film 6 for forming floating gates is formed on the tunnel insulating film 5. An example of the conductor film 6 is a phosphorus-doped polysilicon film into which phosphorus is doped. An example of the formation method is to deposit phosphorus-doped polysilicon about 140 nm thick on the tunnel insulating film 5 by using LP-CVD (Low Pressure CVD). Subsequently, an insulating film (CAP) 7 serving as a cap layer is formed on the phosphorus-doped polysilicon film 6. An example of the insulating film 7 is a silicon nitride film. An example of the formation method is to deposit silicon nitride about 70 nm thick on the phosphorus-doped polysilicon film 6 by using LP-CVD. The silicon nitride film 7 is then coated with a photoresist PR to form a photoresist film. This photoresist film is patterned by using lithography, thereby forming separation mask patterns 8 for separating floating gates along the word line direction.

Figure 4:
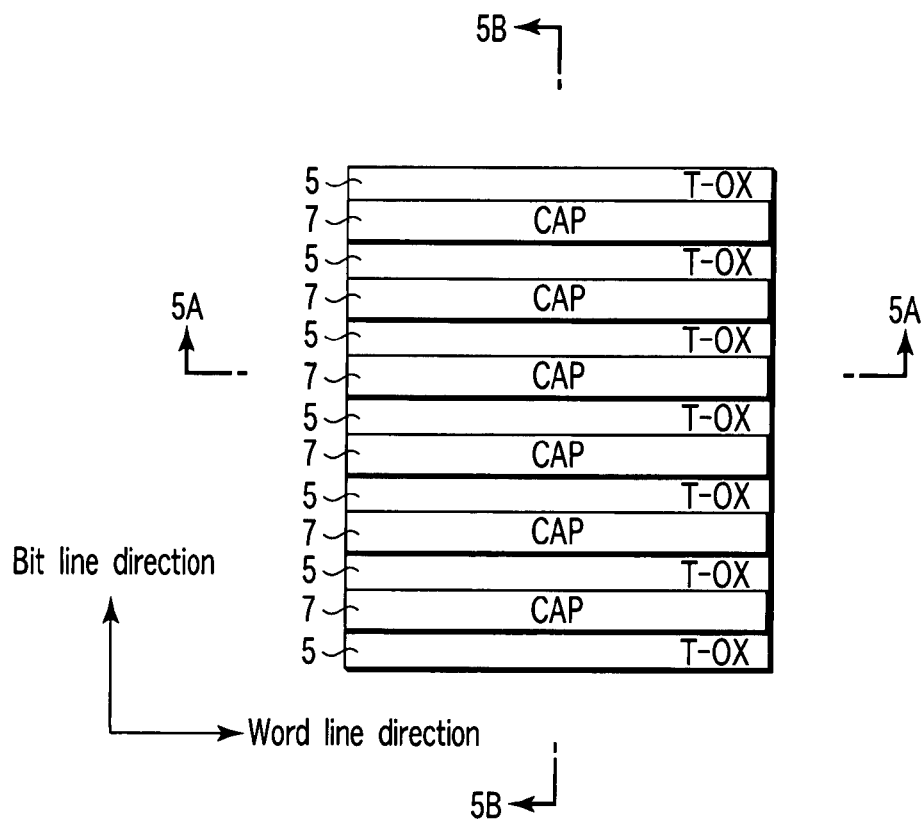
FIG. 4 is a plan view showing the example of the semiconductor device manufacturing method according to the second embodiment of the present invention in the order of main manufacturing steps.
Figure 5A:
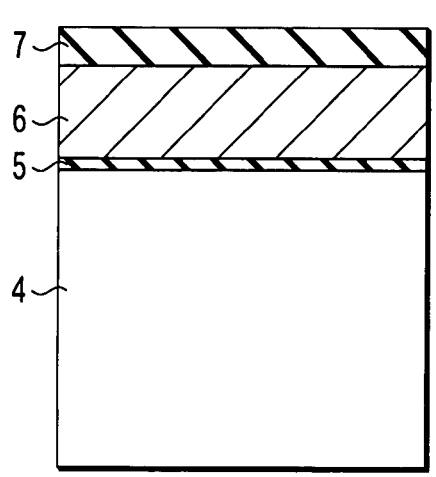
FIG. 5A is a sectional view taken along a line A-A in FIG. 4.
Figure 5B:
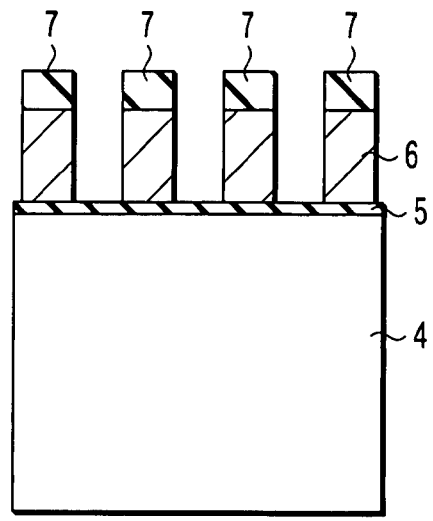
FIG. 5B is a sectional view taken along a line B-B in FIG. 4.

As shown in FIGS. 4, 5A, and 5B, the separation mask patterns 8 are used as etching masks to dry-etch the silicon nitride film 7 and phosphorus-doped polysilicon film 6. Then, the separation mask patterns 8 are removed by ashing.

Figure 6:
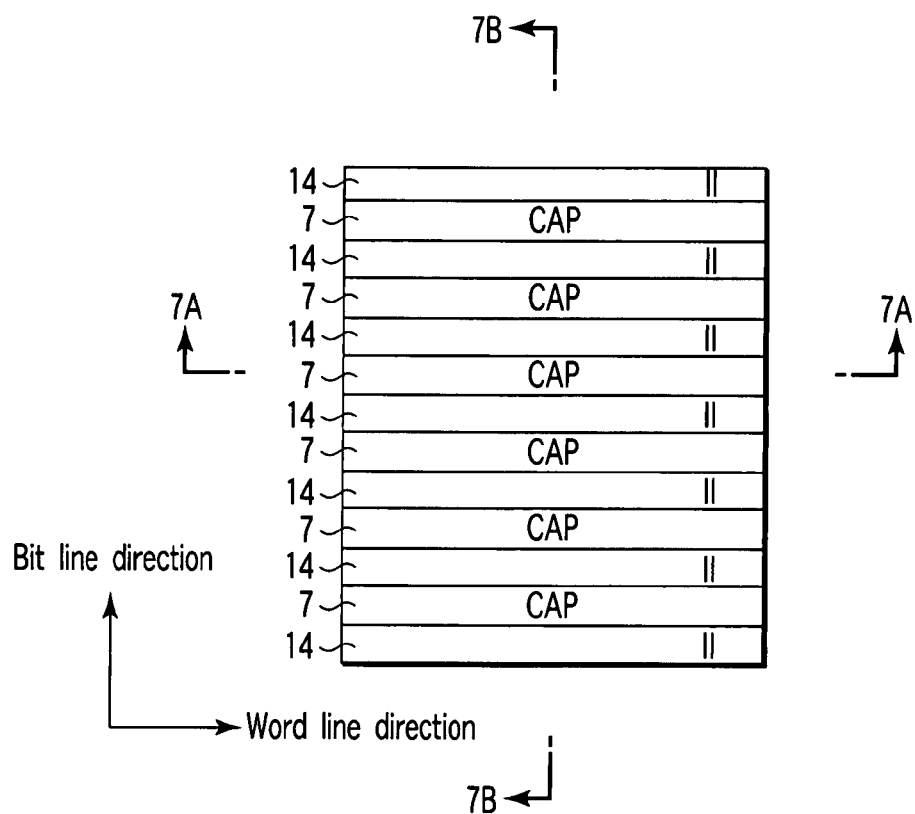
FIG. 6 is a plan view showing the example of the semiconductor device manufacturing method according to the second embodiment of the present invention in the order of main manufacturing steps.
Figures 7A, 7B:
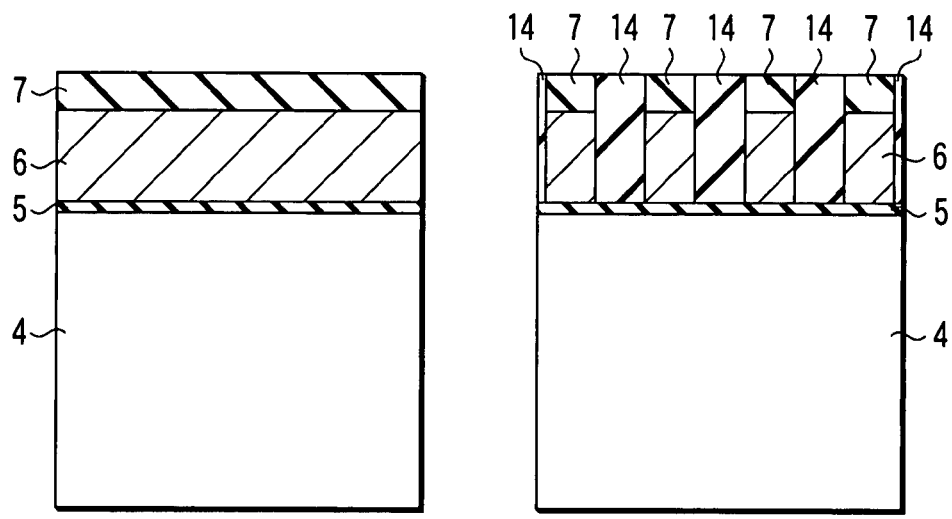
FIG. 7A is a sectional view taken along a line A-A in FIG. 6.
FIG. 7B is a sectional view taken along a line B-B in FIG. 6.

As shown in FIGS. 6, 7A, and 7B, an insulator (II) 14 is deposited on the silicon nitride films 7 and tunnel insulating film 5 (or the silicon substrate 4). An example of the insulator 14 is a silicon oxide film. An example of the formation method is to deposit, on the silicon nitride films 7 and tunnel insulating film 5 (or the silicon substrate 4), silicon oxide by a thickness with which the silicon oxide fills the spaces between the phosphorus-doped polysilicon films 6, by using P-CVD (Plasma CVD). The silicon nitride films 7 are used as polishing stoppers to perform chemical-mechanical polishing (CMP) on the silicon oxide films 14, thereby burying the silicon oxide films 14 in the spaces between the phosphorus-doped polysilicon films 6.

Figure 8:
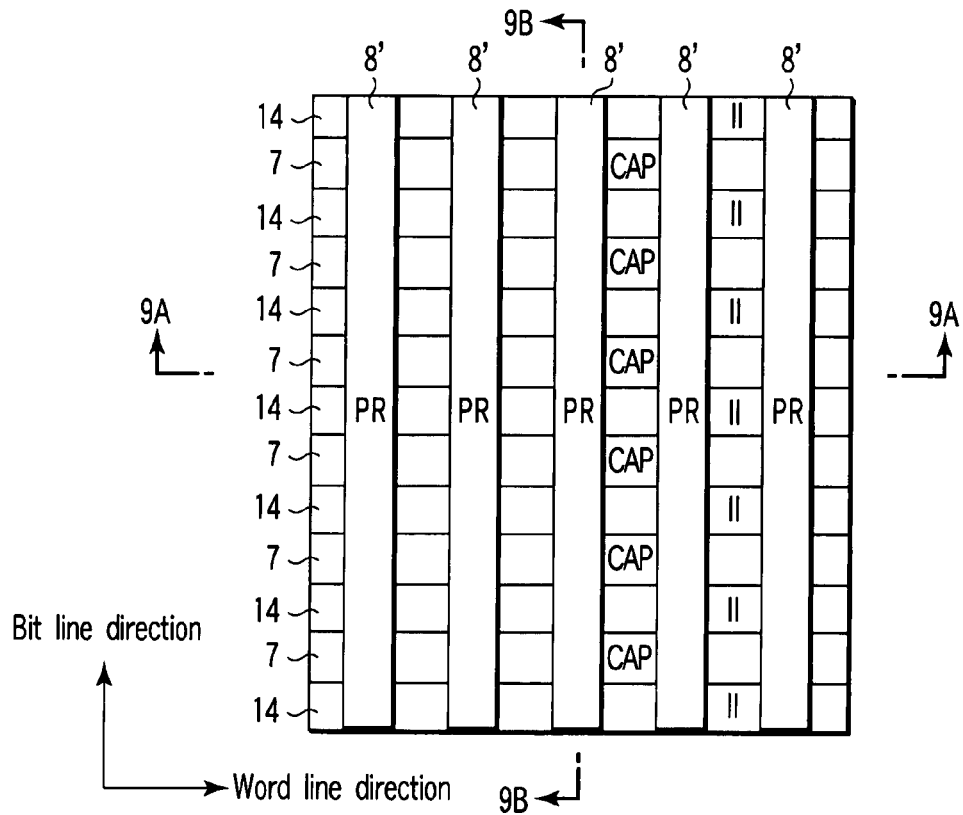
FIG. 8 is a plan view showing the example of the semiconductor device manufacturing method according to the second embodiment of the present invention in the order of main manufacturing steps.
Figures 9A, 9B:
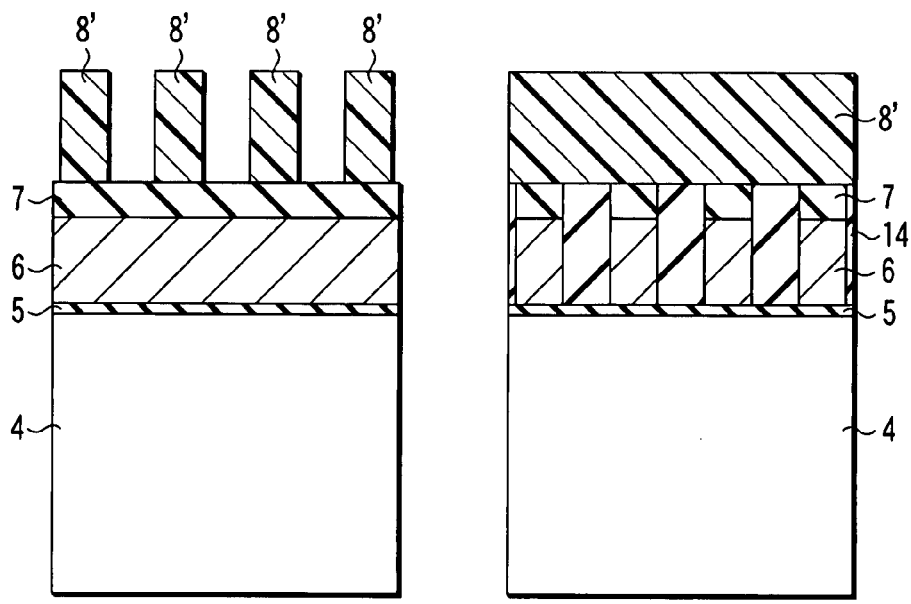
FIG. 9A is a sectional view taken along a line A-A in FIG. 8.
FIG. 9B is a sectional view taken along a line B-B in FIG. 8.

As shown in FIGS. 8, 9A, and 9B, the silicon nitride films 7 and silicon oxide films 14 are coated with a photoresist PR to form a photoresist film. This photoresist film is patterned by using lithography, thereby forming element region (AA) mask patterns 8'.

Figure 10:
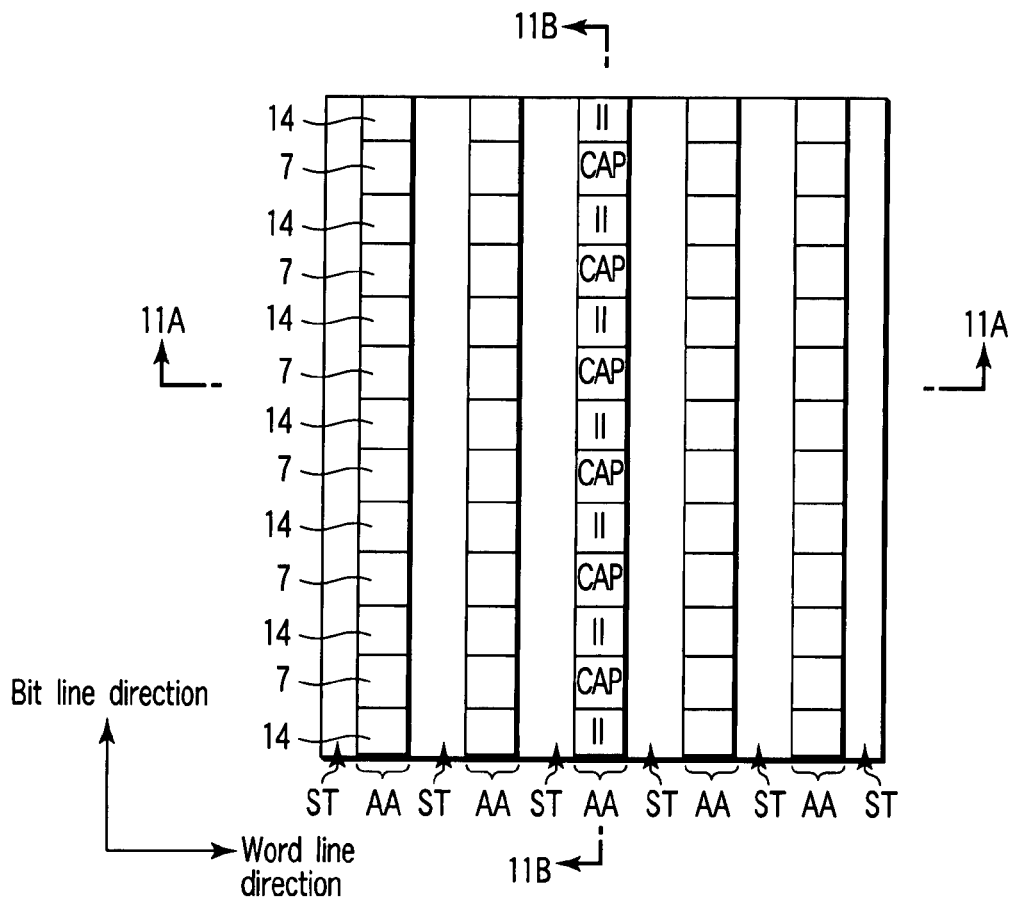
FIG. 10 is a plan view showing the example of the semiconductor device manufacturing method according to the second embodiment of the present invention in the order of main manufacturing steps.
Figures 11A, 11B:
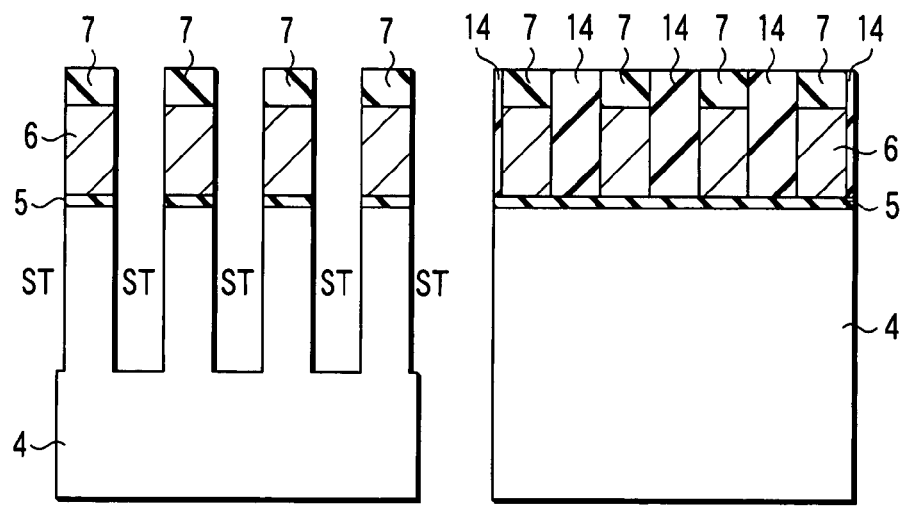
FIG. 11A is a sectional view taken along a line A-A in FIG. 10.
FIG. 11B is a sectional view taken along a line B-B in FIG. 10.

As shown in FIGS. 10, 11A, and 11B, the element region mask patterns 8' are used as etching masks to etch the silicon nitride films 7, silicon oxide films 14, phosphorus-doped polysilicon films 6, and tunnel insulating film 5, and further etch the silicon substrate 4, thereby forming shallow trenches ST in the silicon substrate 4. The element region mask patterns 8' are then removed by ashing.

As shown in FIGS. 12, 13A, and 13B, an insulator 9 is deposited on the silicon nitride films 7, silicon oxide films 14, and silicon substrate 4. An example of the insulator 9 is a silicon oxide film. An example of the formation method is to deposit, on the silicon nitride films 7, silicon oxide films 14, and silicon substrate 4, silicon oxide by a thickness with which the silicon oxide fills the shallow trenches ST, by using P-CVD (Plasma CVD). Subsequently, the silicon nitride films 7 are used as polishing stoppers to perform chemical-mechanical polishing (CMP) on the silicon oxide film 9, thereby burying the silicon oxide film 9 in the shallow trenches ST. This forms element isolation regions (shallow trench isolations STI) that define element regions AA.

Figure 14:
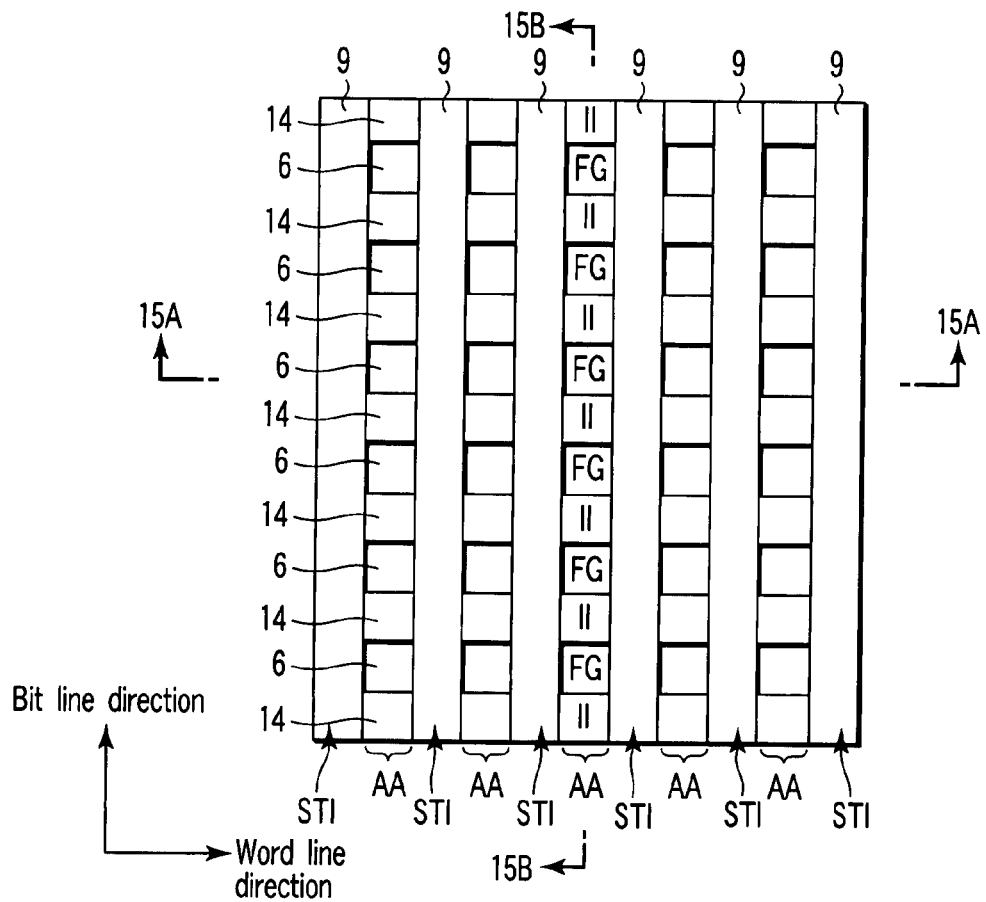
FIG. 14 is a plan view showing the example of the semiconductor device manufacturing method according to the second embodiment of the present invention in the order of main manufacturing steps.
Figures 15A, 15B:
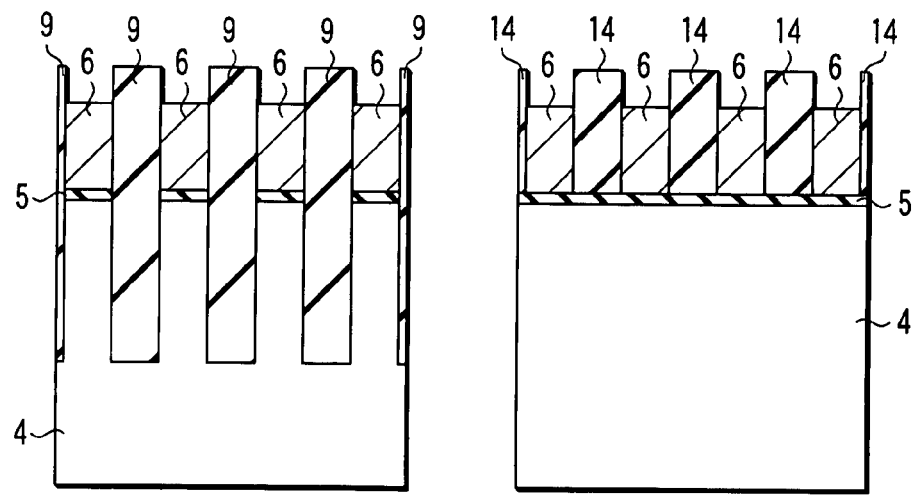
FIG. 15A is a sectional view taken along a line A-A in FIG. 14.
FIG. 15B is a sectional view taken along a line B-B in FIG. 14.

As shown in FIGS. 14, 15A, and 15B, the silicon nitride films 7 are removed by wet etching by using the silicon oxide films 9 and 14 as etching masks, thereby exposing the upper surfaces of the phosphorus-doped polysilicon films 6.

Figure 16:
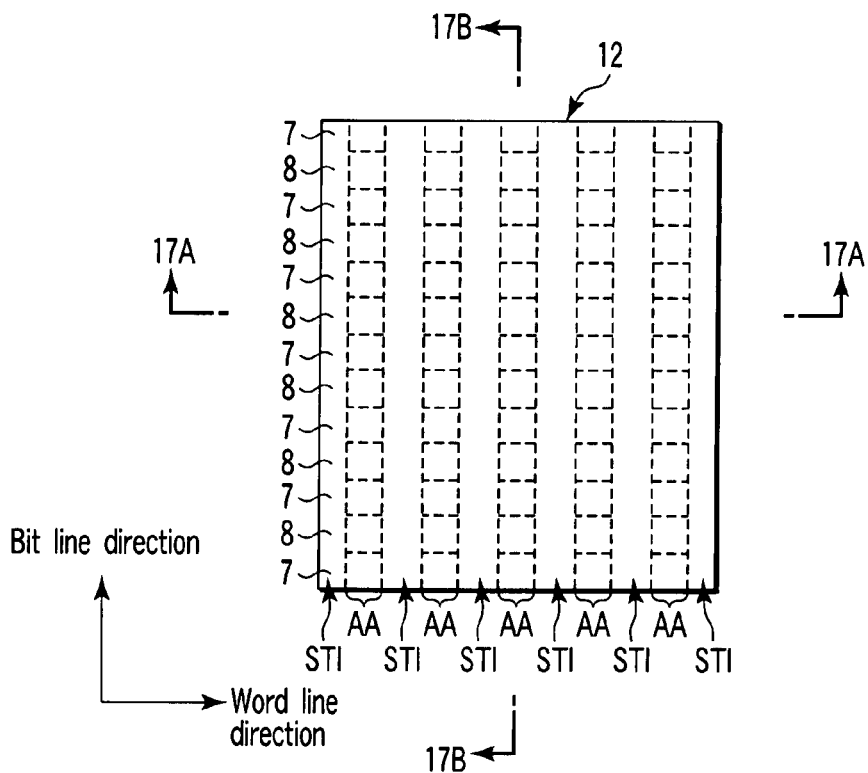
FIG. 16 is a plan view showing the example of the semiconductor device manufacturing method according to the second embodiment of the present invention in the order of main manufacturing steps.
Figures 17A, 17B:
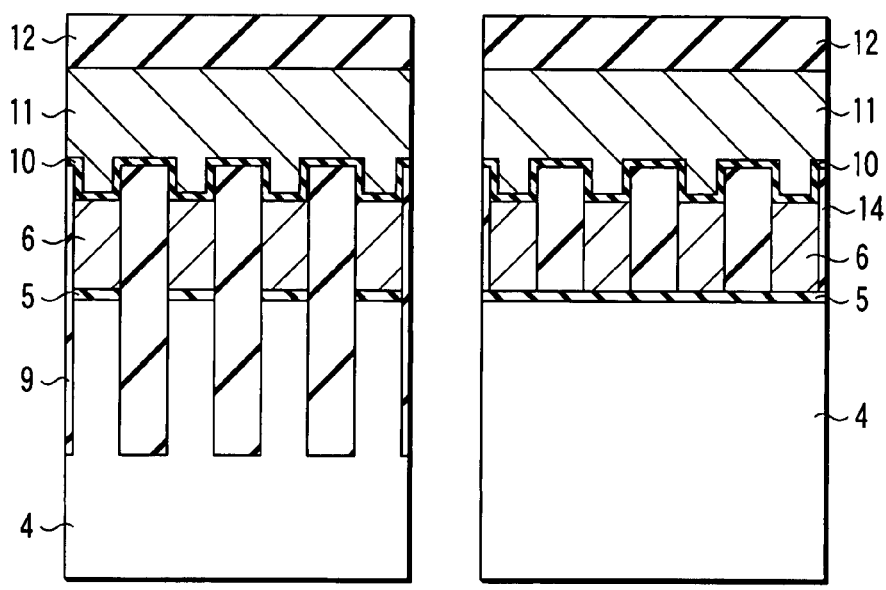
FIG. 17A is a sectional view taken along a line A-A in FIG. 16.
FIG. 17B is a sectional view taken along a line B-B in FIG. 16.

As shown in FIGS. 16, 17A, and 17B, an interpoly insulator 10 is deposited on the silicon oxide films 9 and 14 and phosphorus-doped polysilicon films 6. The interpoly insulator 10 insulates floating gates from control gates (word lines). An example of the insulator 10 is a silicon oxide film. An example of the formation method is to deposit silicon oxide on the silicon oxide films 9 and 14 and phosphorus-doped polysilicon films 6 by using LP-CVD (Low Pressure CVD). An example of the interpoly insulator 10 can be the lamination structure having the insulating films. Then, a conductor 11 is deposited on the silicon oxide film 10. The conductor 11 is the material of control gates (word lines). An example of the conductor 11 is a phosphorus-doped polysilicon film. An example of the formation method is to deposit phosphorus-doped polysilicon on the silicon oxide film 10 by using LP-CVD (Low Pressure CVD). Subsequently, an insulator 12 is deposited on the phosphorus-doped polysilicon film 11. An example of the insulator 12 is a silicon nitride film. An example of the formation method is to deposit silicon nitride on the phosphorus-doped polysilicon film 11 by using LP-CVD.

As shown in FIGS. 18, 19A, and 19B, the silicon nitride film 12 is coated with a photoresist PR to form a photoresist film. This photoresist film is then patterned by using lithography, thereby forming word line mask patterns 13.

As shown in FIGS. 20, 21A, and 21B, the word line mask patterns 13 are used as etching masks to dry-etch the silicon nitride film 12, and successively dry-etch the phosphorus-doped polysilicon film 11. After that, the word line mask patterns 13 are removed by ashing.

The above steps form a memory cell array of a stacked gate NAND flash memory.

Similar to the first embodiment, the second embodiment also separates the phosphorus-doped polysilicon film 6 as the material of floating gates along the word line direction (the step shown in FIGS. 4, 5A, and 5B) before forming the shallow trenches ST that taper the silicon oxide films 9.

That is, the phosphorus-doped polysilicon film 6 is separated along the word line direction before the silicon oxide films 9 buried in the shallow trenches ST are tapered. Therefore, the phosphorus-doped polysilicon films 6 do not remain in hidden portions formed by the taper. This prevents insufficient separation of the phosphorus-doped polysilicon films 6 in the word line direction. Consequently, the second embodiment can also manufacture a stacked gate NAND flash memory with high yield, as in the first embodiment.

Third Embodiment

The third embodiment is the second example when the first embodiment is applied to actual manufacturing steps.

The third embodiment particularly differs from the second embodiment in that in the step shown in FIGS. 12, 13A, and 13B of the second embodiment, the upper surfaces of the insulating films (STI) 9 buried in the shallow trenches ST are lowered to the middle of the side surfaces of the conductor films 6 for forming floating gates, thereby exposing the side surfaces of the conductor films 6.

FIGS. 22A and 22B to 26A and 26B are sectional views showing an example of a semiconductor device manufacturing method according to the third embodiment of the present invention in the order of main manufacturing steps. Note that the sections shown in FIGS. 22A to 26A correspond to the sections taken along the line A-A in FIGS. 12 to 20, and the sections shown in FIGS. 22B to 26B correspond to the sections taken along the line B-B in FIGS. 12 to 20.

First, shallow trenches ST are formed in a silicon substrate 4 following the same procedure as explained in the second embodiment until the step shown in FIGS. 10, 11A, and 11B.

Then, as shown in FIGS. 22A and 22B, an insulator 9 is deposited on silicon nitride films 7, silicon oxide films 14, and the silicon substrate 4, and buried in the shallow trenches ST. An example of the insulator 9 can be a silicon oxide film as in the first embodiment, and an example of the formation method can also be the same as in the first embodiment. The silicon nitride films 7 are used as etching masks to dry-etch the silicon nitride films 9. This embodiment dry-etches the silicon oxide films 9 to the middle of the side surfaces of conductor films 6, in this embodiment, phosphorus-doped polysilicon films 6. The upper surfaces of the silicon oxide films 9 are lowered to the middle of the side surfaces of the phosphorus-doped polysilicon films 6. This exposes the side surfaces of the phosphorus-doped polysilicon films 6. In this manner, element isolation regions (shallow trench isolations STI) that define element regions AA are formed in the silicon substrate 4.

Note that in this embodiment, the insulating films 14 buried in the spaces between the phosphorus-doped polysilicon films 6 are the silicon oxide films 14, so the silicon oxide films 14 are also dry-etched simultaneously with the silicon oxide films 9. Therefore, as particularly shown in FIG. 22B, the upper surfaces of the silicon oxide films 14 lower to the middle of the side surfaces of the phosphorus-doped polysilicon films 6 together with the upper surfaces of the silicon oxide films 9.

Subsequently, as shown in FIGS. 23A and 23B, the silicon oxide films 9 and 14 are used as etching masks to wet-etch the silicon nitride films 7, thereby removing the silicon nitride films 7.

As shown in FIGS. 24A and 24B, an interpoly insulator 10 is deposited on the silicon oxide films 9 and 14 and phosphorus-doped polysilicon films 6. An example of the interpoly insulator 10 can be the same as in the second embodiment, i.e., a silicon oxide film. An example of the formation method can also be the same as in the second embodiment. Then, a conductor 11 is deposited on the silicon oxide film 10. An example of the conductor 11 can be the same as in the second embodiment, i.e., a phosphorus-doped polysilicon film. An example of the formation method can also be the same as in the second embodiment. Subsequently, an insulator 12 is deposited on the phosphorus-doped polysilicon film 11. An example of the insulator 12 is the same as in the second embodiment, i.e., a silicon nitride film. An example of the formation method is also the same as in the second embodiment.

As shown in FIGS. 25A and 25B, the silicon nitride film 12 is coated with a photoresist PR to form a photoresist film. This photoresist film is then patterned by using lithography, thereby forming word line mask patterns 13.

As shown in FIGS. 26A and 26B, the word line mask patterns 13 are used as etching masks to dry-etch the silicon nitride film 12, and successively dry-etch the phosphorus-doped polysilicon film 11. After that, the word line mask patterns 13 are removed by ashing.

The above steps form a memory cell array of a stacked gate NAND flash memory.

Similar to the first and second embodiments, the third embodiment also separates the phosphorus-doped polysilicon film 6 as the material of floating gates along the word line direction before forming the shallow trenches ST that taper the silicon oxide films 9. As in the first and second embodiments, therefore, the phosphorus-doped polysilicon films 6 do not remain in hidden portions formed by the taper. This prevents insufficient separation of the phosphorus-doped polysilicon films 6 in the word line direction. Consequently, the third embodiment can also manufacture a stacked gate NAND flash memory with high yield, as in the first and second embodiments.

In addition, the third embodiment lowers the upper surfaces of the insulating films (STI) 9 buried in the shallow trenches to the middle of the side surfaces of the conductor films 6 as floating gates, thereby exposing the side surfaces of the conductor films 6. When compared to the second embodiment, therefore, as well shown in, e.g., FIG. 26A, the opposing area between the conductor films 6 and 11 can be increased. Accordingly, the capacitance between the floating gate and control gate (word line) can be made larger than that in the second embodiment.

Furthermore, as particularly shown in FIG. 26A, the floating gates 6 in the word line direction sandwich the conductor film 11. This makes it possible to decrease the capacitance between adjacent floating gates along the word line direction, compared to the second embodiment. Since the capacitance between the floating gates can be decreased, the structure hardly suffers the memory cell threshold fluctuation caused by the potential of adjacent floating gates, i.e., the so-called proximity effect. As described above, the memory cell obtained according to the third embodiment has the structure that hardly suffers the proximity effect. This is also advantageous in further micropatterning memory cells.

Fourth Embodiment

The fourth embodiment is the third example when the first embodiment is applied to actual manufacturing steps.

FIGS. 27, 29, 31, 33, 35, 37, 39, and 41 are plan views showing an example of a semiconductor device manufacturing method according to the fourth embodiment of the present invention in the order of main manufacturing steps. FIGS. 28A, 28B, 30A, 30B, 32A, 32B, 34A, 34B, 34C, 36A, 36B, 38A, 38B, 40A, 40B, 42A, and 42B are sectional views showing the example of the semiconductor device manufacturing method according to the fourth embodiment of the present invention in the order of main manufacturing steps.

Figure 27:
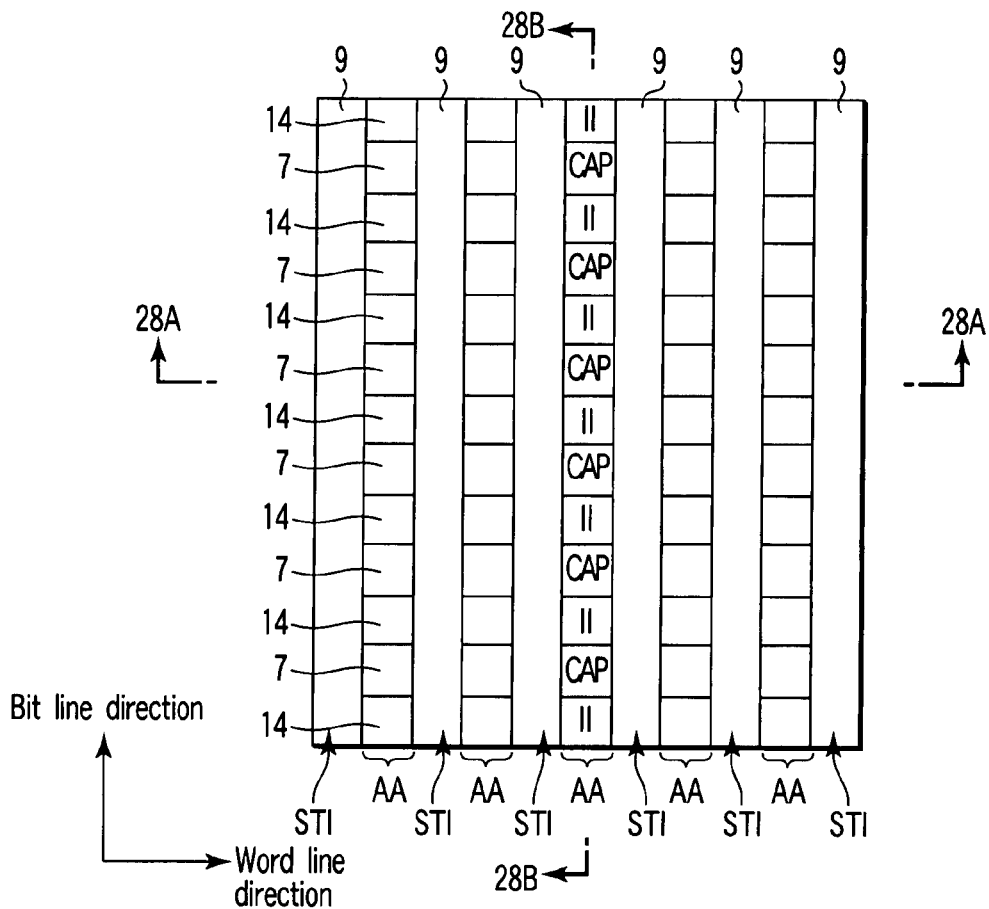
FIG. 27 is a plan view showing an example of a semiconductor device manufacturing method according to the fourth embodiment of the present invention in the order of main manufacturing steps.
Figures 28A, 28B:
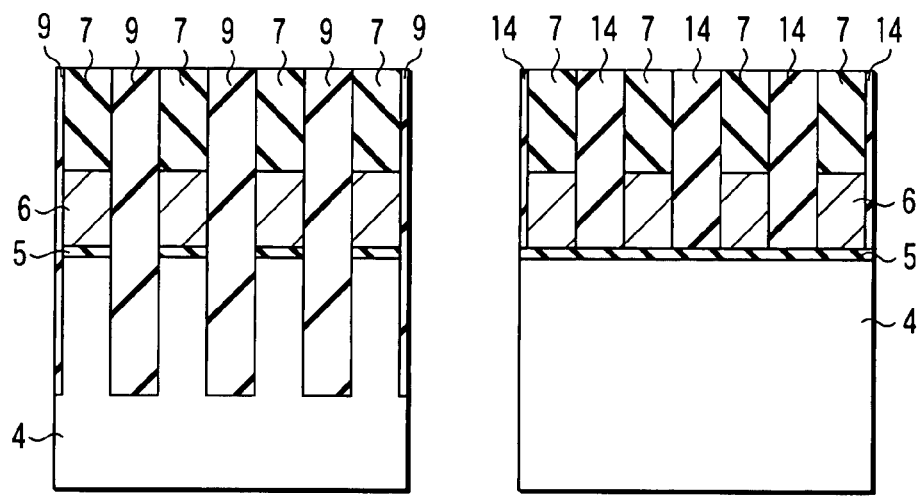
FIG. 28A is a sectional view taken along a line A-A in FIG. 27.
FIG. 28B is a sectional view taken along a line B-B in FIG. 27.

First, as shown in FIGS. 27, 28A, and 28B, shallow trenches ST are formed in a silicon substrate 4 and filled with insulating films 9, in this embodiment, silicon oxide films 9, following the same procedure as explained in the second embodiment until the step shown in FIGS. 12, 13A, and 13B. In this embodiment, however, the thicknesses of insulating films (CAP) 7 and silicon nitride films 7 are made larger than those in the second and third embodiments.

Figure 29:
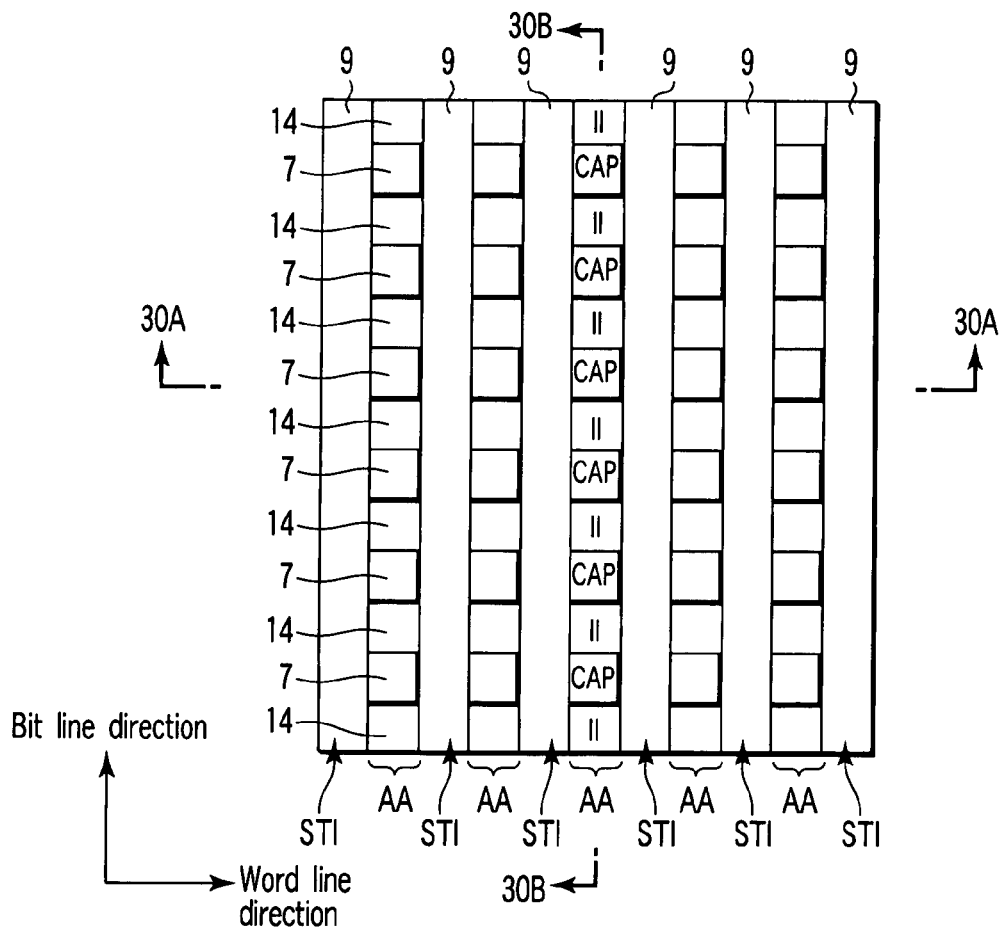
FIG. 29 is a plan view showing the example of the semiconductor device manufacturing method according to the fourth embodiment of the present invention in the order of main manufacturing steps.
Figures 30A, 30B:
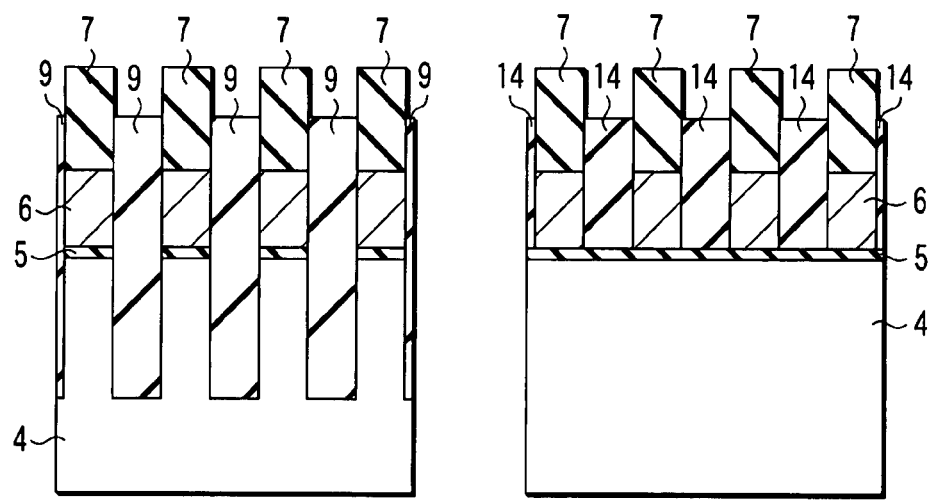
FIG. 30A is a sectional view taken along a line A-A in FIG. 29.
FIG. 30B is a sectional view taken along a line B-B in FIG. 29.

Then, as shown in FIGS. 29, 30A, and 30B, the silicon nitride films 7 are used as etching masks to dry-etch or wet-etch the silicon oxide films 9 and silicon oxide films 14. This embodiment dry-etches or wet-etches the silicon oxide films 9 and 14 to the middle of the side surfaces of the silicon nitride films 7. Consequently, the upper surfaces of the silicon oxide films 9 and 14 lower to the middle of the side surfaces of the silicon nitride films 7.

Figure 31:
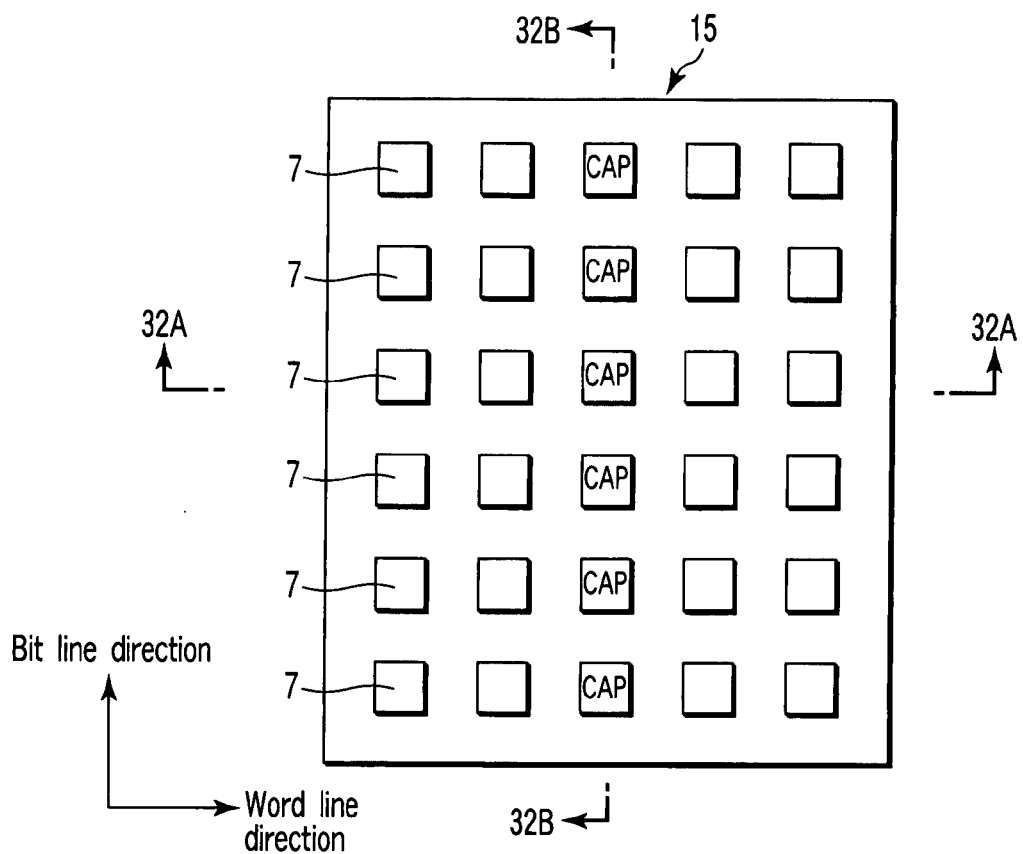
FIG. 31 is a plan view showing the example of the semiconductor device manufacturing method according to the fourth embodiment of the present invention in the order of main manufacturing steps.
Figures 32A, 32B:
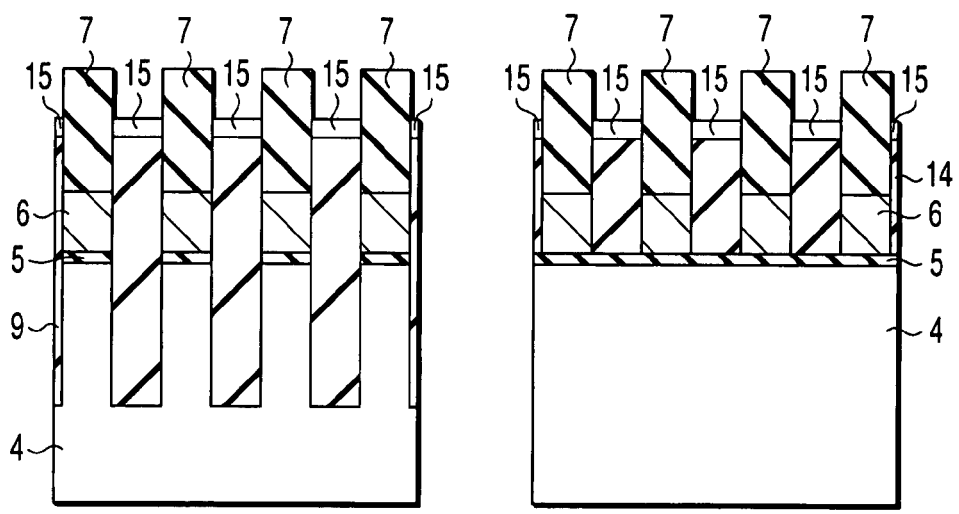
FIG. 32A is a sectional view taken along a line A-A in FIG. 31.
FIG. 32B is a sectional view taken along a line B-B in FIG. 31.

As shown in FIGS. 31, 32A, and 32B, amorphous silicon, for example, is deposited on the silicon nitride films 7 and silicon oxide films 9 and 14 by using LP-CVD (Low Pressure CVD), thereby forming an amorphous silicon film 15. Then, the silicon nitride films 7 are used as polishing stoppers to perform chemical-mechanical polishing (CMP) on the amorphous silicon film 15. Subsequently, the silicon nitride films 7 are used as etching masks to dry-etch the amorphous silicon film 15, thereby recessing it. Consequently, the amorphous silicon film 15 remains around the silicon nitride films 7 remaining in the forms of pillars.

Figure 33:
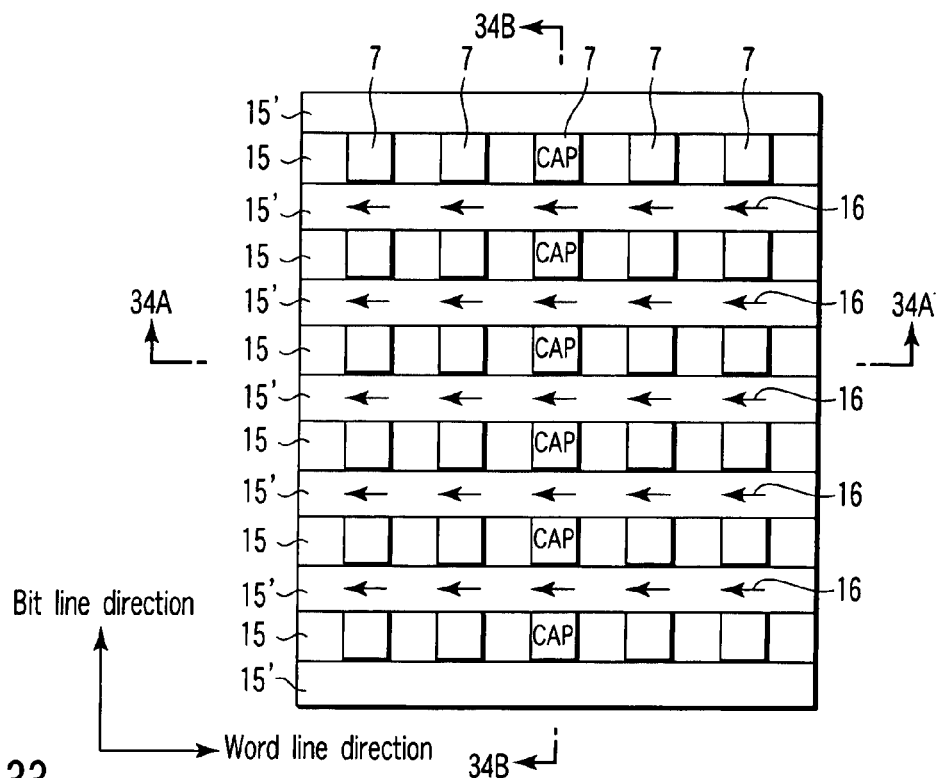
FIG. 33 is a plan view showing the example of the semiconductor device manufacturing method according to the fourth embodiment of the present invention in the order of main manufacturing steps.
Figure 34A:
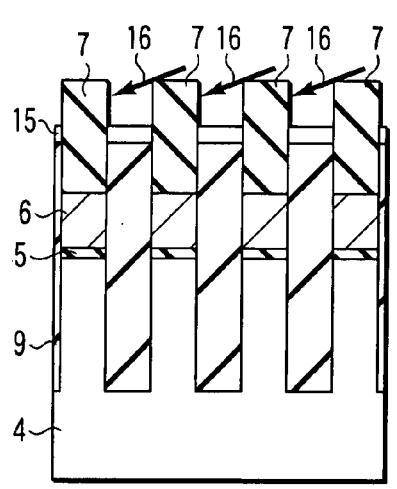
FIG. 34A is a sectional view taken along a line A-A in FIG. 33.
Figure 34B:
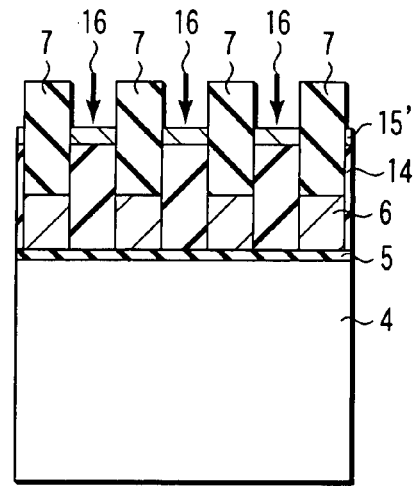
FIG. 34B is a sectional view taken along a line B-B in FIG. 33.

As shown in FIGS. 33, 34A, and 34B, boron ions ($B^+$) 16 are implanted parallel to the word line direction and obliquely to the silicon substrate 4. Adjusting the implantation angle hides portions of the amorphous silicon film 15 behind the silicon nitride films 7. The boron ions ($B^+$) 16 are not implanted into these hidden portions. As a result, regions 15' (boron-doped amorphous silicon films) into which the boron ions ($B^+$) 16 are selectively implanted are formed parallel to the word line direction in the amorphous silicon film 15.

Figure 34C:
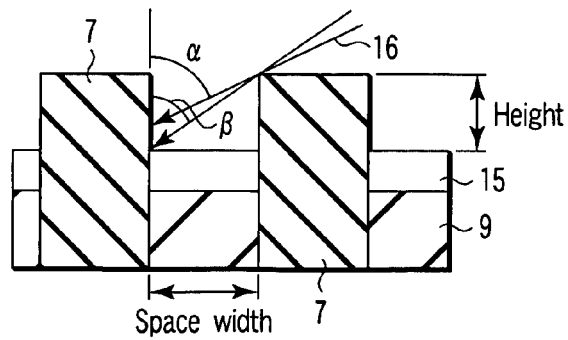
FIG. 34C is a macrograph of a part of FIG. 34A.

As shown in FIG. 34C, the implantation angle $\alpha$ of the boron ions ($B^+$) 16 is desirably larger than an angle $\beta$ determined by the space width in the word line direction and the height of the silicon nitride film 7 above the upper surface of the amorphous silicon film 15. This is so in order to form, in the amorphous silicon film 15, regions into which the boron ions ($B^+$) 16 are not implanted and the regions 151 into which the boron ions ($B^+$) 16 are implanted.

Figure 35:
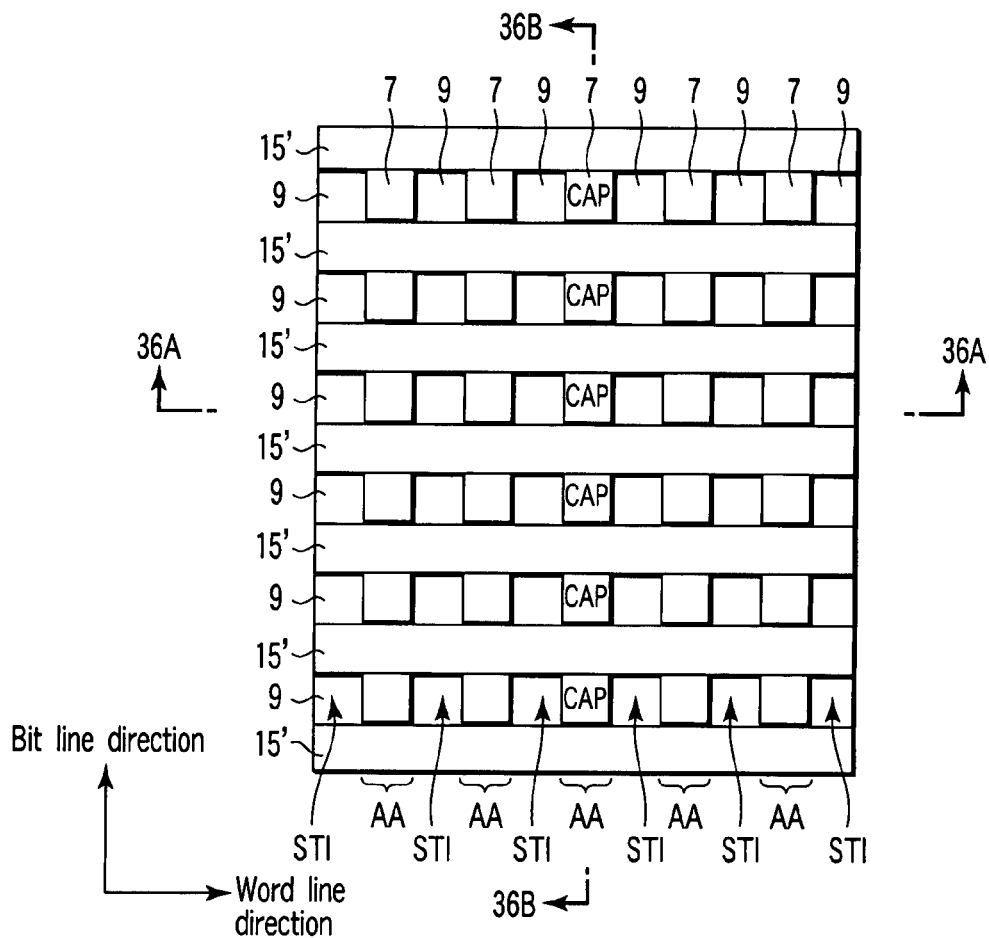
FIG. 35 is a plan view showing the example of the semiconductor device manufacturing method according to the fourth embodiment of the present invention in the order of main manufacturing steps.
Figures 36A, 36B:
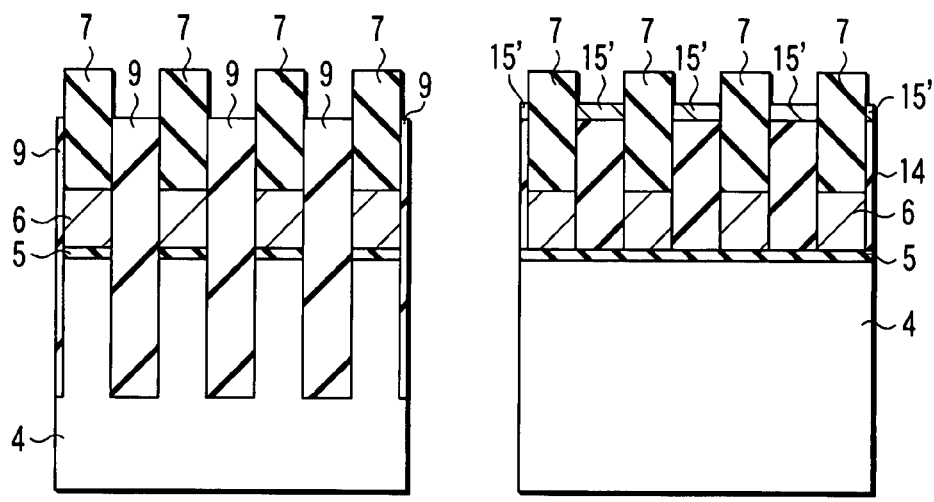
FIG. 36A is a sectional view taken along a line A-A in FIG. 35.
FIG. 36B is a sectional view taken along a line B-B in FIG. 35.

As shown in FIGS. 35, 36A, and 36B, the silicon nitride films 7 are used as etching masks to wet-etch the amorphous silicon film 15 by using, e.g., an alkaline etchant. Of the amorphous silicon film 15, the regions of the boron-doped amorphous silicon films 15' are not etched but remain because the alkali etching rate of these regions is lower than that of the rest.

Figure 37:
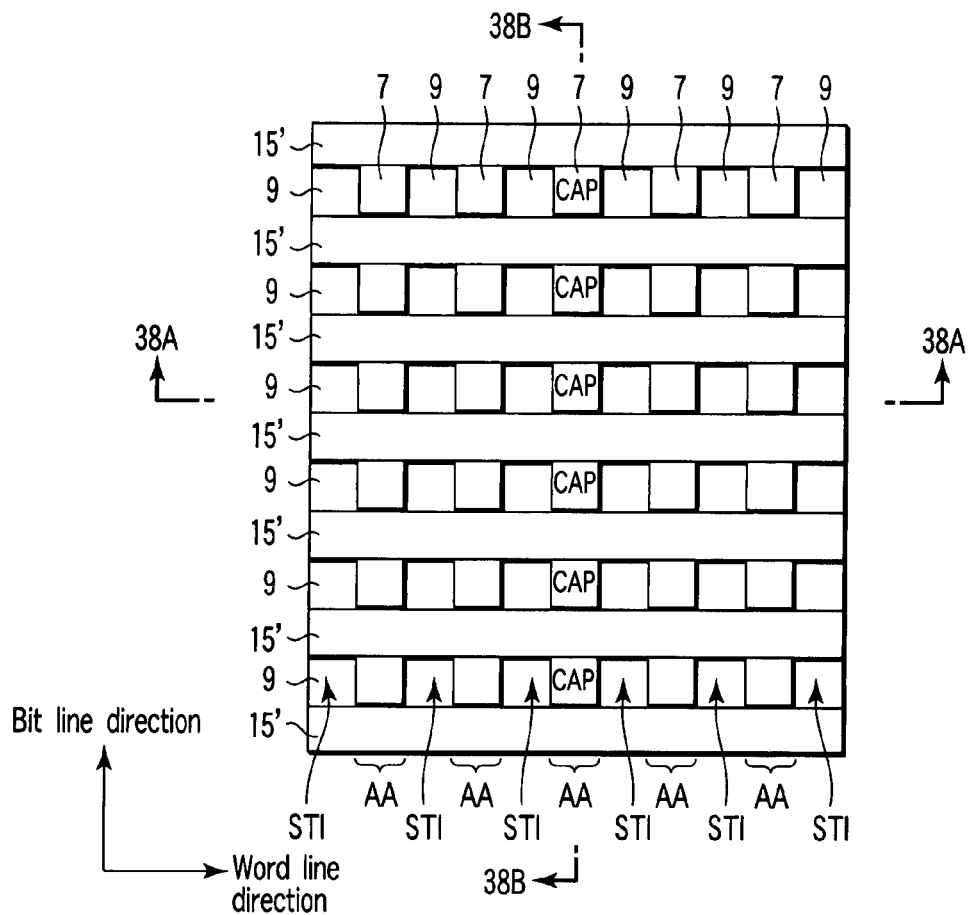
FIG. 37 is a plan view showing the example of the semiconductor device manufacturing method according to the fourth embodiment of the present invention in the order of main manufacturing steps.
Figures 38A, 38B:
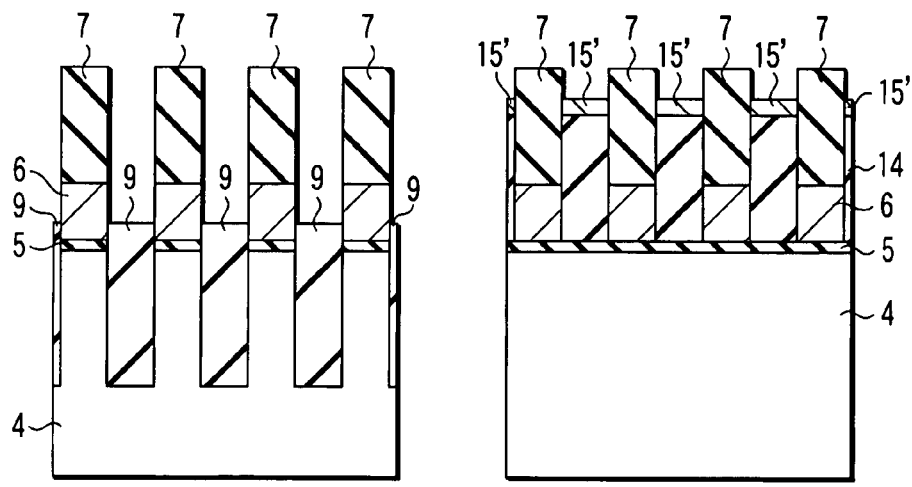
FIG. 38A is a sectional view taken along a line A-A in FIG. 37.
FIG. 38B is a sectional view taken along a line B-B in FIG. 37.

As shown in FIGS. 37, 38A, and 38B, the silicon nitride films 7 and boron-doped amorphous silicon films 15' are used as etching masks to dry-etch the silicon oxide films 9. This embodiment dry-etches the silicon oxide films 9 to the middle of the side surfaces of phosphorus-doped polysilicon films 6. This lowers the upper surfaces of the silicon oxide films 9 to the middle of the side surfaces of the phosphorus-doped polysilicon films 6, thereby exposing the side surfaces of the phosphorus-doped polysilicon films 6.

Figure 39:
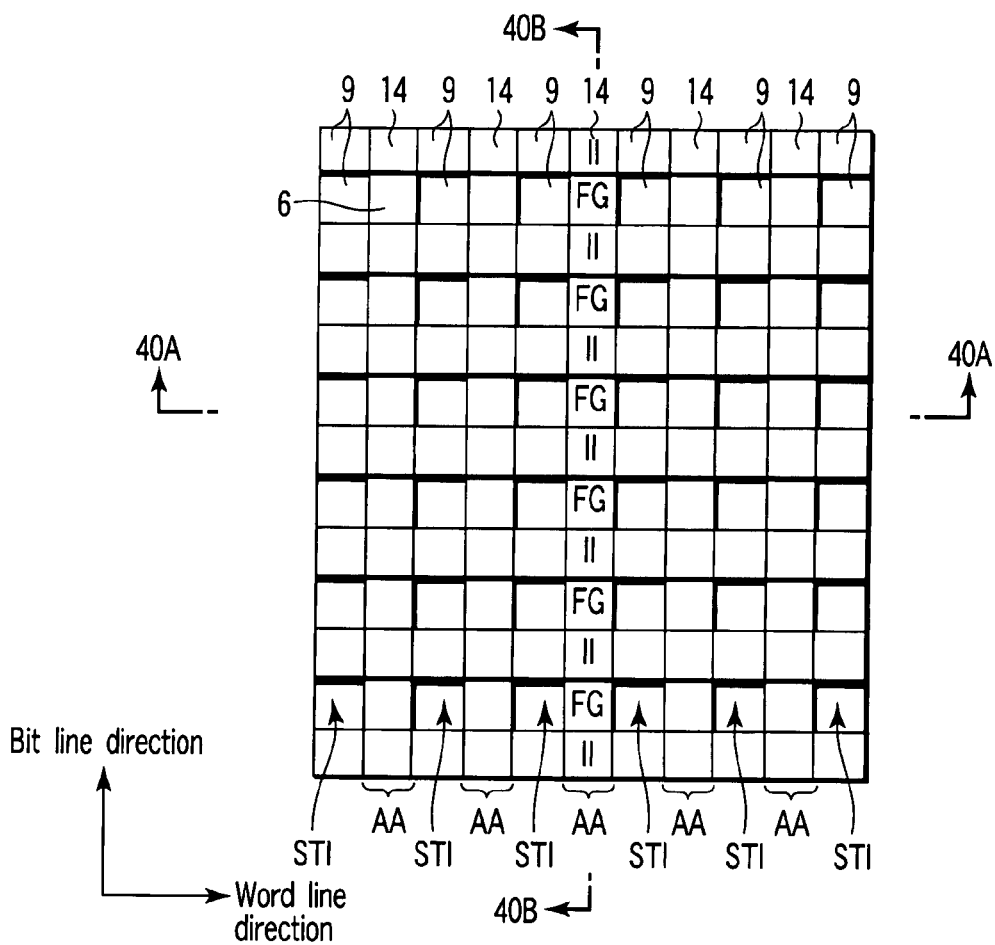
FIG. 39 is a plan view showing the example of the semiconductor device manufacturing method according to the fourth embodiment of the present invention in the order of main manufacturing steps.
Figure 40A:
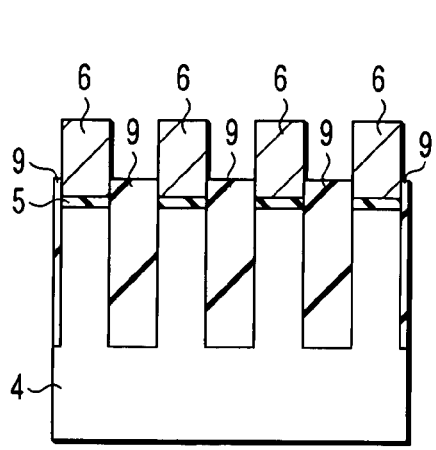
FIG. 40A is a sectional view taken along a line A-A in FIG. 39.
Figure 40B:
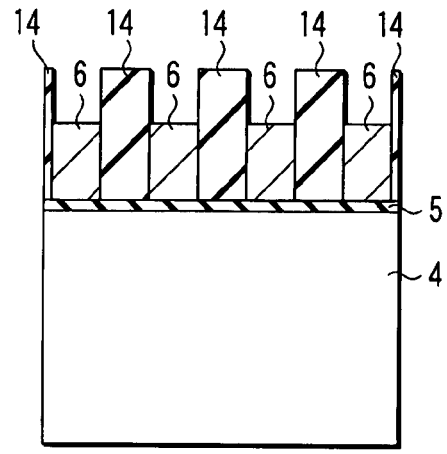
FIG. 40B is a sectional view taken along a line B-B in FIG. 39.
Figure 43:
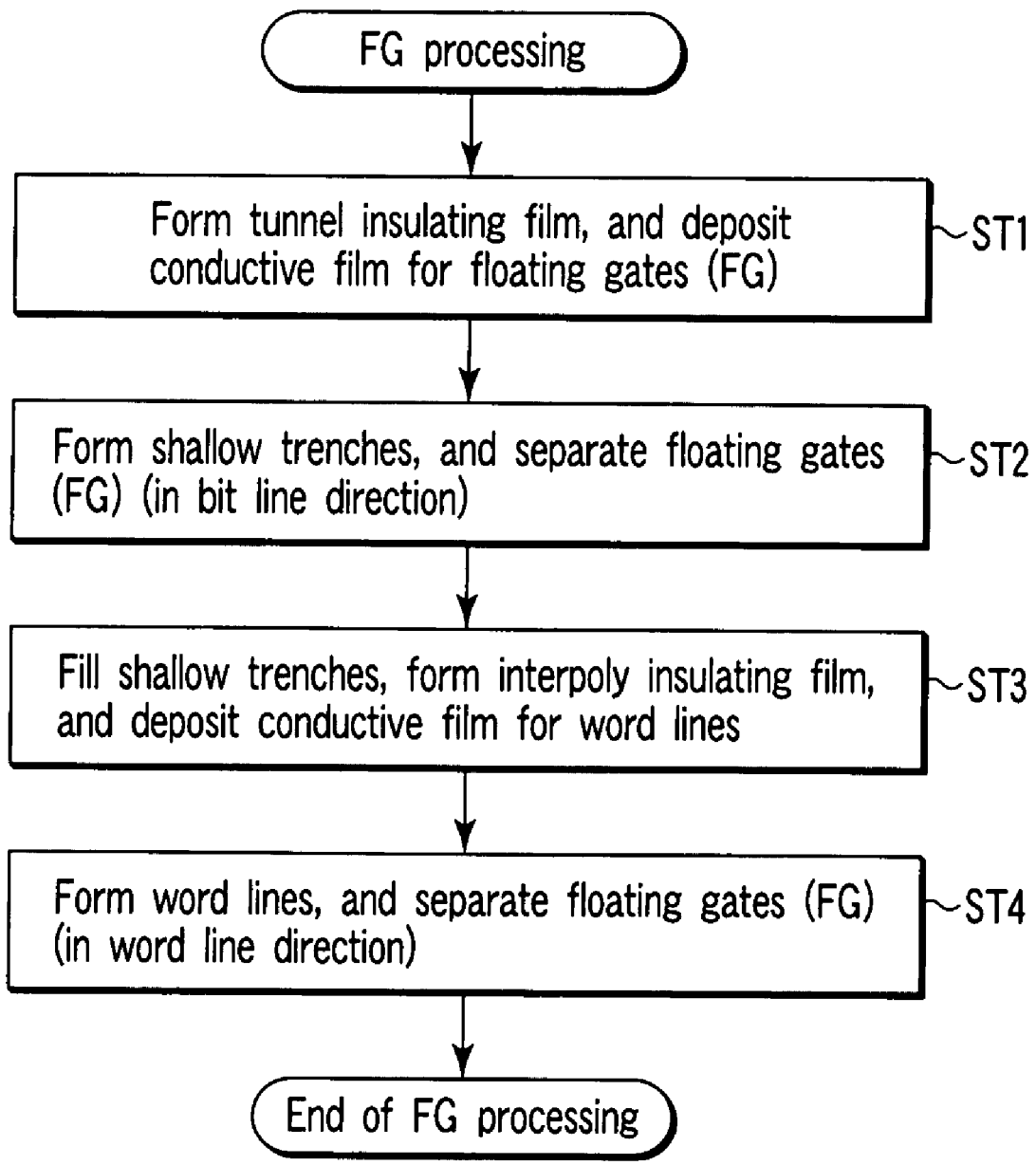
FIG. 43 is a flowchart showing the well-known sequence from shallow trench isolation formation to word line formation.
Figure 44:
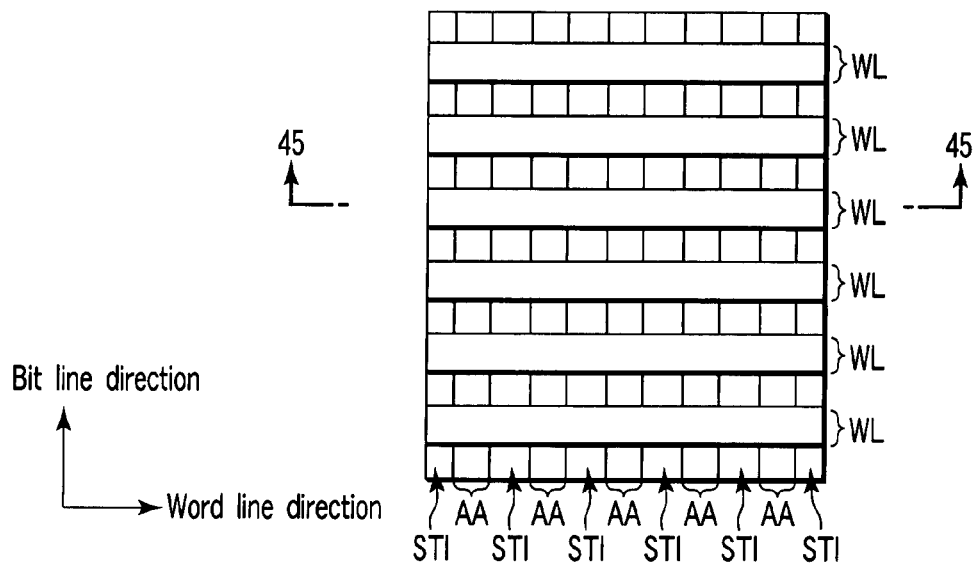
FIG. 44 is a plan view of a memory cell array formed following the procedure shown in FIG. 43.
Figure 45A:
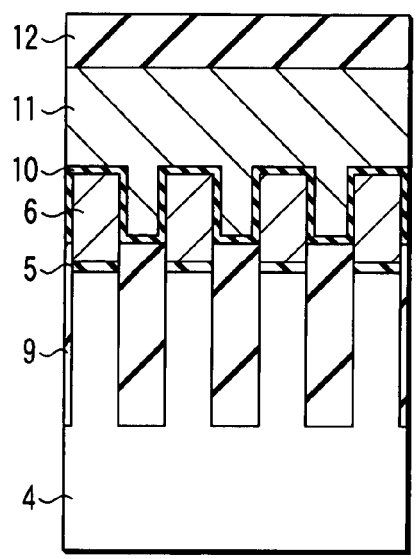
FIG. 45A is a sectional view taken along a line 45-45 in FIG. 44.
Figure 45B:
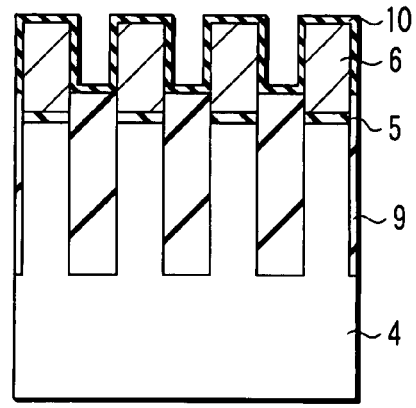
FIGS. 45B and 45C are sectional views showing the process of forming the section taken along the line 45-45 in FIG. 44.
Figure 45C:
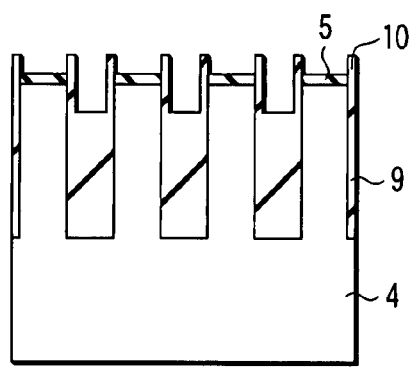
Figure 46A:
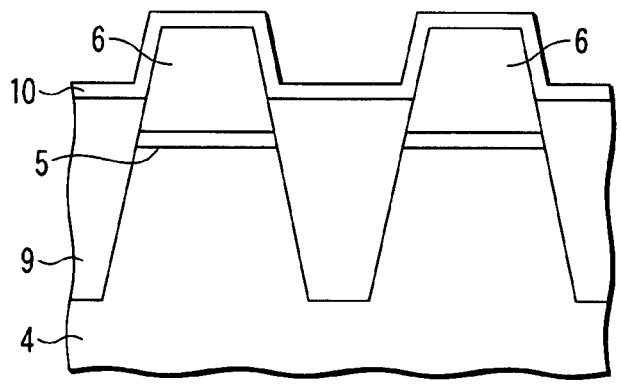
FIGS. 46A and 46B are sectional views showing the actual process of forming the sections shown in FIGS. 45B and 45C.
Figure 46B:
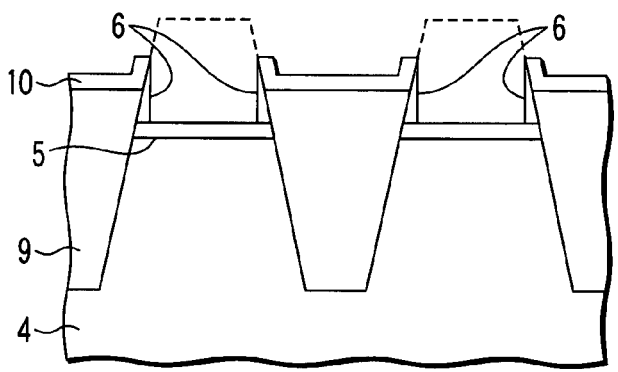
Figures 47A, 47B:
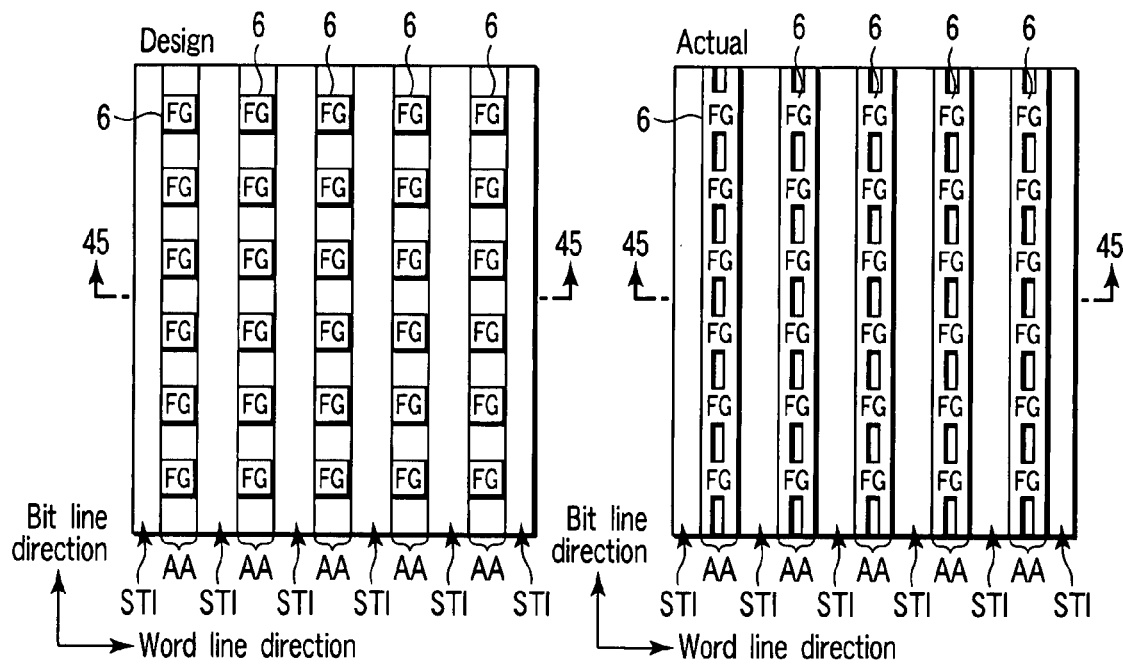
FIG. 47A is a plan view showing an ideal floating gate pattern.
FIG. 47B is a plan view showing a floating gate pattern when residues form.

As shown in FIGS. 39, 40A, and 40B, the silicon nitride films 7 and silicon oxide films 9 are used as etching masks to dry-etch the boron-doped amorphous silicon films 15', thereby removing them. Then, the silicon oxide films 9 and 14 are used as etching masks to wet-etch the silicon nitride films 7, thereby removing them and exposing the upper surfaces of the phosphorus-doped polysilicon films 6.

As shown in FIGS. 41, 42A, and 42B, an interpoly insulator 10 is deposited on the silicon oxide films 9 and 14 and phosphorus-doped polysilicon films 6. An example of the interpoly insulator 10 can be the same as in the second embodiment, i.e., a silicon oxide film. An example of the formation method can also be the same as in the second embodiment. A conductor 11 is then deposited on the silicon oxide film 10. An example of the conductor 11 can be the same as in the second embodiment, i.e., a phosphorus-doped polysilicon film. An example of the formation method can also be the same as in the second embodiment. Subsequently, the silicon oxide film 10 is used as a polishing stopper to perform chemical-mechanical polishing (CMP) on the phosphorus-doped polysilicon film 11, thereby burying the phosphorus-doped polysilicon film 11 in spaces between the patterns formed by alternately arranging the silicon oxide films 9 and 14. This forms word lines WL without using any word line mask patterns, unlike in the second and third embodiments.

The above steps form a memory cell array of a stacked gate NAND flash memory.

Similar to the first to third embodiments, the fourth embodiment also separates the phosphorus-doped polysilicon film 6 as the material of floating gates along the word line direction before forming the shallow trenches ST that taper the silicon oxide films 9. As in the first to third embodiments, therefore, the phosphorus-doped polysilicon films 6 do not remain in hidden portions formed by the taper.

Also, similar to the third embodiment, the fourth embodiment exposes the side surfaces of the conductor films 6 serving as floating gates by lowering the upper surfaces of the insulating films (STI) 9 to the middle of the side surfaces of the conductor films 6. As in the third embodiment, therefore, it is possible to make the capacitance between the floating gate and control gate (word line) larger than that in the second embodiment. In addition, similar to the third embodiment, the floating gates 6 in the word line direction sandwich the conductor films 11. This makes it possible to decrease the capacitance between floating gates adjacent to each other along the word line direction, compared to the second embodiment.

Furthermore, the fourth embodiment forms word lines in self-alignment with the conductor films 6 serving as floating gates formed before the formation of the shallow trenches ST. This eliminates capacitance variations caused by misalignment of lithography between the floating gates and control gates (word lines), compared to the first to third embodiments. The manufacturing cost can also be reduced compared to the first to third embodiments, because no lithography step of forming word lines is necessary.

Fifth Embodiment

The fifth embodiment is an example of a semiconductor integrated circuit device having a nonvolatile semiconductor memory manufactured by the manufacturing methods according to the above embodiments.

Figure 48:
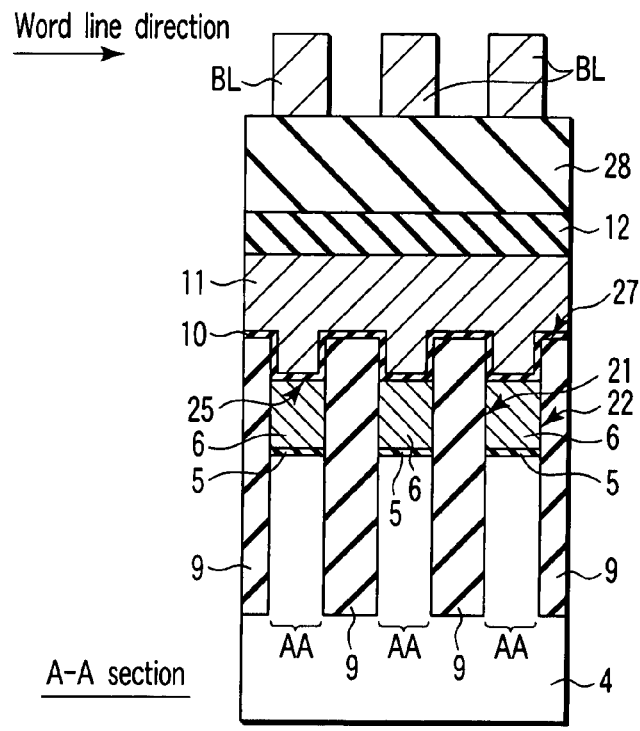
FIGS. 48 and 49 are sectional views showing an example of a semiconductor integrated circuit device according to the fifth embodiment of the present invention.
Figure 49:
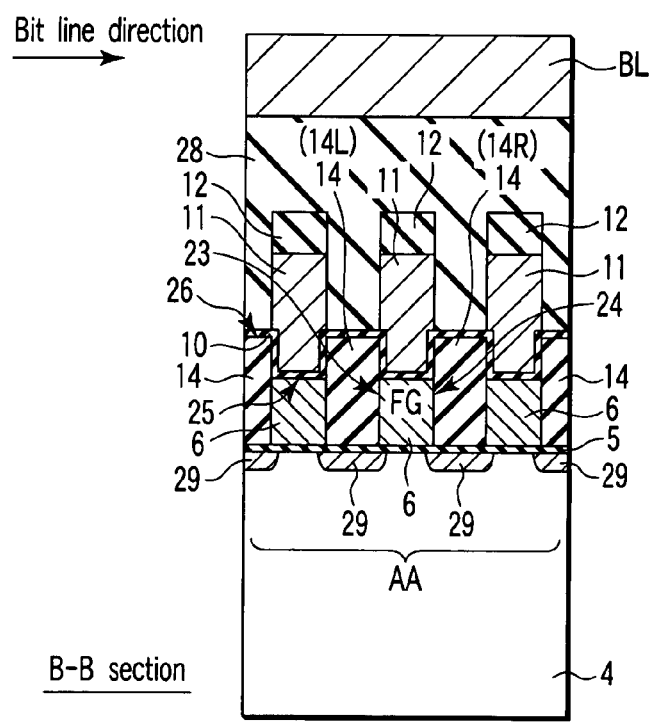

FIGS. 48 and 49 are sectional views showing an example of the semiconductor integrated circuit device according to the fifth embodiment of the present invention. FIG. 48 is a sectional view taken along the word line direction, and corresponds to the section shown in, e.g., FIG. 21A. FIG. 49 is a sectional view taken along the bit line direction, and corresponds to the section shown in, e.g., FIG. 21B. Note that FIGS. 48 and 49 illustrate sections when bit lines are formed.

FIGS. 50, 51, and 52 are perspective views showing the example of the semiconductor integrated circuit device according to the fifth embodiment of the present invention. FIG. 50 shows the state in which insulating films 7 as cap layers are removed from the upper surfaces of conductor films 6 as floating gates, and corresponds to a perspective view showing the step illustrated in, e.g., FIGS. 14, 15A, and 15B. FIG. 51 is a perspective view when an inter-gate insulating film (interpoly insulator) 10 is formed on the structure shown in FIG. 50. FIG. 52 is a perspective view when word lines are formed.

As shown in FIGS. 48 to 52, the surface of a semiconductor substrate 4 has element isolation regions 9 extending in a first direction, and element regions AA defined by the element isolation regions 9. In this embodiment, the semiconductor substrate 4 is a p-type silicon substrate (or a p-type well). Also, in this embodiment, the element isolation regions 9 are shallow trench isolations obtained by burying an insulator in shallow trenches, and the first direction is the bit line direction. The element regions AA are portions where the sources, drains, and channels of memory cell transistors and block selection transistors are formed. In this embodiment, the element regions AA extend in the first direction (bit line direction) along the element isolation regions. Gate insulating films 5 are formed on the element regions AA. Since this embodiment assumes a NAND flash memory, the gate insulating film 5 is a tunnel insulating film, and an example is a silicon oxide film. Charge storage layers 6 are formed on the gate insulating films 5. Since this embodiment assumes a stacked gate memory cell transistor, the charge storage layer 6 is a floating gate. Side surfaces 21 and 22 of the charge storage layer 6, which extend along the element isolation region 9 are in contact with it. Insulating films 14 that separate the charge storage layers 6 along the first direction (bit line direction) are formed above the element regions AA. In this embodiment, the insulating films 14 are silicon oxide films, and formed on the gate insulating films 5 formed on the element regions AA. Note that the gate insulating films 5 below the insulating films 14 may also be omitted. Each charge storage layer 6 (e.g., FG in the drawing) has two side surfaces 23 and 24 that intersect the side surfaces extending along the element isolation region 9. One insulating film 14 (14L) is in contact with the side surface 23, and another insulating film 14 (14R) is in contact with the side surface 24.

In this embodiment, the position of an upper surface 25 of the charge storage layer 6 is lower than that of an upper surface 26 of the insulating film 14 and that of an upper surface 27 of the element isolation region 9.

An inter-gate insulating film (interpoly insulator) 10 is formed on the insulating films 14, charge storage layers 6, and element isolation regions 9. In this embodiment, the inter-gate insulating film 10 is made of silicon oxide, and formed on the entire surface of the structure shown in FIG. 50.

Control gates (word lines) 11 are formed on the inter-gate insulating film 10. In this embodiment, the control gates run in a second direction (the word line direction) perpendicular to the first direction (bit line direction). The control gates 11 oppose the charge storage layers 6 via the inter-gate insulating film 10. Although insulating films 12 as cap layers are formed on the control gates 11 in this embodiment, the insulating films 12 may also be omitted. An interlayer dielectric film 28 is formed on the inter-gate insulating films 10 and control gates 11 (in this embodiment, the insulating films 12). Bit lines BL are formed on the interlayer dielectric film 28. Also, in the element regions AA below the insulting films 14, diffusion layers 29 having a conductivity type (in this embodiment, an n-type) opposite to that of the semiconductor substrate 4 are formed. The diffusion layers 29 function as the source/drain regions of memory cell transistors. Note that the formation step of the diffusion layers 29 is omitted in the first to fourth embodiments. In the second embodiment, for example, after the conductor film 6 is patterned in the step shown in FIGS. 4, 5A, and 5B, the diffusion layers 29 can be formed by ion-implanting an n-type impurity into the substrate 4 by using the insulating films 7 as masks.

FIGS. 53A to 53C are views for explaining the advantage obtained from the semiconductor integrated circuit device according to the fifth embodiment. FIGS. 54A to 54C are views showing a semiconductor integrated circuit device according to a reference example of the fifth embodiment.

First, the problem of the present NAND flash memories will be explained below by using the reference example.

FIGS. 54A to 54C illustrate the sections in the bit line direction of memory cell transistors of NAND flash memories.

The degree of micropatterning of NAND flash memories is increasing yearly to meet demands for increasing the storage capacity. Especially in the section along the bit line direction, the gate length of memory cell transistors along the bit line direction is more and more decreased. This is so in order to shorten the array of memory cell transistors in the bit line direction by decreasing the gate length. In accordance with this tendency, the sectional shape of the control gate (word line) 11 is vertically elongate in order to suppress the increase in resistance value of the control gate 11. That is, the sectional shape of a stacked gate structure obtained by stacking the charge storage layers (floating gates) 6 and control gates (word lines) 11 is vertically elongate. FIGS. 54A to 54C illustrate this tendency.

The aspect ratio is an index representing the sectional shape of a stacked gate structure. The aspect ratio in this specification is (height H/gate length L). FIG. 54A shows a memory cell transistor having a stacked gate structure with an aspect ratio of 3/2=1.5. FIG. 54B shows a memory cell transistor having a stacked gate structure with an aspect ratio of 3/1=3. FIG. 54C shows a memory cell transistor having a stacked gate structure with an aspect ratio of 3/0.5=6. As the aspect ratio rises, the stacked gate structure is vertically elongate. The problem of the vertically long stacked gate structure is the difficulty of processing of the stacked gate structure. For example, in the vertically long stacked gate structure, a photoresist serving as an etching mask easily falls during etching.

By contrast, the fifth embodiment does not process the control gates 11 and charge storage layers 6 at once, but processes the control gates 11 after processing the charge storage layers 6. In addition, after processing the charge storage layers 6, the fifth embodiment forms the element isolation regions 9 along the side surfaces 21 and 22 of the charge storage layers 6, and forms the insulating films 14 along the side surfaces 23 and 24 of the charge storage layers 6. As shown in FIGS. 53A to 53C, therefore, even if the aspect ratio of the stacked gate structure is high, actual processing need only be performed up to the element isolation regions 9 and insulting films 14, or up to the inter-gate insulating film 10 formed on the element isolation regions 9 and insulating films 14. That is, the structure to be actually processed has a low aspect ratio. Similar to FIG. 54A, FIG. 53A shows a memory cell transistor having a stacked gate structure with an aspect ratio of 3/2=1.5. However, the aspect ratio (height H') of the structure to be actually processed is less than 1.5. Assume, for example, that the height H' is ⅓ the height H, the aspect ratio is 1/2=0.5. Likewise, FIG. 53B shows a memory cell transistor having a stacked gate structure with an aspect ratio of 3/1=3, similar to FIG. 54B. Assume that the height H' is ⅓ the height H, the aspect ratio is 1/1=1. Similar to FIG. 54C, FIG. 53C shows a memory cell transistor having a stacked gate structure with an aspect ratio of 3/0.5=6. Assume that the height H' is ⅓ the height H, the aspect ratio is 1/0.5=2.

As described above, the fifth embodiment processes the control gates 11 after processing the charge storage layers 6. In addition, the fifth embodiment forms the element isolation regions 9 along the side surfaces 21 and 22 of the charge storage layers 6, and forms the insulating films 14 along the side surfaces of the charge storage layers 6. Consequently, it is possible to obtain the advantage that the aspect ratio of the portion to be processed can be lowered, and this facilitates processing of the stacked gate structure.

In addition, the fifth embodiment leaves the inter-gate insulating film 10 behind on the insulating films 14 even after forming the control gates 11. This structure makes it possible to obtain the advantage that when a low-resistance metal is used as the control gates 11 in order to decrease the resistance value of the control gates 11, diffusion of this metal to the gate insulating films (in this embodiment, the tunnel insulating films) 5 can be prevented.

Examples of the low-resistance metal are cobalt (Co), nickel (Ni), titanium (Ti), Co silicide, Ni silicide, Ti silicide, tungsten (W), aluminum (Al), and copper (Cu).

The structure of the fifth embodiment is advantageous when any of these metals is used as the control gates 11.

Sixth Embodiment

Similar to the fifth embodiment, the sixth embodiment is an example of a semiconductor integrated circuit device.

Figure 55:
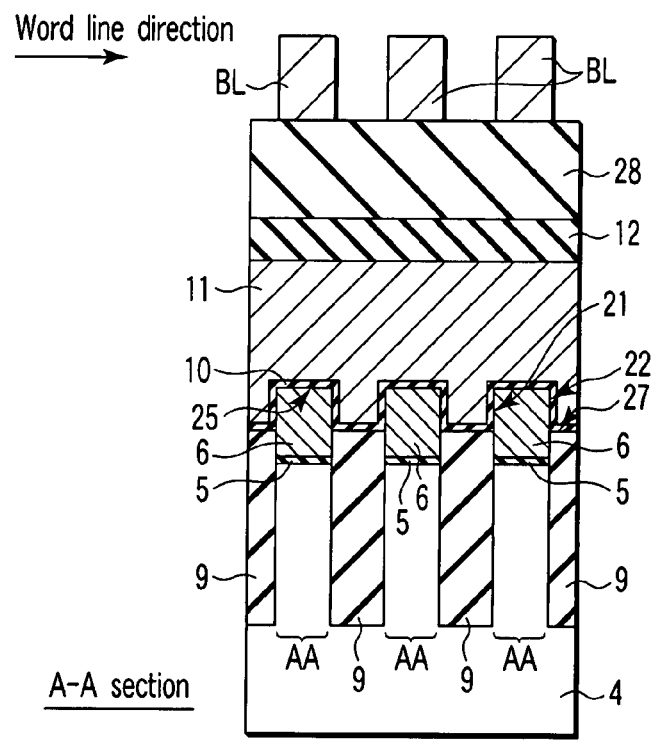
FIGS. 55 and 56 are sectional views showing an example of a semiconductor integrated circuit device according to the sixth embodiment of the present invention.
Figure 56:
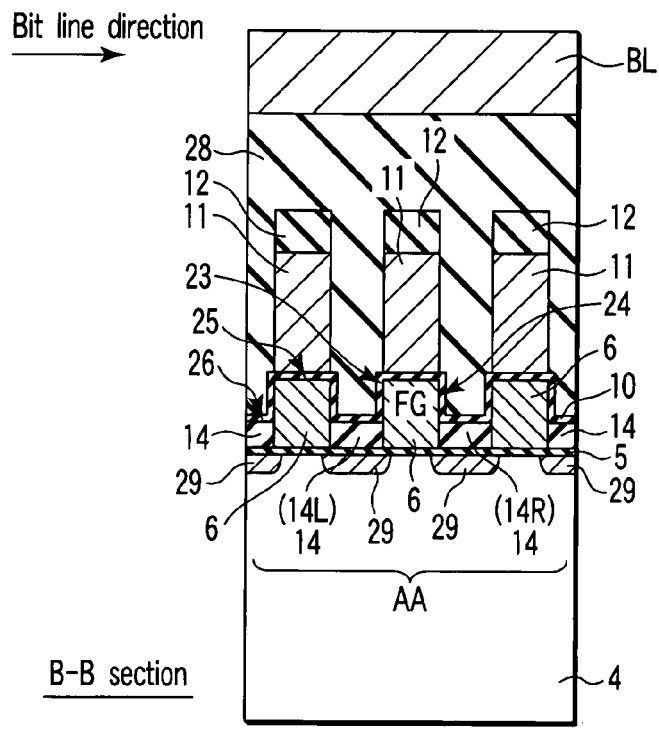

FIGS. 55 and 56 are sectional views showing the example of the semiconductor integrated circuit device according to the sixth embodiment of the present invention. FIG. 55 is a sectional view taken along the word line direction, and corresponds to the section shown in, e.g., FIG. 26A. FIG. 56 is a sectional view taken along the bit line direction, and corresponds to the section shown in, e.g., FIG. 26B. Note that FIGS. 55 and 56 illustrate the sections when bit lines are formed.

Figure 57:
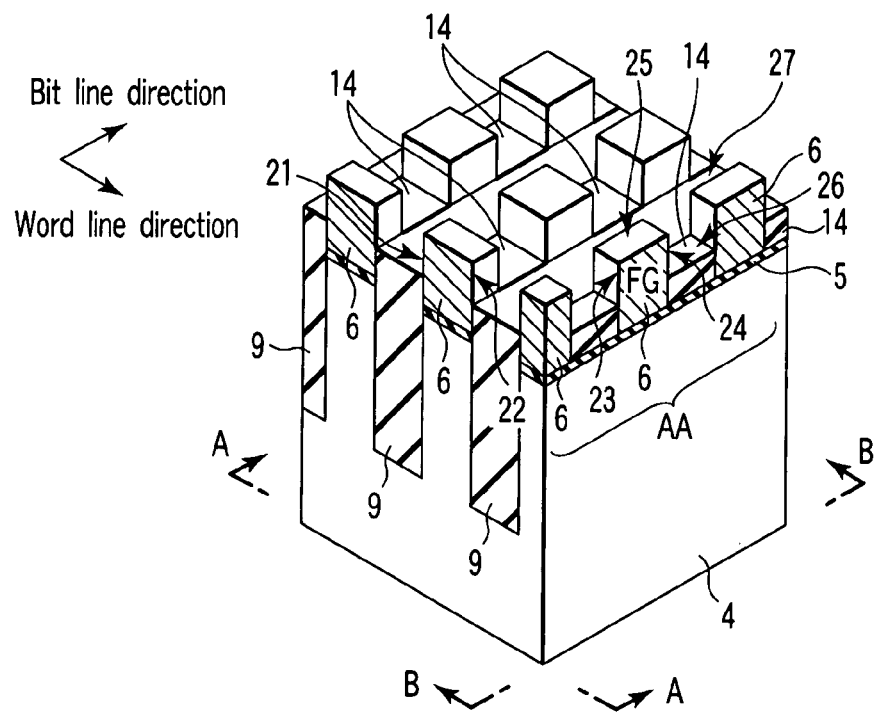
FIGS. 57 to 59 are perspective views showing the example of the semiconductor integrated circuit device according to the sixth embodiment of the present invention.
Figure 58:
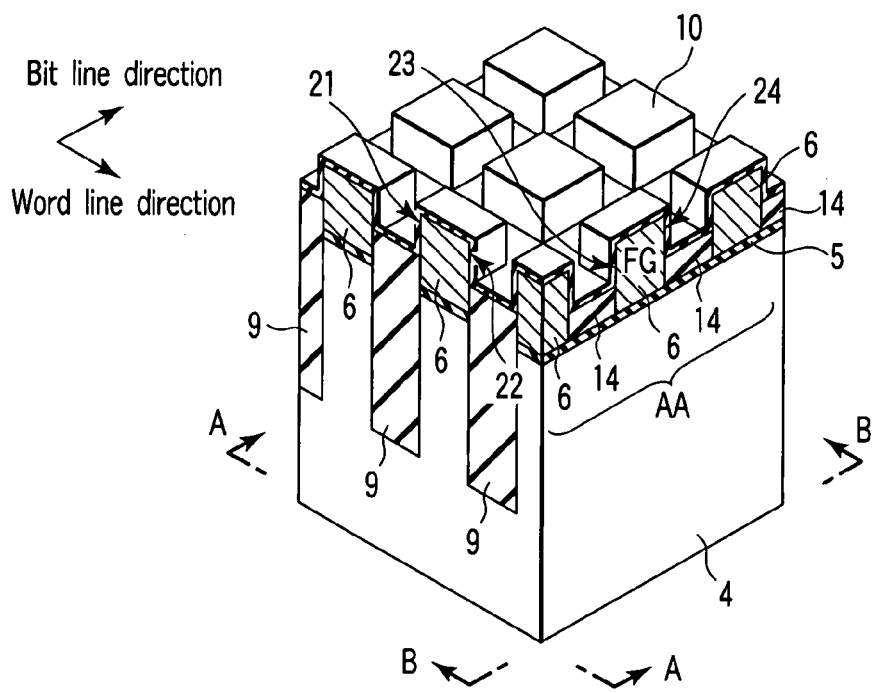
Figure 59:
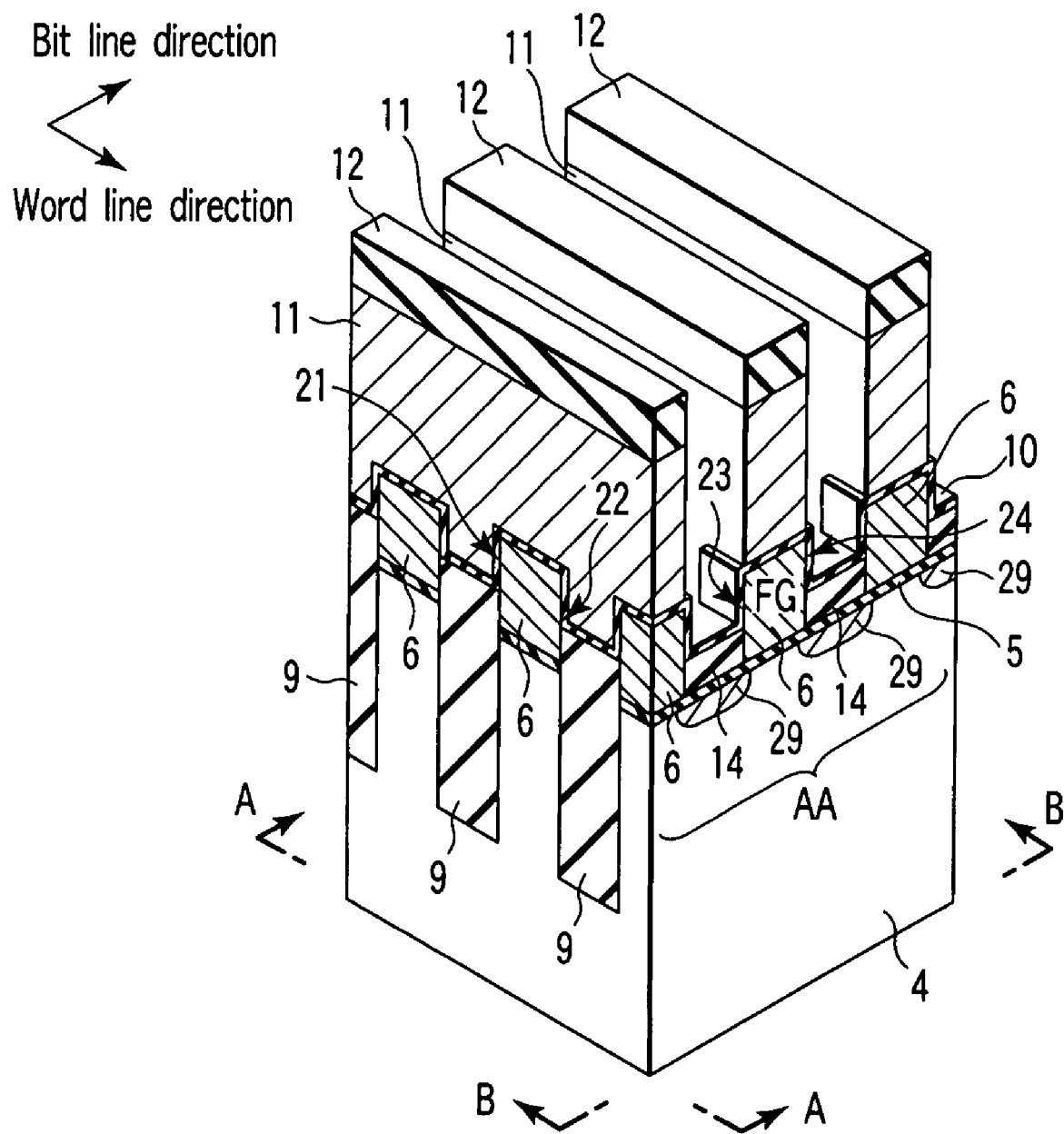

FIGS. 57, 58, and 59 are perspective views showing the example of the semiconductor integrated circuit device according to the sixth embodiment of the present invention. FIG. 57 shows the state in which insulating films 7 as cap layers are removed from the upper surfaces of conductor layers 6 as floating gates, and corresponds to a perspective view showing the step illustrated in, e.g., FIGS. 23A and 23B. FIG. 58 is a perspective view when an inter-gate insulating film (interpoly insulator) 10 is formed on the structure shown in FIG. 57. FIG. 59 is a perspective view when word lines are formed.

The sixth embodiment differs from the fifth embodiment in that the position of an upper surface 25 of the charge storage layer 6 is higher than that of an upper surface 26 of an insulating film 14 as shown in FIG. 56, and higher than that of an upper surface 27 of an element isolation region 9 as shown in FIG. 55. The rest is the same as in the fifth embodiment, so an explanation thereof will be omitted.

As in the fifth embodiment, the sixth embodiment also processes control gates 11 after processing the charge storage layers 6. In addition, after processing the charge storage layers 6, the sixth embodiment forms the element isolation regions 9 along side surfaces 21 and 22 of the charge storage layers 6, and forms the insulating films 14 along side surfaces 23 and 24 of the charge storage layers 6. Accordingly, the sixth embodiment can also lower the aspect ratio of the portion to be processed. This makes it possible to obtain the advantage that the stacked gate structure is readily processed.

Furthermore, similar to the fifth embodiment, the sixth embodiment also leaves the inter-gate insulating film 10 behind on the insulating films 14 after forming the control gates 11. When a low-resistance metal is used as the control gates 11, therefore, it is possible to prevent diffusion of this metal to gate insulating films (in this embodiment, the tunnel insulating films) 5.

The structure of the sixth embodiment is particularly advantageous when any of cobalt (Co), nickel (Ni), titanium (Ti), Co silicide, Ni silicide, Ti silicide, tungsten (W), aluminum (Al), and copper (Cu) is used as the control gates 11.

Seventh Embodiment

Similar to the fifth and sixth embodiments, the seventh embodiment is an example of a semiconductor integrated circuit device.

FIGS. 60 and 61 are sectional views showing the example of the semiconductor integrated circuit device according to the seventh embodiment of the present invention. FIG. 60 is a sectional view taken along the word line direction, and corresponds to the section shown in, e.g., FIG. 42A. FIG. 61 is a sectional view taken along the bit line direction, and corresponds to the section shown in, e.g., FIG. 42B. Note that FIGS. 60 and 61 illustrate the sections when bit lines are formed.

Figure 62:
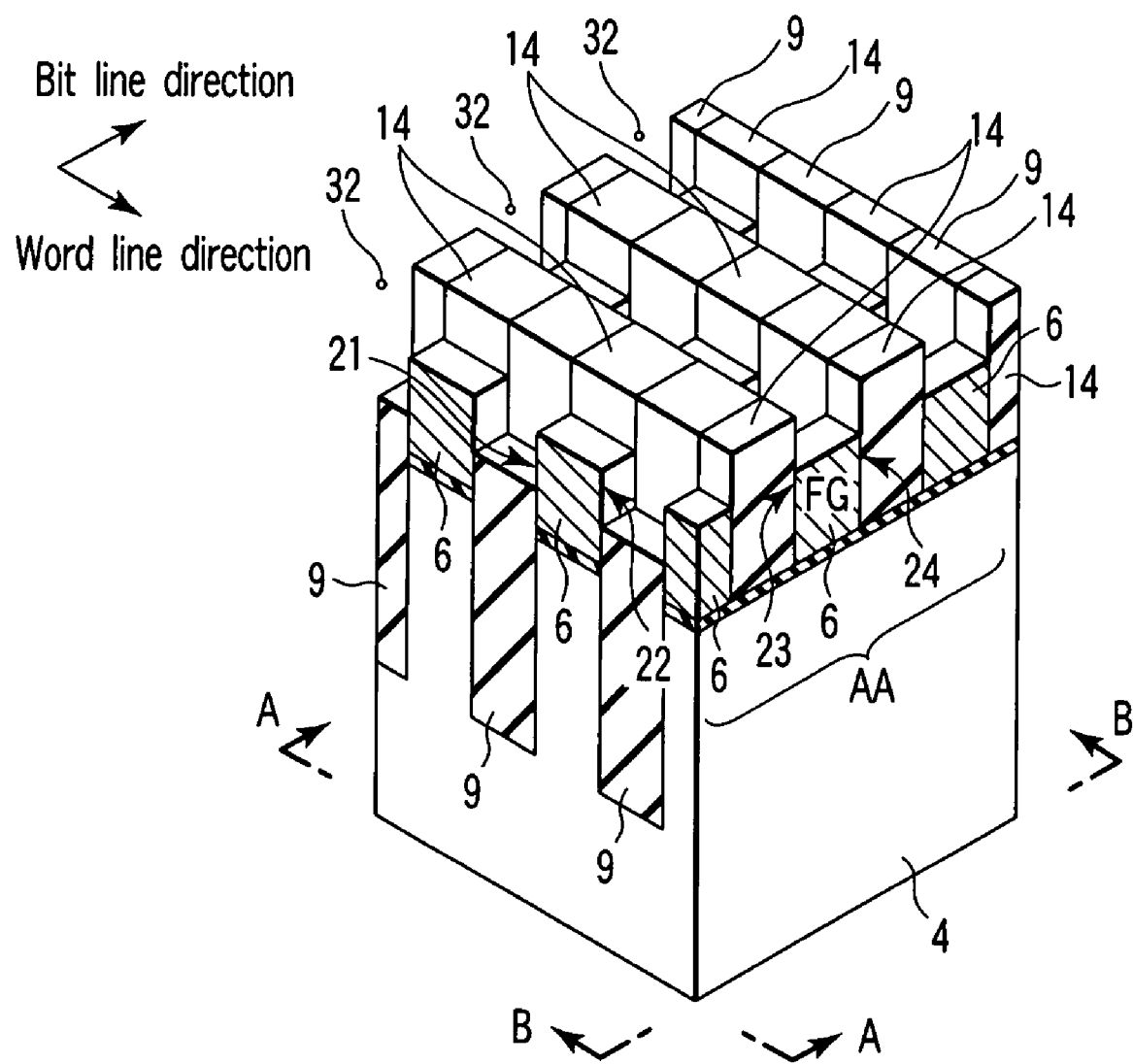
FIGS. 62 to 64 are perspective views showing the example of the semiconductor integrated circuit device according to the seventh embodiment of the present invention.
Figure 63:
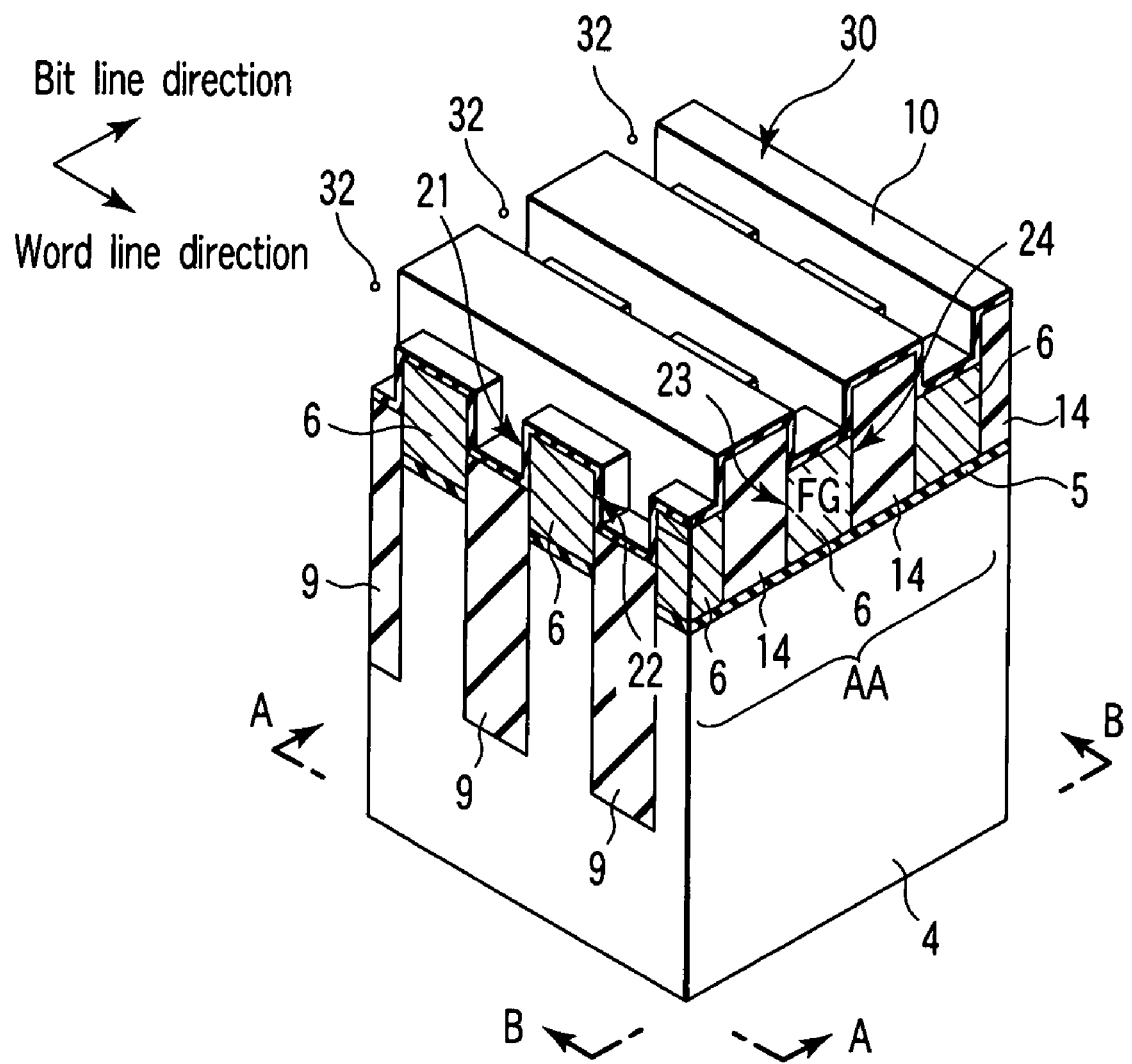
Figure 64:
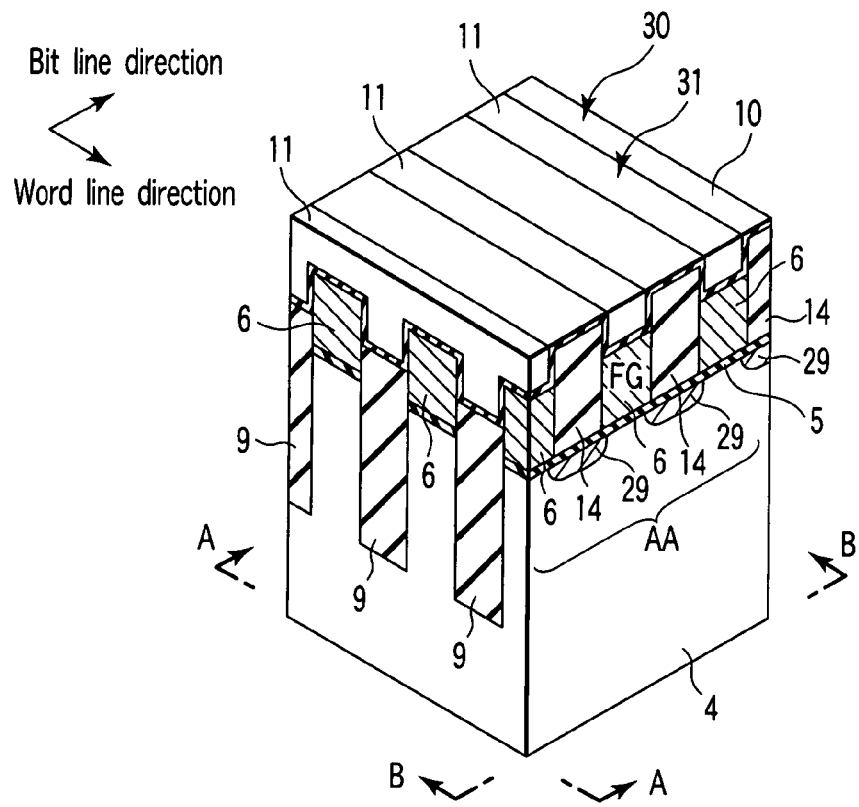

FIGS. 62, 63, and 64 are perspective views showing the example of the semiconductor integrated circuit device according to the seventh embodiment of the present invention. FIG. 62 shows the state in which insulating films 7 as cap layers are removed from the upper surfaces of conductor films 6 as floating gates, and corresponds to a perspective view showing the step illustrated in, e.g., FIGS. 39, 40A, and 40B. FIG. 63 is a perspective view when an inter-gate insulating film (interpoly insulator) 10 is formed on the structure shown in FIG. 62. FIG. 64 is a perspective view when word lines are formed.

The seventh embodiment differs from the fifth embodiment in that the position of an upper surface 25 of the charge storage layer 6 is lower than that of an upper surface 26 of an insulating film 14 as shown in FIG. 61, and higher than that of an upper surface 27 of an element isolation region 9 below a control gate 11 as shown in FIG. 60.

The seventh embodiment forms the control gates 11 by burying them in trenches 32 formed in the insulating films 14 and element isolation regions 9 shown in FIGS. 62 and 63, and hence obviates the need for a lithography step of forming the control gates 11. This is the same as explained in the fourth embodiment.

In addition, in this embodiment as well shown in FIGS. 62 to 64, the position of upper surfaces 30 of the inter-gate insulating film 10 on the insulating films 14 and element isolation regions 9 is the same as that of upper surfaces 31 of the control gates 11.

This arrangement can achieve the following advantage.

Figures 65A, 65B, 65C:
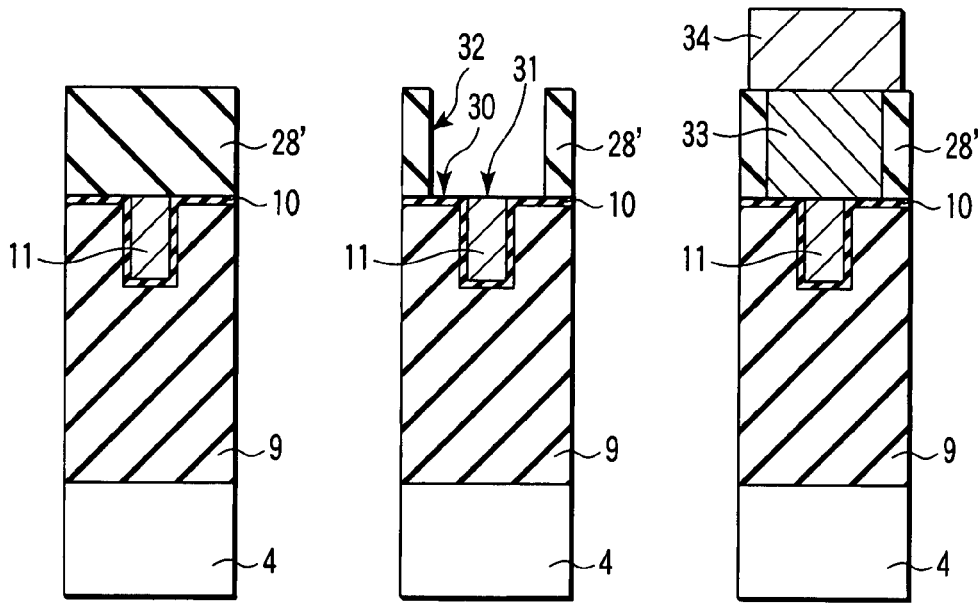
FIGS. 65A to 65C are views for explaining the advantage obtained from the semiconductor integrated circuit device according to the seventh embodiment of the present invention.

FIGS. 65A to 65C are views for explaining the advantage obtained from the semiconductor integrated circuit device according to the seventh embodiment. FIGS. 66A to 66C are views showing a semiconductor integrated circuit device according to a reference example of the seventh embodiment.

First, the problem of the present NAND flash memories will be explained by using the reference example.

As shown in FIGS. 66A to 66C, when connecting an electrical interconnection to the control gate 11, the contact hole 32 and a conductive contact (plug) 33 are formed in an interlayer dielectric film 28'. In this reference example, the interlayer dielectric film 28' is formed on the element isolation region 9.

When the interlayer dielectric film 28' and element isolation region 9 are made of the same insulator, e.g., silicon oxide, etching sometimes reaches the element isolation region 9 from the interlayer dielectric film 28' when forming the contact hole 32 shown in FIG. 66B. This is so because etching largely varies depending on the processing conditions. The amount of etching to the element isolation region 9 readily changes depending on the position in a chip or the position on a wafer, or readily changes from one wafer to another. This varies the contact area between the control gate 11 and conductive contact 33, and also varies the depth of the contact hole 32, i.e., the size of the conductive contact 33. These variations have influence on the electrical characteristics of the control gate 11. That is, these variations change the resistance value obtained via the conductive contact 33 and an interconnection 34 from a circuit that controls the control gate 11 to the control gate 11, and change the interconnection capacitance. In this example, the control gate 11 is a word line. If the resistance value and interconnection capacitance change, therefore, the CR time constant of the word line varies.

The variation in CR time constant of the word line makes it difficult to increase the speed of, e.g., read and write operations. This is so because, e.g., the times of application of a read voltage and write voltage to word lines must fit a word line having the worst electrical characteristics.

Also, the number of values of multilevel data that a memory cell stores is recently increasing to 3, 4, 8, 16, 32, . . . . As the number of values of multilevel data thus increases, a read voltage and verification read voltage to be applied to a word line are set more finely. For example, the number of setting levels of each of the read voltage and verification read voltage is "7" if the number of values is 8, "15" if the number of values is 16, and "31" if the number of values is 32. It is difficult to set, e.g., "7×2=14", "15×2=30", or "31×2=62" voltages in a certain predetermined voltage range unless the variation in CR time constant of the word line is small.

Note that in this specification, a multilevel nonvolatile semiconductor memory means a memory that stores data having 3 values (1.5 bits) or more in one memory cell transistor.

By contrast, as shown in the sectional views of FIGS. 65A to 65C, the seventh embodiment forms the inter-gate insulating film 10 on the element isolation region 9, and forms the interlayer dielectric film 28' on the control gate 11 and inter-gate insulating film 10. The interlayer dielectric film 28' has the contact hole 32 that exposes the upper surface 31 of the control gate 11 and the upper surface 30 of the inter-gate insulating film 10. In addition, the interlayer dielectric film 28' is made of an insulator different from the inter-gate insulating film 10.

This arrangement allows the inter-gate insulating film 10 to be used as an etching stopper when forming the contact hole 32 by etching the interlayer dielectric film 28'. The etching stops at the inter-gate insulating film 10 and hence does not reach the element isolation region 9. Consequently, as shown in FIG. 65B, the area of the control gate 11 exposed from the contact hole 32 has a predetermined size. When the conductive contact 33 is formed in the contact hole 32 like this, the resistance value obtained via the conductive contact 33 and an interconnection 34 from a circuit that controls the control gate 11 to the control gate 11 hardly changes, and the interconnection capacitance also rarely changes, when compared to the case that there is no inter-gate insulating film 10.

In this embodiment, the control gate 11 is a word line. In this embodiment, therefore, the CR time constant of the word line hardly varies. Since the CR time constant of the word line thus rarely varies, this embodiment is advantageous to raise the operating speed of a nonvolatile semiconductor memory, e.g., a NAND flash memory. In addition, since the CR time constant of the word line hardly varies, many voltages can be easily set for the word line. Accordingly, this embodiment is also useful for a multilevel NAND flash memory.

FIG. 67 shows an application example of the conductive contact 33 shown in FIG. 65C.

As shown in FIG. 67, the conductive contacts 33 shown in FIG. 65C can be used as conductive contacts that connect the interconnections 34 from the outputs of an address decoder, in this embodiment, a row decoder to the control gates 11, in this embodiment, word lines WL arranged in the memory cell array.

Note that similar to the fifth and sixth embodiments, the seventh embodiment also leaves the inter-gate insulating film 10 behind on the insulating films 14 after forming the control gates 11. When a low-resistance metal is used as the control gates 11, therefore, it is possible to prevent diffusion of this metal to gate insulating films (in this embodiment, tunnel insulating films) 5.

The structure of the seventh embodiment is particularly advantageous when any of cobalt (Co), nickel (Ni), titanium (Ti), Co silicide, Ni silicide, Ti silicide, tungsten (W), aluminum (Al), and copper (Cu) is used as the control gates 11.

Eighth Embodiment

The eighth embodiment is a modification of the sixth embodiment.

Figure 68:
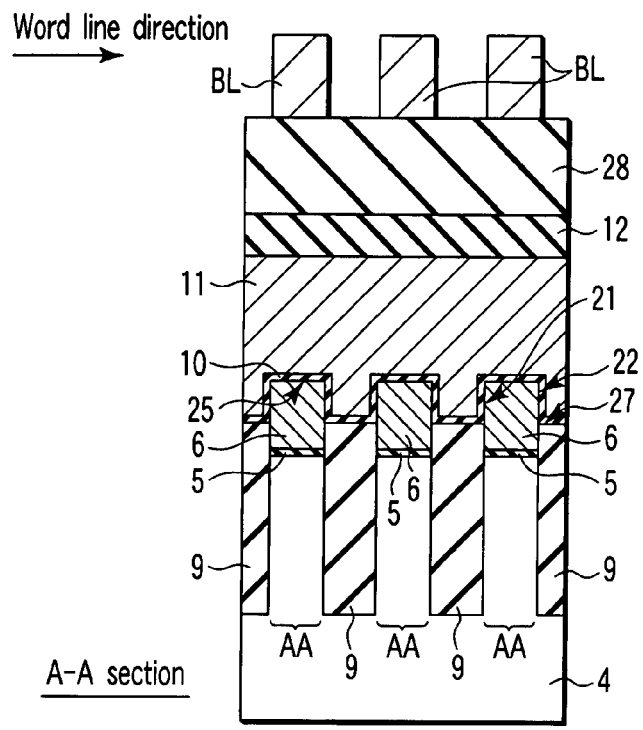
FIGS. 68 and 69 are sectional views showing an example of a semiconductor integrated circuit device according to the eighth embodiment of the present invention.
Figure 69:
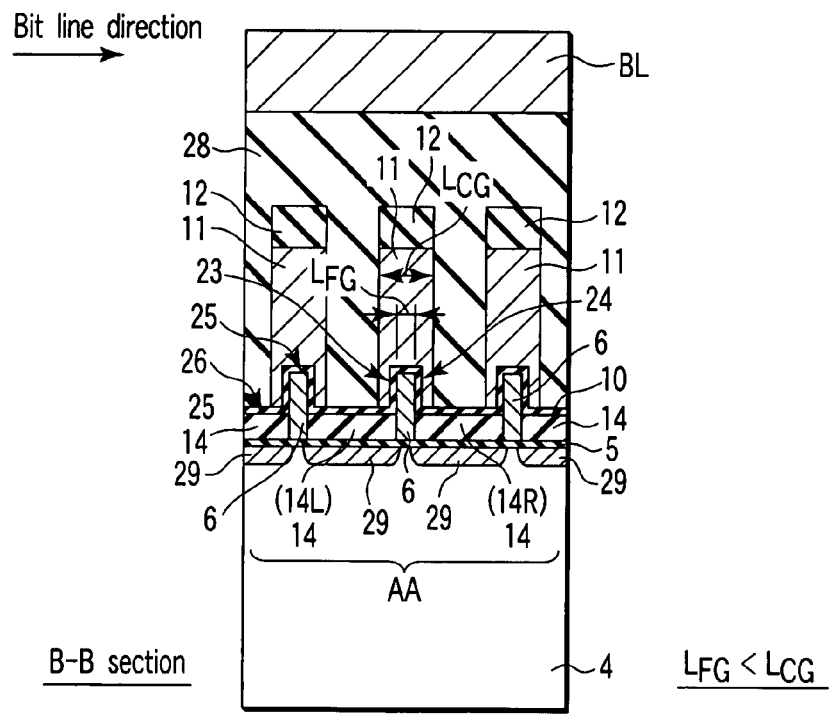

FIGS. 68 and 69 are sectional views showing an example of a semiconductor integrated circuit device according to the eighth embodiment of the present invention. FIG. 68 is a sectional view taken along the word line direction, and corresponds to the section shown in, e.g., FIG. 26A. FIG. 69 is a sectional view taken along the bit line direction, and corresponds to the section shown in, e.g., FIG. 26B. Note that FIGS. 68 and 69 illustrate the sections when bit lines are formed.

Figure 72:
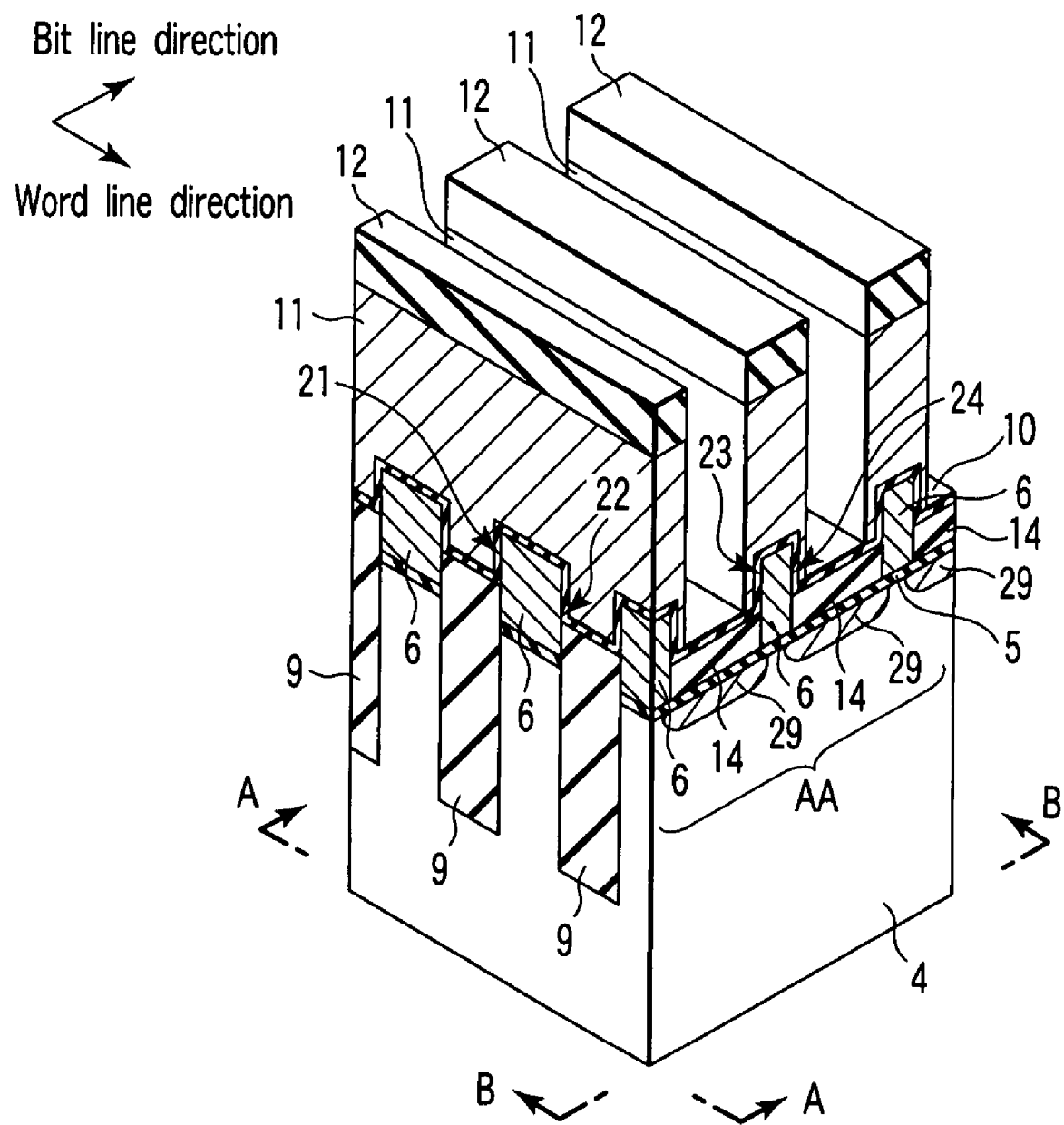

FIGS. 70, 71, and 72 are perspective views showing the example of the semiconductor integrated circuit device according to the eighth embodiment of the present invention. FIG. 70 shows the state in which insulating films 7 as cap layers are removed from the upper surfaces of conductor films 6 as floating gates, and corresponds to a perspective view showing the step illustrated in, e.g., FIGS. 23A and 23B. FIG. 71 is a perspective view when an inter-gate insulating film (interpoly insulator) 10 is formed on the structure shown in FIG. 70. FIG. 72 is a perspective view when word lines are formed.

The eighth embodiment differs from the sixth embodiment in that a length (to be referred to as a floating gate length hereinafter) $L_{FG}$ in a first direction, in this embodiment, the bit line direction, of the charge storage layer 6 is smaller than a length (to be referred to as a control gate length hereinafter) $L_{CG}$ in the first direction, in this embodiment, the bit line direction, of a control gate 11. This is shown in, e.g., FIG. 69.

One advantage of the eighth embodiment is that a coupling capacitance C1 between the charge storage layer 6 and control gate 11 can be made larger than a coupling capacitance C2 between a channel below the charge storage layer 6 and the charge storage layer 6, when compared to the sixth embodiment. That is, a capacitance coupling ratio C1/C2 can be increased.

As shown in FIGS. 70 and 71, for example, the eighth embodiment forms the inter-gate insulating film 10 on an upper surface 25 of the charge storage layer 6, on two side surfaces 21 and 22 along the first direction, in this embodiment, the bit line direction of the charge storage layer 6, and on two side surfaces 23 and 24 along a second direction, in this embodiment, the word line direction of the charge storage layer 6.

In addition, the control gate 11 opposes, via the inter-gate insulating film 10, the upper surface 25 of the charge storage layer 6, the two side surfaces 21 and 22 along the first direction (in this embodiment, the bit line direction) of the charge storage layer 6, and the two side surfaces 23 and 24 along the second direction (in this embodiment, the word line direction) of the charge storage layer 6. This makes it possible to increase the coupling capacitance C1 between the charge storage layer 6 and control gate 11, compared to the sixth embodiment in which the control gate 11 opposes the upper surface 25 and side surfaces 21 and 22 of the charge storage layer 6 via the inter-gate insulating film 10. When the capacitance coupling ratio C1/C2 is high, electric charge is readily injected into the charge storage layer 6 during data write. This is advantageous in increasing the operating speed of the write operation.

When compared to the sixth embodiment, the eighth embodiment can also achieve three advantages 1 to 3 below:

(Advantage 1) The eighth embodiment is strong against mask misalignment.

(Advantage 2) The eighth embodiment hardly suffers the proximity effect.

(Advantage 3) The eighth embodiment easily raises the channel potential.

These three advantages will be explained below in order.

(Advantage 1)

Figure 73A:
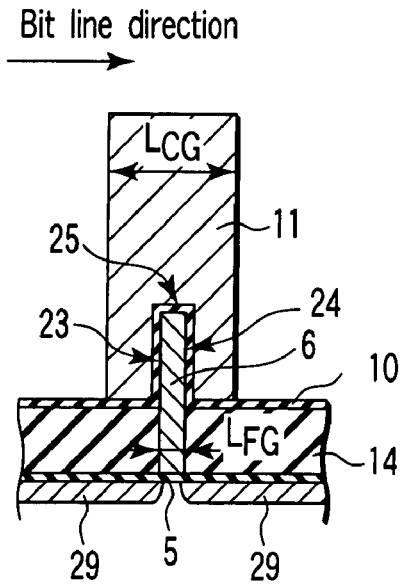
FIGS. 73A and 73B are views for explaining advantage 1 obtained from the semiconductor integrated circuit device according to the eighth embodiment of the present invention.
Figure 73B:
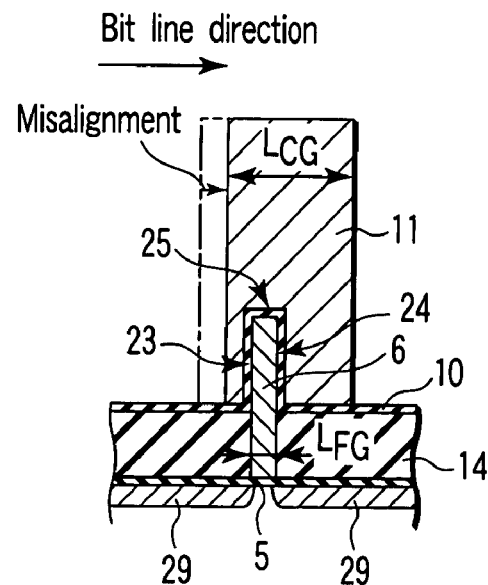
Figure 74A:
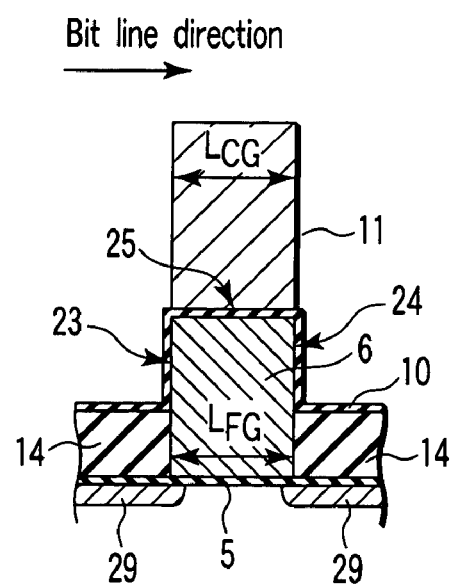
FIGS. 74A and 74B are views showing a semiconductor integrated circuit device according to a reference example.
Figure 74B:
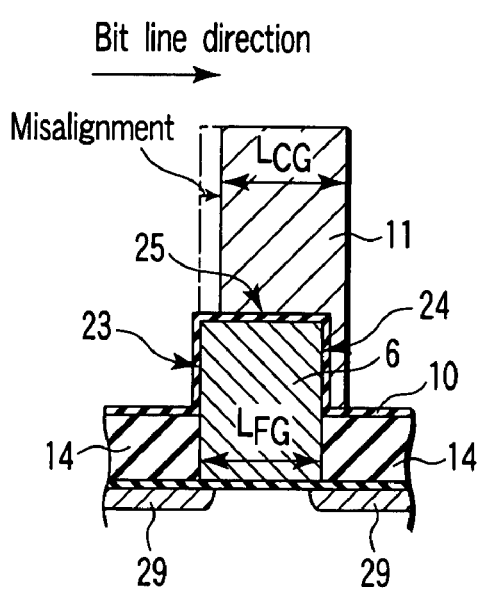

FIGS. 73A and 73B are views for explaining advantage 1 obtained from the semiconductor integrated circuit device according to the eighth embodiment. FIGS. 74A and 74B are views showing a reference example.

The reference example will be explained first.

The reference example shown in FIGS. 74A and 74B is the case that the control gate length $L_{CG}$ and floating gate length $L_{FG}$ are equal.

If mask misalignment occurs in the bit line direction in this case, as shown in FIG. 74B, the control gate 11 opposes one of the sides surfaces 23 and 24 of the charge storage layer 6 via the inter-gate insulating film 10. The difference between the states shown in FIGS. 74A and 74B is that the control gate 11 opposes only the upper surface 25 of the charge storage layer 6 or opposes one of the side surfaces 23 and 24 and the upper surface 25 of the charge storage layer 6. This means that the states shown in FIGS. 74A and 74B are different in capacitance coupling ratio C1/C2. If the capacitance coupling ratios C1/C2 are different, the capacitance coupling ratio C1/C2 changes, e.g., from one chip to another. This increases, e.g., the variation in write characteristics between the chips. This variation also makes it difficult to increase the operating speed of the write operation. This is so because the application time of a write voltage and the number of applied pulses of the write voltage must fit a memory cell transistor having the worst write characteristics.

By contrast, in the eighth embodiment as shown in FIG. 73A, the control gate 11 opposes the side surfaces 23 and 24 and upper surface 25 of the charge storage layer 6 via the inter-gate insulating film 10. As shown in FIG. 73B, therefore, even if mask misalignment occurs in the bit line direction, the capacitance coupling ratio C1/C2 remains unchanged because the control gate 11 opposes the side surfaces 23 and 24 and upper surface 25 of the charge storage layer 6 via the inter-gate insulating film 10. This makes the eighth embodiment strong against mask misalignment. For example, the variation in write characteristics between chips hardly increases. This is advantageous in increasing the operating speed of the write operation.

Note that as shown in FIG. 75, to achieve advantage 1 better, letting $L_{CG}$ be the length in the first direction (in this embodiment, the bit line direction) of the control gate 11, $t_{IGI}$ be the thickness of the inter-gate insulating film 10 on the side surfaces 23 and 24 along the second direction (in this embodiment, the word line direction) of the charge storage layer 6, and $M_A$ be an alignment margin in the first direction when processing the control gate 11, the length $L_{FG}$ in the first direction of the charge storage layer 6 is preferably set to have the relationship indicated by $L_{FG} < L_{CG} - 2M_A - 2t_{IGI}$.

It is still possible, without setting the above relationship, to obtain the advantage that the variation in write characteristics between chips decreases. However, setting the above relationship further decreases the variation in write characteristics between chips.

(Advantage 2)

Figure 77:
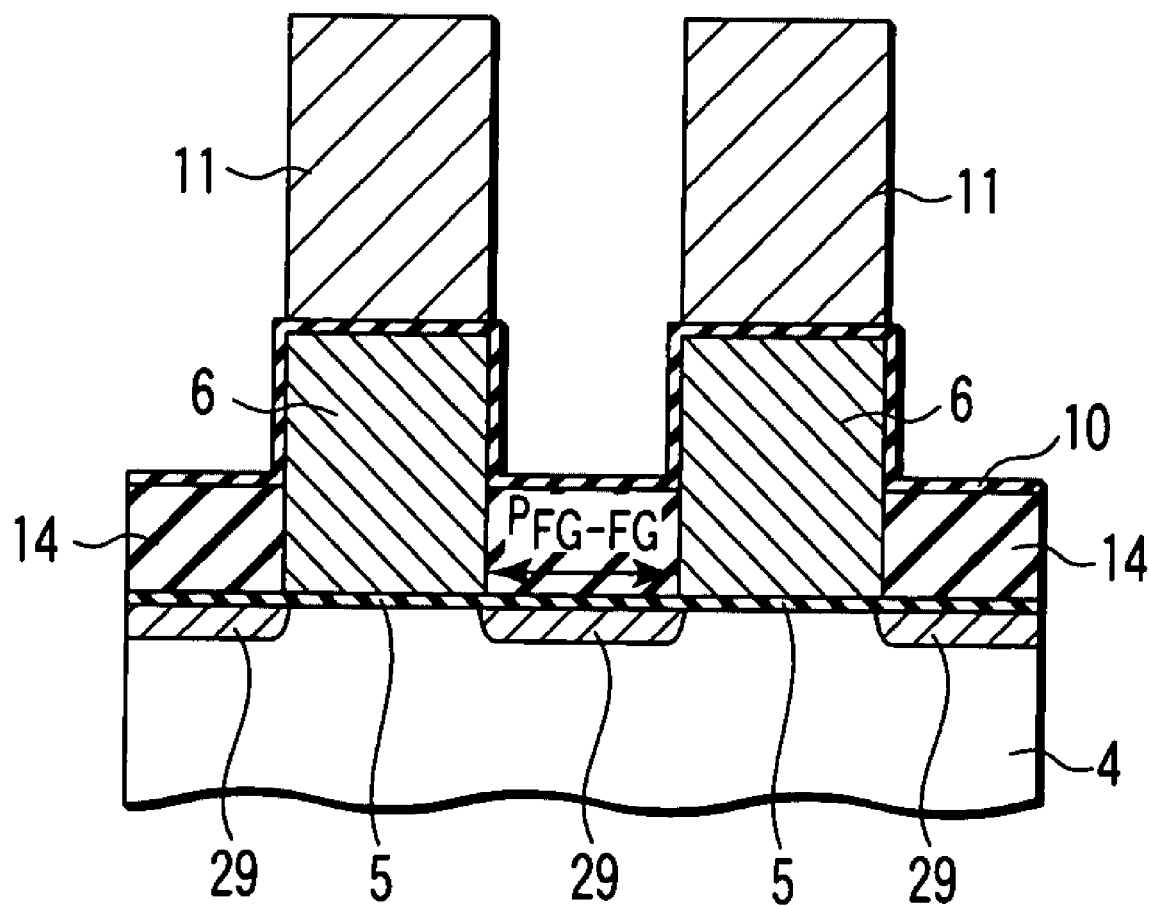
FIG. 77 is a view showing a semiconductor integrated circuit device according to a reference example.

FIG. 76 is a view for explaining advantage 2 obtained from the semiconductor integrated circuit device according to the eighth embodiment. FIG. 77 is a view showing a reference example.

As shown in FIG. 76, a distance $P_{FG-FG}$ between the charge storage layers 6 in the eighth embodiment is larger than that in the reference example shown in FIG. 77. This achieves the following advantage.

The distance $P_{FG-FG}$ between the charge storage layers 6 is decreasing as the degree of micropatterning of memory cell transistors of NAND flash memories increases. In addition, the number of values of multilevel storage information is increasing, and the threshold voltage distribution width corresponding to the storage information is decreasing accordingly. As these tendencies advance, phenomena that have hardly appeared in the past are beginning to emerge. An example is a threshold fluctuation caused by the potentials of the charge storage layers 6 in adjacent memory cell transistors. This threshold fluctuation is called the proximity effect. The proximity effect fluctuates the threshold value of a memory cell in which data is already written. This makes it difficult to decrease the threshold distribution width.

The proximity effect will be briefly explained below.

Figure 78A:
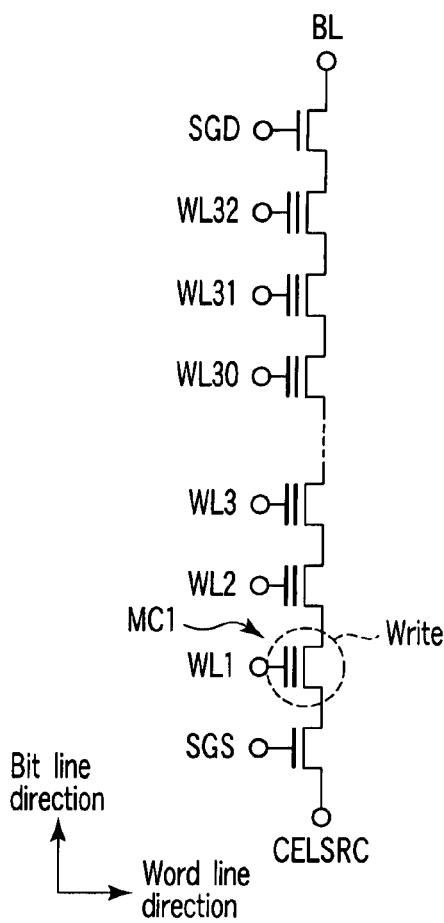
FIGS. 78A and 78B are circuit diagrams for explaining the proximity effect.
Figure 78B:
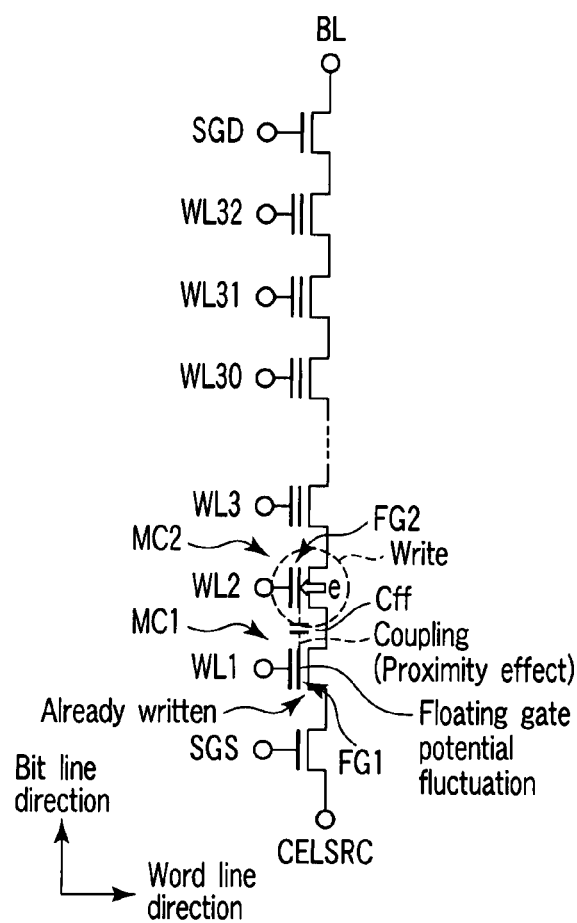

A nonvolatile semiconductor memory, e.g., a NAND flash memory writes data page by page. That is, when completely writing data in one page, write to the next page begins. A page is generally set for each word line. Data is written in order from a memory cell transistor (to be referred to as a memory cell hereinafter) on the source side farthest from a bit line to a memory cell on the bit line side. For example, data is first written in a memory cell MC1 connected to a word line WL1 (FIG. 78A), and then written in a memory cell MC2 connected to a word line WL2 (FIG. 78B).

Figure 79A:
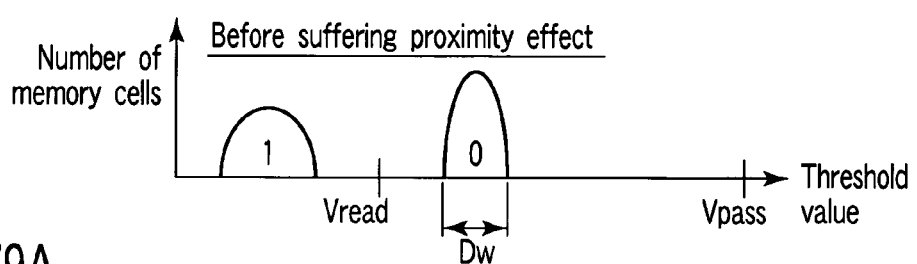
FIG. 79A is a graph showing a threshold voltage distribution before suffering the proximity effect.
Figure 79B:
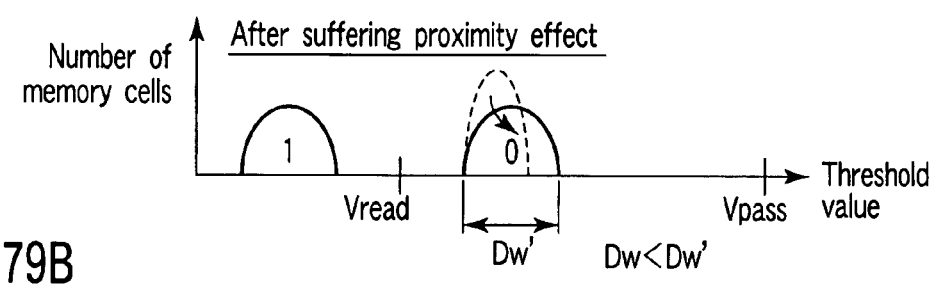
FIG. 79B is a graph showing a threshold voltage distribution after suffering the proximity effect.

Assume that data "0" is to be written in the memory cell MC2. When data "0" is written, electrons e are injected into a charge storage layer FG2 of the memory cell MC2, so the potential of the charge storage layer FG2 drops. The charge storage layer FG2 is adjacent in the bit line direction to the charge storage layer FG1 of the memory cell MC1 via an insulator. The charge storage layer FG2 electrically couples with the charge storage layer FG1 via a parasitic capacitance $C_{ff}$. When the electrons e are injected and the potential of the charge storage layer FG2 drops, the charge storage layer FG1 capacitively couples with the charge storage layer FG2, and the potential of the charge storage layer FG1 drops. Data is already written in the memory cell MC1. The potential drop of the charge storage layer FG1 of the written memory cell MC1 means that a threshold value Vth of the written memory cell MC1 has changed. This is the proximity effect. FIG. 79A shows a threshold distribution Dw of a memory cell before it suffers the proximity effect. FIG. 79B shows a threshold distribution Dw' after the memory cell has suffered the proximity effect.

As shown in FIGS. 79A and 79B, the proximity effect increases the threshold distribution width Dw of the written memory cell to the distribution width Dw'. This makes it difficult to control the threshold voltage distribution within a target range.

Figure 80A:
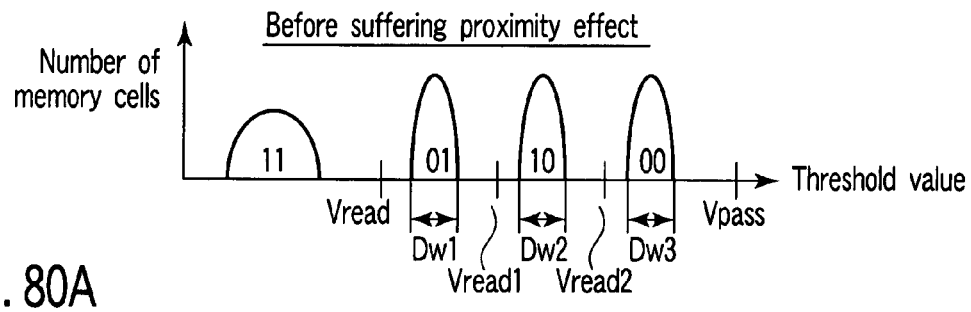
FIG. 80A is a graph showing a threshold voltage distribution before suffering the proximity effect.
Figure 80B:
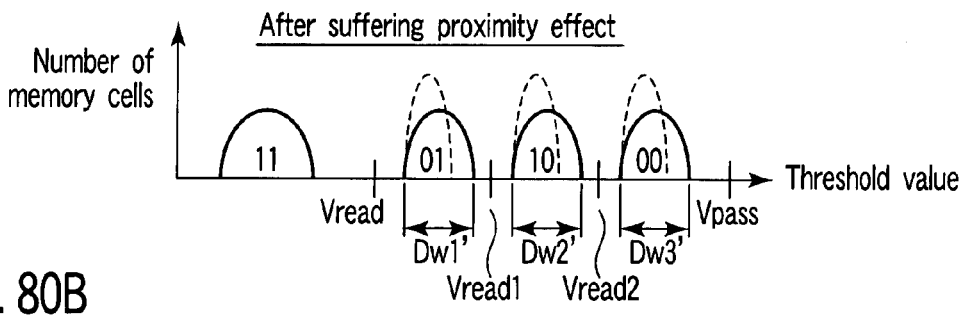
FIG. 80B is a graph showing a threshold voltage distribution after suffering the proximity effect.
Figure 81A:
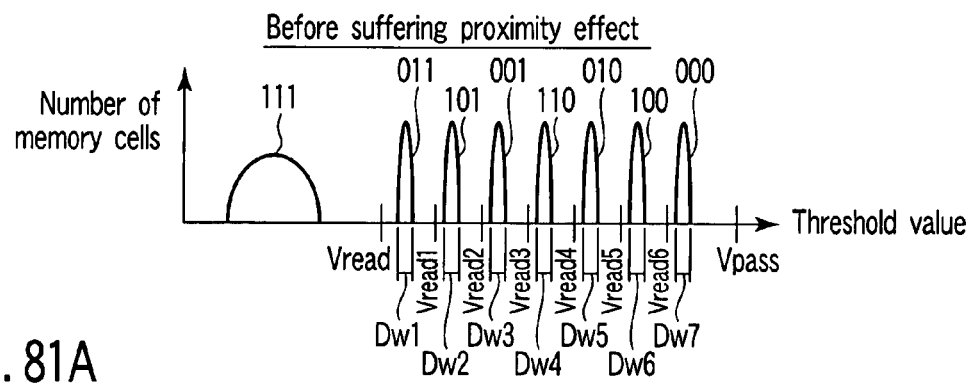
FIG. 81A is a graph showing a threshold voltage distribution before suffering the proximity effect.
Figure 81B:
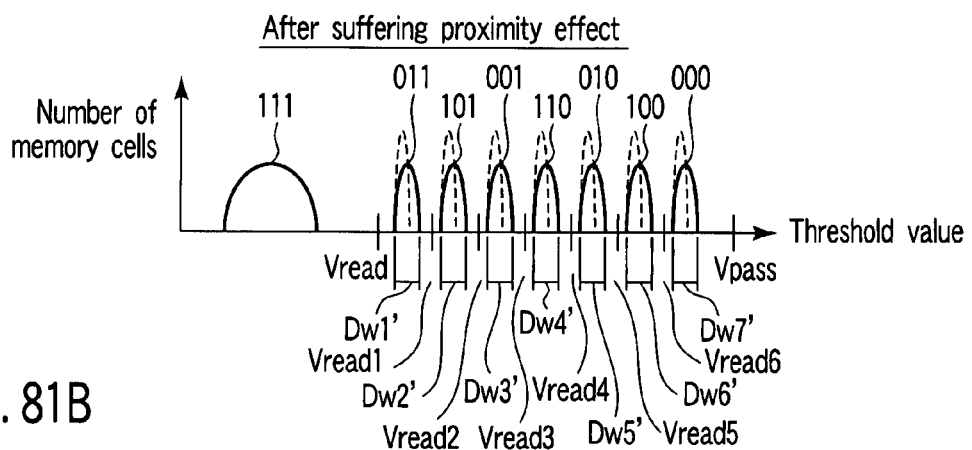
FIG. 81B is a graph showing a threshold voltage distribution after suffering the proximity effect.

The proximity effect occurs not only in the binary memory shown in FIGS. 79A and 79B, but also in a multilevel memory. The influence of the proximity effect is particularly large in a multilevel memory because the threshold voltage distribution width Dw of a multilevel memory must be smaller than that of a binary memory. For example, FIGS. 80A and 80B show the case that a quaternary memory has suffered the proximity effect, and FIGS. 81A and 81B show the case that an octernary memory has suffered the proximity effect. As shown in FIGS. 80A to 81B, as the number of values of storage information increases, the threshold distribution width Dw decreases, and the margin for the proximity effect decreases.

By contrast, in the eighth embodiment as shown in FIG. 76, the distance $P_{FG-FG}$ between the charge storage layers 6 increases compared to the reference example shown in FIG. 77, so the parasitic capacitance $C_{ff}$ decreases. The decrease in parasitic capacitance $C_{ff}$ decreases the threshold fluctuation of a memory cell in which data is already written, when compared to the reference example shown in FIG. 77.

Accordingly, the eighth embodiment hardly suffers the proximity effect.

Furthermore, in this embodiment, the control gates 11 exist between the charge storage layers 6. For example, reference numeral 40 denotes such portions in FIG. 76. Since the potential of the control gate is fixed during data write, the potential fluctuation of the charge storage layer 6 is further suppressed.

The eighth embodiment rarely suffers the proximity effect from this viewpoint as well.

The eighth embodiment as described above is useful as a multilevel nonvolatile semiconductor memory larger than a ternary memory. Examples are a quaternary memory, octernary memory, and hexadecimal memory.

(Advantage 3)

FIG. 82 is a view for explaining advantage 3 obtained from the semiconductor integrated circuit device according to the eighth embodiment. FIG. 83 is a view showing a reference example.

In the eighth embodiment as shown in FIG. 82, a distance $D_{CG-SUB}$ between the control gate 11 and substrate 4 is shorter than that in the reference example shown in FIG. 83. This achieves the following advantage.

Before writing data in a memory cell transistor, a NAND flash memory removes electric charge, in this embodiment, electrons, from all the charge storage layers 6 in a block in which the data is to be written, thereby erasing data. Assume that in this specification, the data erased state is "1" in a binary memory, "11" in a quaternary memory, and "111" in an octernary memory (FIGS. 79A, 80A, and 81A).

When writing data, electrons are injected or not injected in the charge storage layer 6 from which electrons are emitted, thereby writing data "0" or "1". When electrons are injected, data "1" changes to data "0" (data "0" write). When no electrons are injected, the charge storage layer 6 maintains the erased state or, in a multilevel memory, maintains the preceding written state, so data "1" remains (data "1" write).

In data "0" write, the potential difference between the control gate 11 and the channel of a selected memory cell transistor is increased. For example, a write voltage Vpgm is applied to the control gate 11 of the selected memory cell transistor, and the channel of the selected memory cell transistor is set at a low voltage, e.g., 0V.

In data "1" write, the potential difference between the control gate 11 and the channel of a selected memory cell transistor is decreased. For example, the write voltage Vpgm is applied to the gate 11 of the selected memory cell transistor, and a voltage close to the voltage Vpgm is applied to the channel of the selected memory cell transistor. A method called a self-boost method is a technique that makes the channel voltage close to the voltage Vpgm.

The self-boost method will be briefly explained below.

Figure 84:
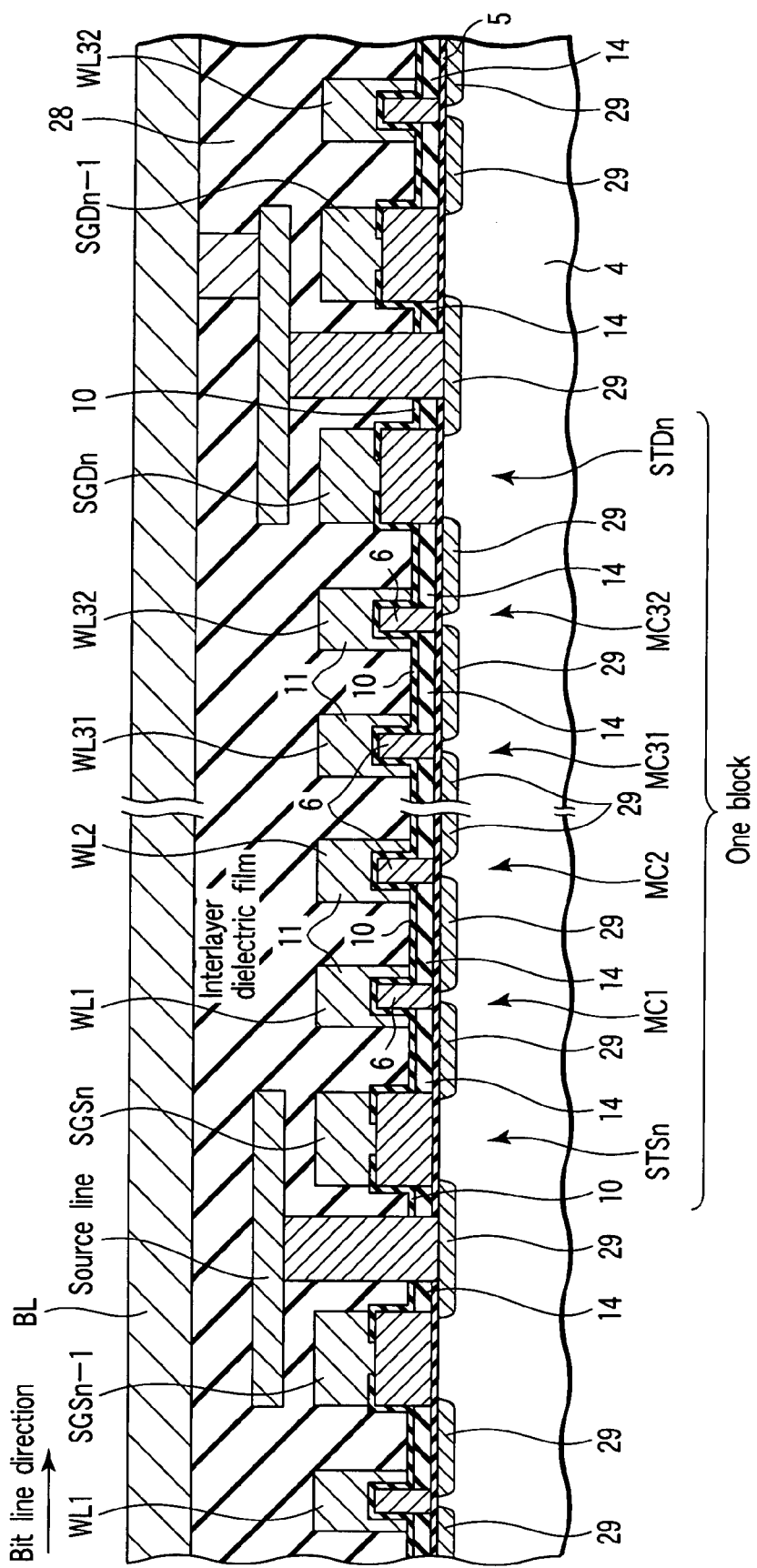
FIG. 84 is a sectional view taken along the bit line direction, which shows one block of a NAND flash memory to which an embodiment of the present invention is applied.

FIG. 84 is a sectional view taken along the bit line direction, which shows one block of a NAND flash memory to which the present invention is applied.

As shown in FIG. 84, one block of the NAND flash memory extends from a source-side block selection transistor STSn to a drain-side block selection transistor STDn. In this embodiment, 32 memory cells MC1 to MC32 are connected in series between the source-side block selection transistor STSn and drain-side block selection transistor STDn.

Before writing data in the memory cells MC1 to MC32, electrons are emitted from the charge storage layers 6 of the memory cells MC1 to MC32 to, e.g., the substrate 4. Data is written while electrons are thus emitted from the charge storage layers 6 of the memory cells MC1 to MC32.

Figure 85:
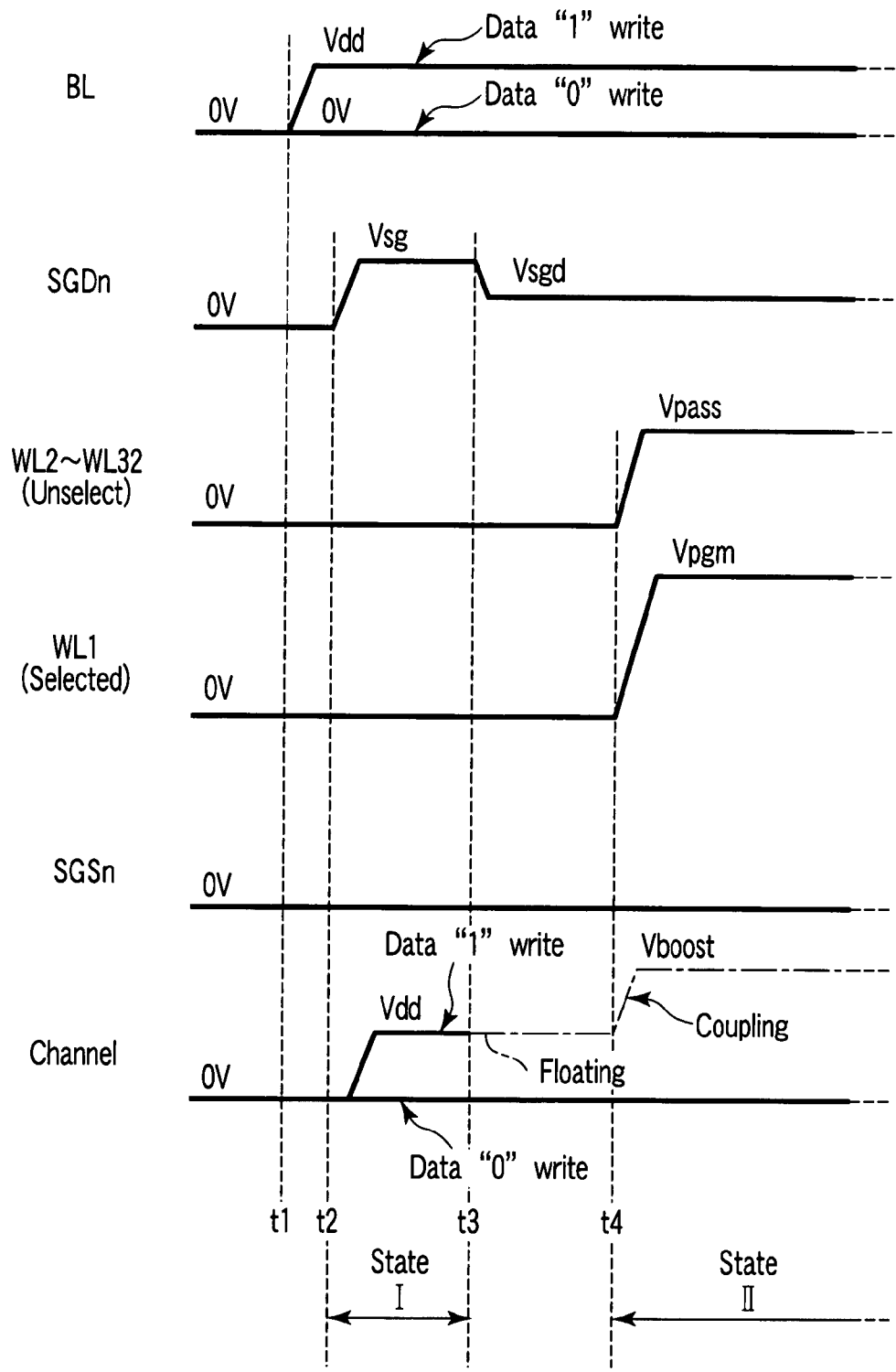
FIG. 85 is an operation timing chart showing a self-boost write method.
Figure 86:
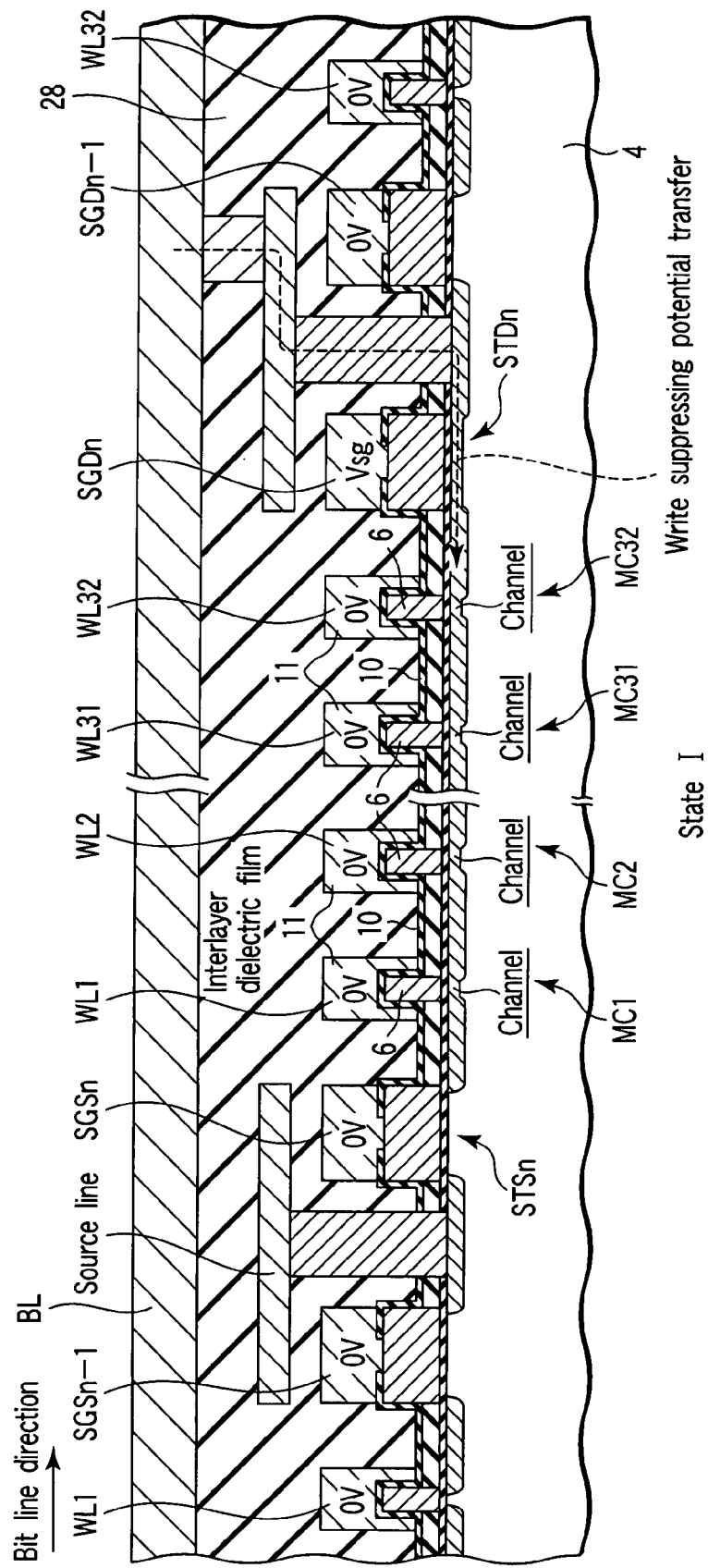
FIG. 86 is a sectional view showing state I in FIG. 85.

FIG. 85 is an operation timing chart showing the self-boost write method.

As shown in FIG. 85, at time t1, a voltage is applied to a bit line BL in accordance with whether write data is "0" or "1". In this embodiment, "0V" is applied to the bit line BL in data "0" write, and "a write suppressing potential", in this embodiment, "a power supply voltage Vdd" is applied in data "1" write.

Then, at time t2, while a gate SGSn of the source-side block selection transistor STSn is set at 0V, a voltage Vsg is applied to a gate SGDn of the drain-side block selection transistor STDn. This turns off the transistor STSn and turns on the transistor STDn, and 0V or the voltage Vdd is supplied to the channel of the selected block. FIG. 85 shows this state. Although the potential of word lines WL1 to WL32 is 0V, the memory cells MC1 to MC32 are in the erased state, and the threshold voltage is, e.g., less than 0V. Since this turns on the channels of the memory cells MC31 and MC32, therefore, 0V or Vdd is transferred up to, e.g., the memory cell MC1 closest to the source (state I).

At time t3, the voltage of SGDn is lowered from the voltage Vsg to a voltage Vsgd. The voltage Vsgd turns on the transistor STDn if the voltage of the bit line BL is 0V, and turns off the transistor STDn if the voltage of the bit line BL is Vdd. Consequently, if the channel voltage is Vdd, the channels electrically float.

At time t4, the voltage of a selected word line, in this embodiment, the word line WL1 is raised from 0V to the write voltage Vpgm, and the voltage of unselected word lines, in this embodiment, the word lines WL2 to WL32 are raised from 0V to an intermediate voltage Vpass. As shown in FIG. 87, if the channels are electrically floating, they capacitively couple with the word lines WL1 to WL32.

That is, when suppressing charge injection to the charge storage layers 6, this embodiment electrically floats the channels produced in the element regions below the charge storage layers 6, thereby capacitively coupling the channel potential to the potential of the control gates 11. As a consequence, the channel potential rises from Vdd to Vboost (state II).

When Vboost is close to the write voltage Vpgm, the potential difference between the control gate 11 and charge storage layer 6 decreases. This suppresses injection of electrons into the charge storage layer 6.

In the eighth embodiment as shown in FIG. 82, the lower surface of the control gate 11 opposes the source/drain diffusion layers 29 formed in the element region below the insulating film 14 and having a conductivity type opposite to that of the semiconductor substrate 4, via at least the insulating film 14 and inter-gate insulating film 10. This makes the distance $D_{CG-SUB}$ between the control gate 11 and substrate 4 shorter than that in the reference example shown in FIG. 83. When the distance $D_{CG-SUB}$ shortens, the channel capacitively couples with the control gate 11 more easily. That is, since Vboost can be easily made close to the write voltage Vpgm, it is possible to more strongly suppress injection of electrons into the charge storage layer 6. This makes it possible to prevent a write error of data "0" when writing data "1".

Also, when maintaining a previously written threshold voltage in a multilevel memory, the change in threshold voltage can be suppressed more strongly. This facilitates obtaining a narrow threshold voltage distribution.

The eighth embodiment is useful as a multilevel nonvolatile semiconductor memory larger than a ternary memory from this viewpoint as well. Examples are a quaternary memory, octernary memory, and hexadecimal memory.

Furthermore, the above embodiments include the following aspects.

(1) A semiconductor device manufacturing method comprises steps of forming a first insulating film on a semiconductor substrate, forming a first conductor film on the first insulating film, forming a second insulating film on the first conductor film, etching the second insulating film and first conductor film into a first line-and-space pattern, etching the second insulating film, first conductor film, first insulating film, and semiconductor substrate by a second line-and-space pattern perpendicular to the first line-and-space pattern, burying a third insulating film in the etched region, removing the second insulating film, depositing a fourth insulating film on the first conductor film and third insulating film, depositing a second conductor film on the fourth insulating film, and etching the second conductor film into a third line-and-space pattern parallel to the first line-and-space pattern.

(2) There is provided a semiconductor device manufacturing method according to aspect (1), wherein before depositing the fourth insulating film, the third insulating film buried in the etched region is etched to the middle of the film thickness of the first conductor film.

(3) A semiconductor device manufacturing method comprises steps of forming a first insulating film on a semiconductor substrate, forming a first conductor film on the first insulating film, forming a second insulating film on the first conductor film, etching the second insulating film and first conductor film into a first line-and-space pattern, etching the second insulating film, first conductor film, first insulating film, and semiconductor substrate into a second line-and-space pattern perpendicular to the first line-and-space pattern, burying a third insulating film in the etched region, etching the third insulating film to the middle of the second insulating film, forming a film on the etched region, implanting an impurity into the film parallel to the first line-and-space pattern and obliquely to the semiconductor substrate, etching a portion of the film into which the impurity is not implanted, etching the third insulating film to the middle of the film thickness of the first conductor film by using the remaining portion of the film and the second insulating film as masks, removing the remaining portion of the film and the second insulating film, forming a fourth insulating film on the first conductor film and third insulating film, depositing a second conductor film on the fourth insulating film, and partially removing the second conductor film to form a buried interconnection made of the second conductor film.

(4) There is provided a semiconductor device manufacturing method according to aspect (3), wherein the impurity implanted into the film is a material selected from the group consisting of boron ions and ions containing boron.

(5) There is provided a semiconductor device manufacturing method according to aspect (3), wherein the angle of implantation of the impurity is larger than an angle determined by the space width of the second line-and-space pattern and the height of the second insulating film closer to the surface than the silicon film.

(6) A semiconductor integrated circuit device comprises a semiconductor substrate having, in a surface, an element isolation region extending in a first direction, and an element region defined by the element isolation region, a gate insulating film formed on the element region, a charge storage layer formed on the gate insulating film, and having side surfaces extending along and in contact with the element isolation region, a first insulating film formed above the element region, and in contact with one of two side surfaces perpendicular to the side surfaces of the charge storage layer which extend along the element isolation region, a second insulating film formed above the element region, and in contact with the other one of the two side surfaces perpendicular to the side surfaces of the charge storage layer which extend along the element isolation region, an inter-gate insulating film formed on the first and second insulating films, charge storage layer, and element isolation region, and a control gate formed on the inter-gate insulating film, opposing the charge storage layer via the inter-gate insulating film, and extending in a second direction perpendicular to the first direction.

(7) There is provided a semiconductor integrated circuit device according to aspect (6), wherein the position of the upper surface of the charge storage layer is lower than the position of the upper surface of the first and second insulating films, and the position of the upper surface of the element isolation region.

(8) There is provided a semiconductor integrated circuit device according to aspect (6), wherein the position of the upper surface of the charge storage layer is higher than the position of the upper surface of the first and second insulating films, and the position of the upper surface of the element isolation region.

(9) There is provided a semiconductor integrated circuit device according to aspect (6), wherein the position of the upper surface of the charge storage layer is lower than the position of the upper surface of the first and second insulating films, and higher than the position of the upper surface of the element isolation region below the control gate.

(10) There is provided a semiconductor integrated circuit device according to aspect (9), wherein the position of the upper surface of the inter-gate insulating film on the first and second insulating films and element isolation region is the same as the position of the upper surface of the control gate.

(11) A semiconductor integrated circuit device according to aspect (10) further comprises an interlayer dielectric film formed on the control gate and inter-gate insulating film, having a contact hole that exposes the upper surface of the control gate and the upper surface of the inter-gate insulating film, and made of an insulator different from the inter-gate insulating film, and a conductive contact formed in the contact hole and electrically connected to the control gate.

(12) There is provided a semiconductor integrated circuit device according to aspect (11), which further comprises an address decoding circuit, and in which the conductive contact connects the output of the address decoding circuit and the control gate.

(13) There is provided a semiconductor integrated circuit device according to aspect (8), wherein the length in the first direction of the charge storage layer is smaller than the length in the first direction of the control gate.

(14) There is provided a semiconductor integrated circuit device according to aspect (13), wherein letting $L_{CG}$ be the length in the first direction of the control gate, $t_{IGI}$ be the thickness of the inter-gate insulating film on the side surfaces along the second direction of the charge storage layer, and $M_A$ be an alignment margin in the first direction when processing the control gate, a length $L_{FG}$ in the first direction of the charge storage layer has a relationship indicated by $L_{FG} < L_{CG} - 2M_A - 2t_{IGI}$.

(15) There is provided a semiconductor integrated circuit device according to aspect (13) or (14), wherein the control gate opposes the upper surface of the charge storage layer, the two side surfaces along the first direction of the charge storage layer, and the two side surfaces along the second direction of the charge storage layer via the inter-gate insulating film.

(16) There is provided a semiconductor integrated circuit device according to any one of aspects (13) to (15), wherein the lower surface of the control gate opposes source/drain diffusion layers formed in the element region below the first and second insulating films and having a conductivity type opposite to the conductivity type of the semiconductor substrate, via at least the first and second insulating films and inter-gate insulating film.

(17) There is provided a semiconductor integrated circuit device according to aspect (16), wherein when suppressing charge injection to the charge storage layer, a channel produced in the element region below the charge storage layer is electrically floated, thereby capacitively coupling the potential of the channel with the potential of the control gate.

(18) There is provided a semiconductor integrated circuit device according to any one of aspects (6) to (17), wherein the control gate is made of a material selected from the group consisting of cobalt (Co), nickel (Ni), titanium (Ti), Co silicide, Ni silicide, Ti silicide, tungsten (W), aluminum (Al), and copper (Cu).

(19) There is provided a semiconductor integrated circuit device according to any one of aspects (6) to (18), wherein the semiconductor integrated circuit device is a NAND flash memory.

(20) There is provided a semiconductor integrated circuit device according to any one of aspects (6) to (19), wherein the semiconductor integrated circuit device is a multilevel nonvolatile semiconductor memory.

The embodiments of the present invention can provide a semiconductor device manufacturing method capable of preventing a shortcircuit between adjacent conductor patterns, e.g., a shortcircuit between adjacent floating gates.

Although several embodiments of the present invention have been explained above, the present invention is not limited to these embodiments but can be variously modified when practiced without departing from the spirit and scope of the invention.

For example, each embodiment has taken a stacked gate NAND flash memory as an example, but the present invention is not limited to this memory. That is, the present invention is applicable to any semiconductor device having a portion in which conductor patterns that should not shortcircuit are arranged adjacent to each other.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:
   forming a first insulating film on a semiconductor substrate;
   forming a first conductor film on the first insulating film;
   forming a second insulating film on the first conductor film;
   forming a first line-and-space pattern by etching the second insulating film and the first conductor film;
   forming an etched region etched into a second line-and-space pattern perpendicular to the first line-and-space pattern by etching the second insulating film, the first conductor film, the first insulating film, and the semiconductor substrate;
   burying a third insulating film in the etched region;
   etching the third insulating film to a middle of the second insulating film;
   forming a film on the etched region;
   implanting an impurity into the film parallel to the first line-and-space pattern and obliquely to the semiconductor substrate to form a first portion where the impurity is not implanted into the film and a second portion where the impurity is implanted into the film;
   etching the first portion;
   etching the third insulating film to a middle of a film thickness of the first conductor film by using the second portion and the second insulating film as masks;
   removing the second portion and the second insulating film;
   forming a fourth insulating film on the first conductor film and the third insulating film;
   forming a second conductor film on the fourth insulating film; and
   partially removing the second conductor film to form a buried interconnection formed of the second conductor film.

2. The method according to claim 1, wherein the impurity implanted into the film is a material selected from the group consisting of boron ions and ions containing boron.

3. The method according to claim 1, wherein an angle of implantation of the impurity is larger than an angle determined by a space width of the second line-and-space pattern and a height of the second insulating film above an upper surface of the film.

4. The method according to claim 1, further comprising burying, after forming the first line-and space pattern, an insulating material into a region where the second insulating film and the first conductor film are etched.

* * * * *

UNITED STATES PATENT AND TRADEMARK OFFICE
CERTIFICATE OF CORRECTION

| | | |
|---|---|---|
| PATENT NO. | : 7,713,819 B2 | Page 1 of 1 |
| APPLICATION NO. | : 11/790207 | |
| DATED | : May 11, 2010 | |
| INVENTOR(S) | : Okajima | |

It is certified that error appears in the above-identified patent and that said Letters Patent is hereby corrected as shown below:

Title page, Item (57), in the Abstract, line 6, change "a etched" to --an etched--.

Claim 4, column 28, line 41, change "line-and space" to --line-and-space--.

Signed and Sealed this

Sixth Day of July, 2010

David J. Kappos
*Director of the United States Patent and Trademark Office*